(12) United States Patent
Terajima et al.

(10) Patent No.: US 8,545,083 B2
(45) Date of Patent: Oct. 1, 2013

(54) LIGHT-EMITTING DEVICE, LIGHT SOURCE AND METHOD OF MANUFACTURING THE SAME

(75) Inventors: Tohru Terajima, Saitama-ken (JP); Yoshinobu Suehiro, Kiyosu (JP); Koji Tasumi, Kiyosu (JP)

(73) Assignees: Sumita Optical Glass, Inc., Saitama-Shi, Saitama-ken (JP); Toyoda Gosei Co., Ltd., Kiyosu-shi, Aichi-ken (JP)

( * ) Notice: Subject to any disclaimer, the term of this patent is extended or adjusted under 35 U.S.C. 154(b) by 212 days.

(21) Appl. No.: 12/926,955

(22) Filed: Dec. 20, 2010

(65) Prior Publication Data

US 2011/0149594 A1 Jun. 23, 2011

(30) Foreign Application Priority Data

Dec. 22, 2009 (JP) ................................. 2009-291145
Mar. 26, 2010 (JP) ................................. 2010-072479
Mar. 30, 2010 (JP) ................................. 2010-079390
Mar. 30, 2010 (JP) ................................. 2010-079391

(51) Int. Cl.
*F21V 7/04* (2006.01)

(52) U.S. Cl.
USPC ........... 362/615; 362/606; 362/612; 362/621; 257/98

(58) Field of Classification Search
USPC ................... 362/606, 612, 615, 621; 438/27, 438/28; 257/89, 91, 98, 99
See application file for complete search history.

(56) References Cited

U.S. PATENT DOCUMENTS

2003/0189829 A1 10/2003 Shimizu et al.
2005/0161771 A1 7/2005 Suehiro et al.
(Continued)

FOREIGN PATENT DOCUMENTS

JP 2005-44661 A 2/2005
JP 2005-222814 A 8/2005
(Continued)

OTHER PUBLICATIONS

Japanese Office Action dated Apr. 16, 2013 (partial English Translation).
(Continued)

*Primary Examiner* — Stephen F Husar
*Assistant Examiner* — Meghan Dunwiddie
(74) *Attorney, Agent, or Firm* — McGinn IP Law Group, PLLC

(57) ABSTRACT

A light-emitting device includes a light source including an element mounting substrate, an LED element mounted thereon by flip-chip connection and a sealing portion for sealing the LED element on the element mounting substrate, and a light guide plate including a housing hole for housing the light source. The housing hole extends from one surface side to another surface side of the light guide plate and an area of an inner surface thereof on which light is incident from the light source is parallel to a thickness direction of the light guide plate. The light source is housed in the housing hole so that the element mounting substrate is located on the other surface side of the light guide plate, emits light toward the one surface side of the light guide plate in the housing hole and the inner surface side of the housing hole, and has an optical axis parallel to the thickness direction of the light guide plate. A solid angle of the inner surface of the housing hole with respect to the center of an upper surface of the light source is not less than 4.44 steradians.

29 Claims, 79 Drawing Sheets

(56) References Cited

U.S. PATENT DOCUMENTS

| | | |
|---|---|---|
| 2005/0174806 A1 | 8/2005 | Sakai et al. |
| 2005/0207165 A1 | 9/2005 | Shimizu et al. |
| 2005/0237747 A1 | 10/2005 | Shimizu et al. |
| 2005/0242362 A1 | 11/2005 | Shimizu et al. |
| 2006/0160409 A1 | 7/2006 | Shimizu et al. |
| 2006/0171152 A1 | 8/2006 | Suehiro et al. |
| 2006/0261364 A1 | 11/2006 | Suehiro et al. |
| 2007/0064131 A1 | 3/2007 | Sawanobori et al. |
| 2007/0187708 A1 | 8/2007 | Setomoto et al. |
| 2007/0284597 A1* | 12/2007 | Nawashiro et al. ............ 257/89 |
| 2008/0049445 A1 | 2/2008 | Harbers et al. |
| 2009/0086508 A1 | 4/2009 | Bierhuizen |
| 2009/0186433 A1 | 7/2009 | Yamaguchi et al. |
| 2009/0262517 A1 | 10/2009 | Suehiro et al. |
| 2010/0201916 A1 | 8/2010 | Bierhuizen |
| 2011/0104834 A1 | 5/2011 | Suehiro et al. |

FOREIGN PATENT DOCUMENTS

| | | |
|---|---|---|
| JP | 2005-276491 A | 10/2005 |
| JP | 2006-165326 A | 6/2006 |
| JP | 2006-202962 A | 8/2006 |
| JP | 2006-351375 A | 12/2006 |
| JP | 2007-059930 A | 3/2007 |
| JP | 2007-080994 A | 3/2007 |
| JP | 2007-165064 A | 6/2007 |
| JP | 2007-206398 A | 8/2007 |
| JP | 2007-207598 A | 8/2007 |
| JP | 2007-227286 A | 9/2007 |
| JP | 2007-248611 A | 9/2007 |
| JP | 2008-053236 A | 3/2008 |
| JP | 2009-177131 A | 8/2009 |
| JP | 2009-252898 A | 10/2009 |
| JP | 2009-260050 A | 11/2009 |
| WO | WO 2004/082036 A1 | 9/2004 |
| WO | WO 2009/040722 A2 | 4/2009 |

OTHER PUBLICATIONS

Office Action (Japan) dated Mar. 12, 2013, with English translation.
Japanese Office Action dated May 28, 2013 with partial English translation.
Japanese Office Action dated Jun. 18, 2013 with partial English translation. (A).
Japanese Office Action dated Jun. 18, 2013 with Partial English translation. (B).

* cited by examiner

FIG.33B

| Refractive Index n | (90° − α₁) which satisfies formula 1 | (90° − α₁) which satisfies formula 2 |
|---|---|---|
| 1.45 | 2.8° or less | 2.8° or less |
| 1.50 | 6.7° or less | 6.7° or less |
| 1.55 | 10.4° or less | 10.4° or less |
| 1.60 | 13.9° or less | 12.6° or less |
| 1.65 | 17.3° or less | 15.4° or less |

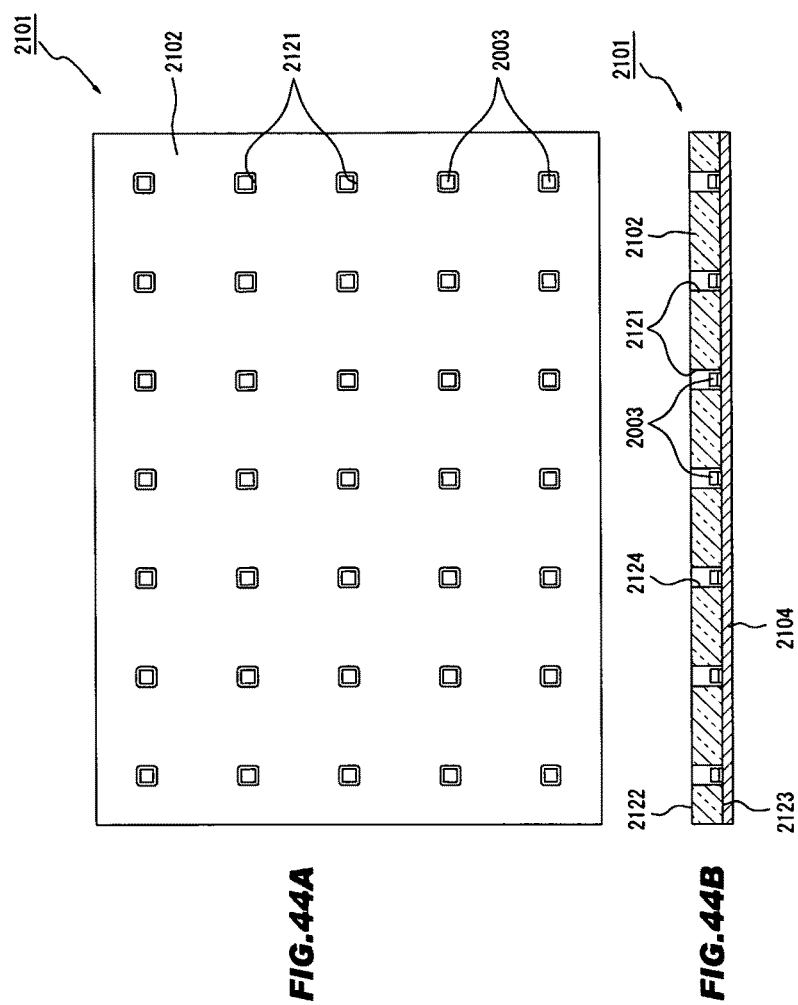

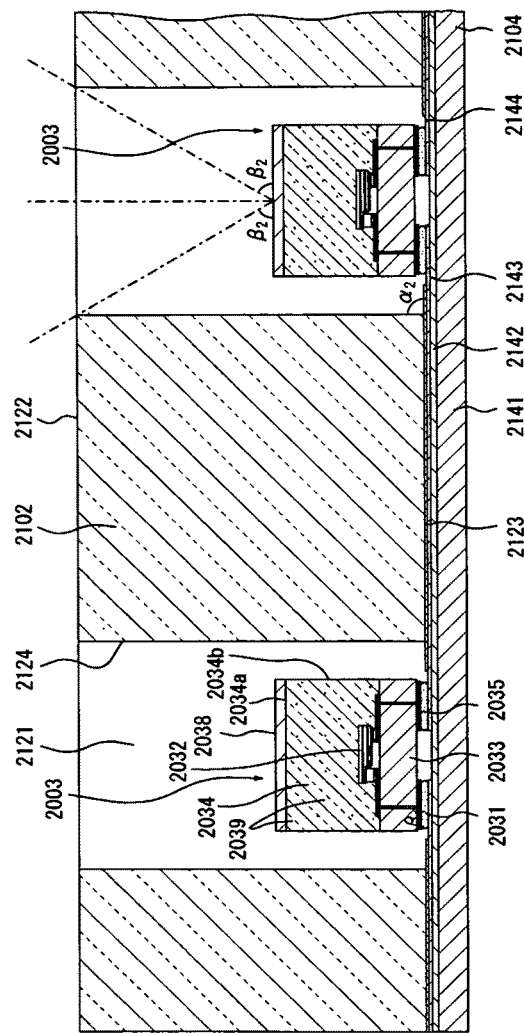

FIG.45B

| Refractive Index n | (90° − $\alpha_2$) which satisfies formula 1 | (90° − $\alpha_2$) which satisfies formula 2 |
|---|---|---|
| 1.45 | 2.8° or less | 2.8° or less |
| 1.50 | 6.7° or less | 6.4° or less |
| 1.55 | 10.4° or less | 9.6° or less |
| 1.60 | 13.9° or less | 12.6° or less |
| 1.65 | 17.3° or less | 15.4° or less |

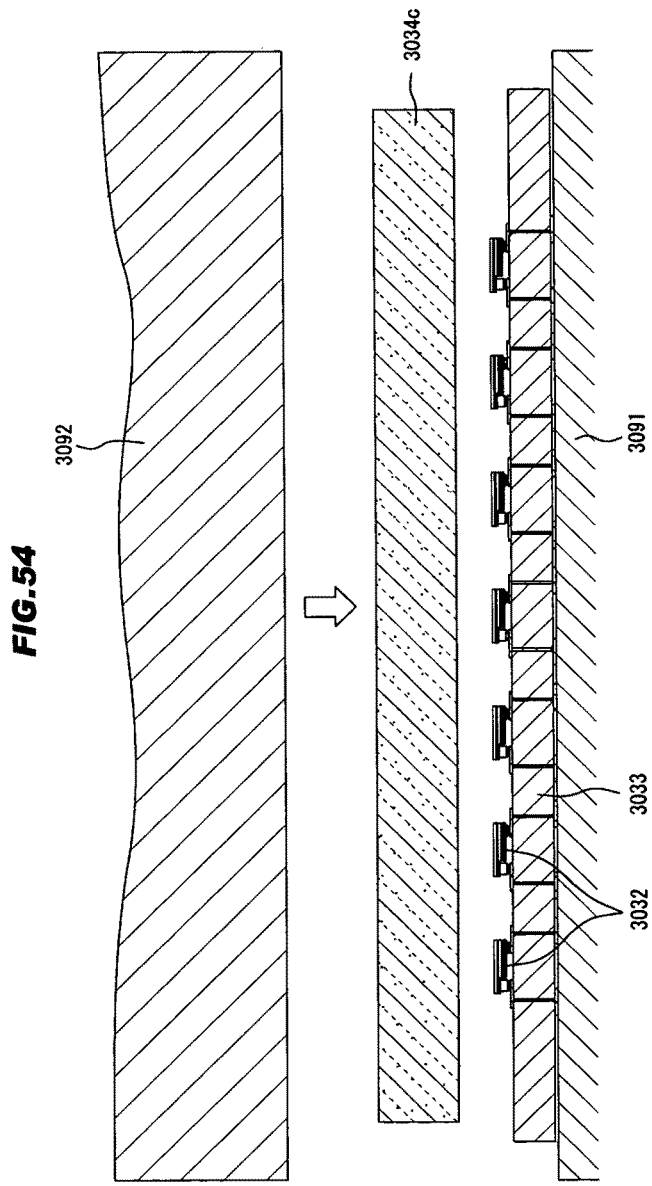

FIG.63

| Refractive Index n | (90° − α₃) which satisfies formula 1 | (90° − α₃) which satisfies formula 2 |
|---|---|---|
| 1.45 | 2.8° or less | 2.8° or less |
| 1.50 | 6.7° or less | 6.4° or less |
| 1.55 | 10.4° or less | 9.6° or less |
| 1.60 | 13.9° or less | 12.6° or less |
| 1.65 | 17.3° or less | 15.4° or less |

LIGHT-EMITTING DEVICE, LIGHT SOURCE AND METHOD OF MANUFACTURING THE SAME

The present application is based on Japanese Patent Application Nos. 2009-291145, 2010-072479, 2010-079390 and 2010-079391 filed on Dec. 22, 2009, Mar. 26, 2010, Mar. 30, 2010 and Mar. 30, 2010, respectively, the entire contents of which are incorporated herein by reference.

BACKGROUND OF THE INVENTION

1. Field of the Invention

The invention relates to a light-emitting device in which light from a light source having an LED element mounted by flip-chip connection is incident on a light guide plate. In addition, the invention relates to a planar light-emitting device in which light from a light source having an LED element mounted by flip-chip connection is incident on a light guide plate. Also, the invention relates to a light source including a light-emitting element sealed with glass, a method of manufacturing the same and a light-emitting device provided with the light source.

2. Related Art

A light source is known in which an LED element mounted on an element mounting substrate is sealed with an inorganic material such as glass, etc. (see, e.g., WO 2004/82036). In the light source described in WO 2004/82036, plural LED elements are mounted on an element mounting substrate by flip-chip connection, a hot pressing process is performed on glass, and the individual LED elements are thereby collectively sealed with the glass. The light source is in a cube shape and light is emitted from the upper and side surfaces thereof. A direction of an optical axis is perpendicular to the element mounting substrate.

Meanwhile, a light-emitting device using a light guide plate is known in which plural rows of cylindrical bore shaped or concave light incident portions are provided on a rear surface of the light guide plate in the vicinity of at least one side surface so as to be parallel thereto (see, e.g., JP-A 2005-276491). In this light-emitting device, the light incident portions are formed in a thickness direction of the light guide plate and a plane emission light source for laterally emitting light is used. In detail, the light source has concentric inclined surface portions on inner and outer surfaces at the upper portion thereof, light from a semiconductor light-emitting element is totally reflected at the inclined surface portion of the inner surface and the critical angle is exceeded at the inclined surface portion of the outer surface, and the light is emitted radially in all directions.

A light-emitting device using a light guide plate is known in which plural rows of cylindrical bore shaped or concave light incident portions are provided on a rear surface of the light guide plate in the vicinity of at least one side surface so as to be parallel thereto (see, e.g., JP-A 2005-276491). In this light-emitting device, the light incident portions are formed in a thickness direction of the light guide plate and a plane emission light source for laterally emitting light is used. In detail, the light source has concentric inclined surface portions on inner and outer surfaces at the upper portion thereof, light from a semiconductor light-emitting element is totally reflected at the inclined surface portion of the inner surface and the critical angle is exceeded at the inclined surface portion of the outer surface, and the light is emitted radially in all directions.

In addition, as a light-emitting device using a light guide plate, a lighting system is known which is provided with plural LED light sources arranged on a circuit board and a light guide plate for guiding light of the LED light sources as illumination light to be incident from an incidence plane to a light exit surface, and in which the light guide plate is composed of upper and lower light guide plates, the lower light guide plate has a concave portion for guiding output light from each LED light source into the light guide plate, and the LED light source is arranged in the vicinity of an aperture plane of the concave portion (see, e.g., JP-A 2007-165064).

A conventional light source is known in which a GaN-based LED element is mounted on an element mounting substrate formed of ceramic and the LED element is sealed with a glass material on the element mounting substrate (see WO 2004/82036). Plural LED elements are mounted on the element mounting substrate, the individual LED elements are collectively sealed with a plate-like glass material, and the element mounting substrate and the glass material are subsequently cut by dicing, thereby manufacturing the light source. The light source manufactured as described above is in a state in which the LED elements are sealed with a glass sealing portion in a rectangular parallelepiped shape.

A light-emitting device using a light guide plate is known in which plural rows of cylindrical bore shaped or concave light incident portions are provided on a rear surface of the light guide plate in the vicinity of at least one side surface so as to be parallel thereto (see, e.g., JP-A 2005-276491). In this light-emitting device, the light incident portions are formed in a thickness direction of the light guide plate and a plane emission light source for laterally emitting light is used. In detail, the light source has concentric inclined surface portions on inner and outer surfaces at the upper portion thereof, light from a semiconductor light-emitting element is totally reflected at the inclined surface portion of the inner surface and the critical angle is exceeded at the inclined surface portion of the outer surface, and the light is emitted radially in all directions.

In addition, as a light-emitting device using a light guide plate, a lighting system is known which is provided with plural LED light sources arranged on a circuit board and a light guide plate for guiding light of the LED light sources as illumination light to be incident from an incidence plane to a light exit surface, and in which the light guide plate is composed of upper and lower light guide plates, the lower light guide plate has a concave portion for guiding output light from each LED light source into the light guide plate, and the LED light source is arranged in the vicinity of an aperture plane of the concave portion (see, e.g., JP-A 2007-165064). Meanwhile, a light-emitting device having an LED light source and using a polarizing element without using a light guide plate is also known (see, e.g., JP-A 2005-44661).

SUMMARY OF THE INVENTION

An object of the invention is to provide a light-emitting device that a light source to emit light from the side face as well as the top face is accommodated in a housing hole extending in the thickness direction of a light guide plate, without reducing the luminous efficiency (or light extraction efficiency).

Another object of the invention is to provide a light-emitting device that a light source to emit light from the side face as well as the top face is accommodated in a through hole extending in the thickness direction of a light guide plate, without reducing the luminous efficiency (or light extraction efficiency).

Another object of the invention is to provide a light source (and a production method thereof) and a light-emitting device with the light source that even when a light-emitting element is sealed with a glass material, the light distribution characteristics can be simply and easily changed.

Another object of the invention is to provide a light-emitting device that a light source is accommodated in a hole portion of a light guide plate, without reducing the luminous efficiency (or light extraction efficiency).

(1) According to one embodiment of the invention, a light-emitting device comprises:

a light source comprising an element mounting substrate, an LED element mounted thereon by flip-chip connection and a sealing portion for sealing the LED element on the element mounting substrate; and a light guide plate comprising a housing hole for housing the light source;

wherein the housing hole extends from one surface side to another surface side of the light guide plate and an area of an inner surface thereof on which light is incident from the light source is parallel to a thickness direction of the light guide plate;

the light source is housed in the housing hole so that the element mounting substrate is located on the other surface side of the light guide plate, emits light toward the one surface side of the light guide plate in the housing hole and the inner surface side of the housing hole, and has an optical axis parallel to the thickness direction of the light guide plate; and a solid angle of the inner surface of the housing hole with respect to the center of an upper surface of the light source is not less than 4.44 steradians.

In the above embodiment (1) of the invention, the following modifications and changes can be made.

(i) The housing hole is formed so as to penetrate the light guide plate.

(ii) The light-emitting device further comprises:

a mounting substrate provided on the one surface side of the light guide plate to mount the light source.

(iii) The sealing portion is formed of thermal fusion glass.

(iv) The light source is in a rectangular parallelepiped shape.

(v) A phosphor for converting a wavelength of light emitted from the LED element is dispersed into the sealing portion.

(vi) The light-emitting device further comprises:

a reflecting plate provided on the other surface side of the light guide plate and blocking the housing hole.

(2) According to another embodiment of the invention, a light-emitting device comprises:

a light source comprising an element mounting substrate, an LED element mounted thereon by flip-chip connection and a sealing portion for sealing the LED element on the element mounting substrate; and a light guide plate comprising a through hole for housing the light source, wherein the through hole extends from one surface side to another surface side of the light guide plate and an area of an inner surface thereof on which light is incident from the light source is substantially parallel to a thickness direction of the light guide plate, the light source is housed in the through hole so that the element mounting substrate is located on the other surface side of the light guide plate, emits light toward the one surface side of the light guide plate in the through hole and the inner surface side of the through hole, and has an optical axis parallel to the thickness direction of the light guide plate, and a formula, $90°-\sin^{-1}[\{\sin(90°-\alpha)\}/n]+\alpha \geq \sin^{-1}(1/n)$, is satisfied, where $\alpha$ is an angle of the inner surface of the through-hole with respect to the other surface of the light guide plate and n is a refractive index of the light guide plate.

In the above embodiment (2) of the invention, the following modifications and changes can be made.

(vii) A formula, $\alpha \leq 90°-2 \times \sin^{-1}[\sin\{(90°-\alpha)/n\}]$, is satisfied, where $\alpha$ is an angle of the inner surface of the through-hole with respect to the other surface of the light guide plate and n is a refractive index of the light guide plate.

(viii) An end portion of the light source on the element mounting substrate side and the other surface of the light guide plate are located at the same height in the thickness direction of the light guide plate.

(ix) The light source is in a quadrangular shape in a plan view, and the through hole is in a quadrangular shape of which corners are cut in a plan view.

(x) The light-emitting device further comprises:

a mounting substrate provided on the one surface side of the light guide plate to mount the light source.

(xi) The sealing portion is formed of thermal fusion glass.

(xii) The light source is in a rectangular parallelepiped shape in that the total area of side surfaces is double or more of an upper surface.

(xiii) The sealing portion comprises a phosphor that converts a wavelength of light emitted from the LED element.

(xiv) The light-emitting device further comprises:

a reflecting plate provided on the other surface side of the light guide plate and blocking the housing hole.

(3) According to another embodiment of the invention, a method of manufacturing a light source comprises:

a sealing process in that a plurality of light-emitting elements mounted on an element mounting substrate formed of an inorganic material are collectively sealed with a glass material, thereby forming an intermediary body;

a reflective layer forming process for forming a reflective layer on an upper surface of the glass material of the intermediary body; and a dividing process in that the intermediary body having the reflective layer formed thereon is divided in a thickness direction of the element mounting substrate to expose a side surface of the glass material while an upper surface of the glass material is covered.

In the above embodiment (3) of the invention, the following modifications and changes can be made.

(xv) In the sealing process, the glass material is softened by heating in a hot pressing process to bond to the element mounting substrate.

(xvi) The reflective layer is formed of an inorganic material, and the glass material is softened by heating in a hot pressing process to bond to the reflective layer in the reflective layer forming process.

(xvii) The element mounting substrate comprises the same material as the reflective layer.

(xviii) The reflective layer is formed of a metal material and is formed by vapor deposition or sputtering in the reflective layer forming process.

(4) According to another embodiment of the invention, a light source manufactured by the manufacturing method according to the embodiment (3).

(5) According to another embodiment of the invention, a light-emitting device comprises:

a light source according to claim the embodiment (4); and a light guide plate comprising a hole portion for housing the light source.

(6) According to another embodiment of the invention, a light-emitting device comprises:

a light source comprising an element mounting substrate, an LED element mounted thereon by flip-chip connection and a sealing portion for sealing the LED element on the element mounting substrate; and a light guide plate comprising a hole portion for housing the light source and an incident surface which is a lateral side surface of the hole portion, wherein the hole portion extends from the one surface side to the other surface side of the light guide plate and the incident surface is substantially parallel to a thickness direction of the light guide plate, and a reflecting surface that optically blocks the hole portion on the other surface side of the light guide plate and reflects at least a portion of light emitted from the light source is included.

In the above embodiment (6) of the invention, the following modifications and changes can be made.

(xix) A formula, $90°-\sin^{-1}[\{\sin(90°-\alpha)\}/n]+\alpha \geq \sin^{-1}(1/n)$, is satisfied, where $\alpha$ is an angle of the inner surface of the hole portion with respect to the one surface of the light guide plate and n is a refractive index of the light guide plate.

(xx) A formula, $\alpha \leq 90°-2 \times \sin^{-1}[\sin\{(90°-\alpha)/n\}]$, is satisfied, where $\alpha$ is an angle of the inner surface of the through-hole with respect to the other surface of the light guide plate and n is a refractive index of the light guide plate.

(xxi) The light-emitting device further comprises:

a light guide member arranged on the other surface of the light guide plate, wherein the reflecting surface is formed on the light guide member.

(xxii) The hole portion is formed in the light guide plate from the one surface to the middle portion in a thickness direction thereof.

(xxiii) The light guide member is a transparent plate or a transparent sheet.

(xxiv) The hole portion penetrates the light guide plate in a thickness direction thereof.

Points of the Invention

According to one embodiment of the invention, a light-emitting device can be provided that a light source to emit light from the side face as well as the top face is accommodated in a housing hole extending in the thickness direction of a light guide plate, without reducing the luminous efficiency (or light extraction efficiency).

According to another embodiment of the invention, a light-emitting device can be provided that a light source to emit light from the side face as well as the top face is accommodated in a through hole extending in the thickness direction of a light guide plate, without reducing the luminous efficiency (or light extraction efficiency).

According to another embodiment of the invention, a light source (and a production method thereof) and a light-emitting device with the light source can be provided that even when a light-emitting element is sealed with a glass material, the light distribution characteristics can be simply and easily changed.

According to another embodiment of the invention, a light-emitting device can be provided that a light source is accommodated in a hole portion of a light guide plate, without reducing the luminous efficiency (or light extraction efficiency).

BRIEF DESCRIPTION OF THE DRAWINGS

Next, the present invention will be explained in more detail in conjunction with appended drawings, wherein:

FIGS. 20A and 20B show a third embodiment of the invention, wherein FIG. 20A is a plan view of a light-emitting device and FIG. 20B is a cross sectional view thereof;

FIGS. 22A and 22B show an LED element, wherein FIG. 22A is a plan view and

FIG. 22B is a cross sectional pattern diagram;

FIGS. 31A and 31B show a modification, wherein FIG. 31A is a plan view of a light-emitting device and FIG. 31B is a cross sectional view thereof;

FIGS. 32A and 32B show a modification, wherein FIG. 32A is a plan view of a light-emitting device and FIG. 32B is a cross sectional view thereof;

FIG. 33B is a table showing $\alpha_1$ satisfying formulas (1) and (2) for each refractive index $n_1$ of the light guide plate;

FIGS. 37A and 37B show a fourth embodiment of the invention, wherein FIG. 37A is a cross sectional view of a light-emitting device and FIG. 37B is a front view thereof;

FIGS. 38A and 38B show a fifth embodiment of the invention, wherein FIG. 38A is a plan view of a light-emitting device and FIG. 38B is a cross sectional view thereof;

FIG. 44A is a plan view showing a light-emitting device in a seventh embodiment of the invention and FIG. 44B is a cross sectional view thereof;

FIG. 45A is a partial cross sectional view showing a light-emitting device;

FIG. 45B is a table showing $\alpha_2$ satisfying formulas (3) and (4) for each refractive index $n_2$ of the light guide plate;

FIGS. 51A and 51B show a eighth embodiment of the invention, wherein FIG. 51A is a plan view of a light-emitting device and FIG. 51B is a cross sectional view thereof;

FIGS. 53A and 53B show an LED element, wherein FIG. 53A is a plan view and FIG. 53B is a cross sectional pattern diagram;

FIG. 54 is an explanatory view showing manufacturing process of the light source;

FIG. 63 is a table showing $\alpha_3$ satisfying formulas (5) and (6) for each refractive index $n_3$ of the light guide plate;

FIGS. 70A and 70B show a tenth embodiment of the invention, wherein FIG. 70A is a plan view of a light-emitting device and FIG. 70B is a horizontal cross sectional view thereof;

FIGS. 76A and 76B show the eleventh embodiment of the invention, wherein FIG. 76A is a plan view of a light-emitting device and FIG. 76B is a cross sectional view thereof; and FIGS. 77A and 77B show the twelfth embodiment of the invention, wherein FIG. 77A is a plan view of a light-emitting device and FIG. 77B is a cross sectional view thereof.

DESCRIPTION OF THE PREFERRED EMBODIMENTS

First Embodiment

Figure 1:
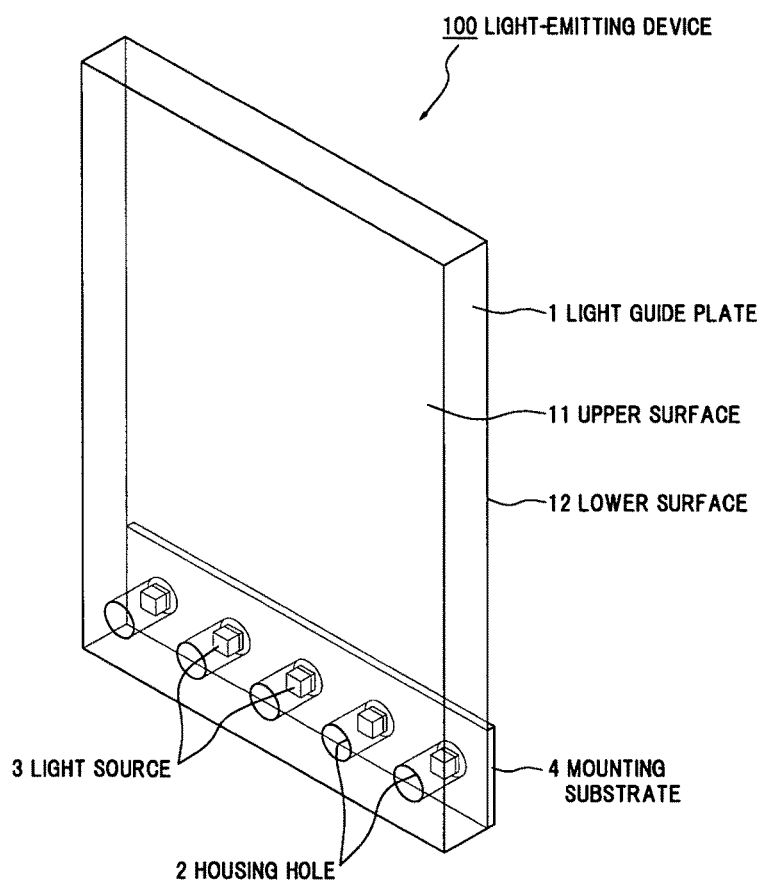
FIG. 1 is an outline perspective view showing a light-emitting device in a first embodiment of the present invention.

FIGS. 1 to 5 show the first embodiment of the invention and FIG. 1 is an outline perspective view showing a light-emitting device.

As shown in FIG. 1, a light-emitting device 100 is provided with a light guide plate 1, a housing hole 2 formed in the light guide plate 1, a light source 3 housed in the housing hole 2 and a mounting substrate 4 electrically connected to the light source 3. The light guide plate 1 is formed of a material transparent to light emitted from the light source 3, and the light emitted from the light source 3 in the housing hole 2 is incident on the light guide plate 1. In the present embodiment, the light guide plate 1 is formed in a flat-plate shape having an entirely constant thickness. The thickness of the light guide plate 1 is 3 mm in the present embodiment. A material of the light guide plate 1 is optional as long as it is transparent to the light from the light source 3, and it is possible to use, e.g., an acrylic resin. Here, one surface of the light guide plate 1 is described as an upper surface 11 and another surface thereof is described as a lower surface 12 hereinafter.

The housing hole 2 extends from the upper surface 11 toward the lower surface 12 side of the light guide plate 1, and an area of an inner surface 21 on which light is incident from the light source 3 is parallel to a thickness direction of the light guide plate 1. In the present embodiment, the housing hole 2 is formed in a circular shape having a diameter of 2 mm in a plan view so as to penetrate the light guide plate 1, and has the same cross section from top to bottom. Light is emitted upwardly and laterally from the light source 3, and the light from the light source 3 is incident on the whole area of the inner surface 21 of the housing hole 2, as described later. In the present embodiment, plural housing holes 2 are arranged along one side of the light guide plate 1 at equal intervals.

Figure 2:
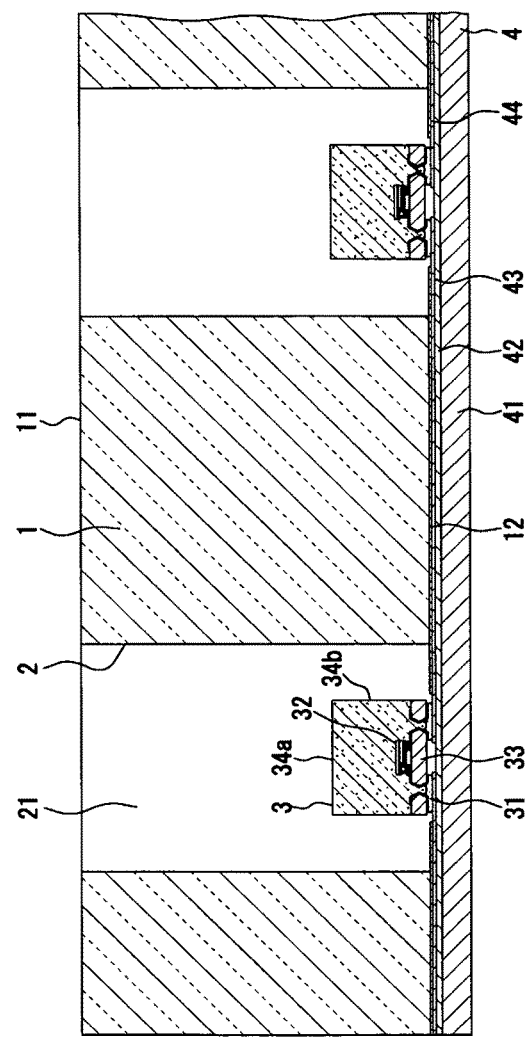
FIG. 2 is a cross sectional view showing the light-emitting device.

FIG. 2 is a cross sectional view showing the light-emitting device.

As shown in FIG. 2, the light source 3 has a flip-chip-type LED element 32 formed of a GaN-based semiconductor material, an element mounting substrate 33 for mounting the LED element 32, and a glass sealing portion 34 as an inorganic sealing portion which seals the LED element 32 and is adhered to the element mounting substrate 33. The element mounting substrate 33 is formed of a polycrystalline sintered material of alumina ($Al_2O_3$), and is formed 0.25 mm thick in 1.0 mm square. Meanwhile, the LED element 32 is formed 100 μm thick in 346 μm square.

The glass sealing portion 34 covers the LED element 32 as well as the element mounting substrate 33 on the side mounting the LED element 32, and has a thickness of 0.6 mm. The glass sealing portion 34 has an upper surface 34a parallel to the element mounting substrate 33 and a side surface 34b extending downwardly from an outer edge of the upper surface 34a and being vertical to the element mounting substrate 33. The glass sealing portion 34 can be formed of, e.g., $ZnO$—$B_2O_3$—$SiO_2$-based glass and the refractive index in this case is 1.7. In addition, this glass is thermal fusion glass fused to the element mounting substrate 33 by heating and is different from glass formed by a sol-gel reaction. However, the composition and refractive index of the glass are not limited thereto. Meanwhile, the glass sealing portion 34 includes a phosphor which converts a wavelength of the light emitted from the LED element 32. As a phosphor, it is possible to use, e.g., YAG (Yttrium Aluminum Garnet) phosphor, silicate phosphor and a mixture thereof mixed at a predetermined ratio, etc., and white light is obtained by a blue LED element 32 and a yellow phosphor in the present embodiment. Alternatively, the white light may be obtained by combining an LED element emitting ultraviolet light with a blue phosphor, a green phosphor or a red phosphor. In addition, the phosphor is not necessarily included in the glass sealing portion 34, and a phosphor may be applied to the surface of the glass sealing portion 34 or may not be used.

In the light source 3, blue light is emitted from the LED element 32 when voltage is applied thereto. The blue light emitted from the LED element 32 is partially converted into yellow by the phosphor, and is subsequently outwardly emitted through the upper surface 34a or the side surface 34b of the glass sealing portion 34. An optical axis of the light source 3 is perpendicular to the element mounting substrate 33 and passes through the center of the upper surface 34a. The light source 3 has light distribution characteristics in which the light intensity is maximized not on the optical axis but in a direction inclined at about 30°-45° to the optical axis. The light source 3 is manufactured through the following processes.

Firstly, oxide powder as a glass component is heated to 1200° C. and is stirred in a molten state. Then, after the glass is solidified, a pre-sealing glass 35 is sliced so as to correspond to a thickness of the glass sealing portion 34 and is processed into a plate shape. After this, concave portions 35a corresponding to each LED element 32 are formed, as is described later.

Meanwhile, a circuit pattern is formed on the plate-like element mounting substrate 33. For example, metal paste is screen printed, the element mounting substrate 33 is heat-treated at a predetermined temperature (e.g., 1000° C. or more) to bake the metal thereon and other metal is subsequently plated on the aforementioned metal, thereby forming the circuit pattern. Subsequently, plural LED elements 32 are mounted by flip-chip connection on the element mounting substrate 33 at equal intervals longitudinally and laterally. The circuit pattern of the element mounting substrate 33 may be formed by heat treatment of the metal paste only or can be formed by other methods such as metal sputtering followed by metal plating.

Figure 3:
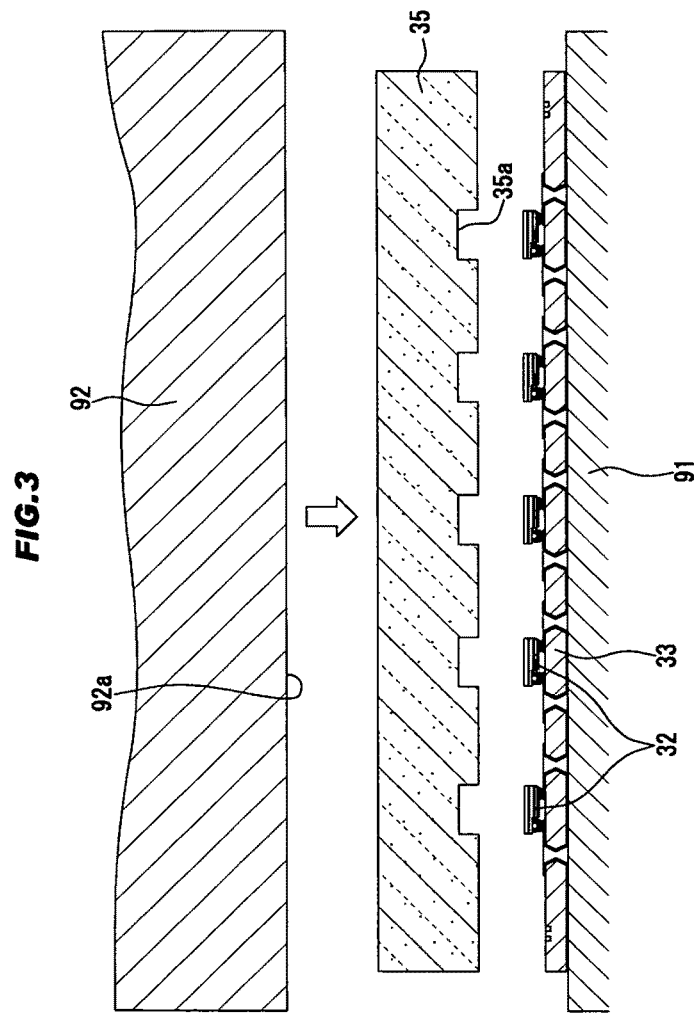
FIG. 3 is an explanatory view showing manufacturing process of the light source.
Figure 4:
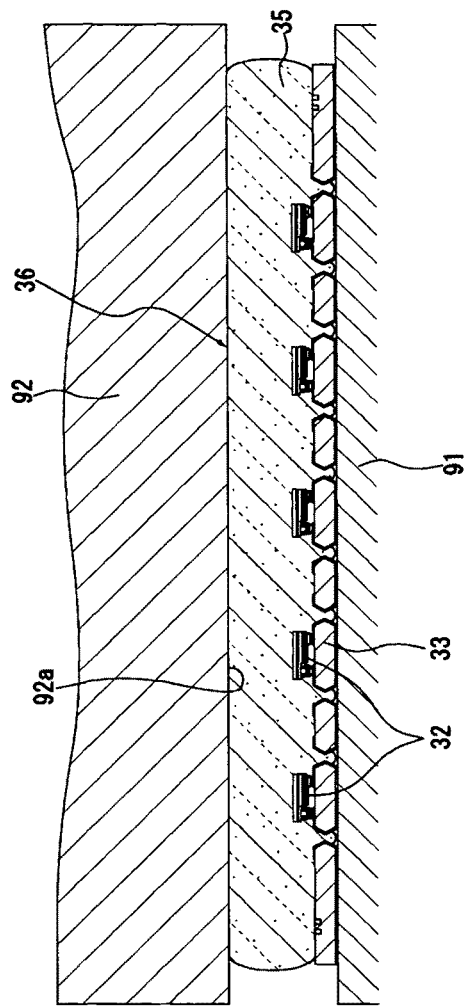
FIG. 4 is an explanatory view showing manufacturing process of the light source.

Then, as shown in FIG. 3, the element mounting substrate 33 having LED elements 32 each mounted thereon is set on a lower die 91, an upper die 92 is arranged so as to face the mounting surface of the element mounting substrate 33, and the pre-sealing glass 35 is placed between the element mounting substrate 33 and the upper die 92 so as to cover the mounting region of each of the LED element 32. After this, as shown in FIG. 4, the pressure is applied to the lower die 91 and the upper die 92 and a hot pressing process is performed in a nitrogen atmosphere on the glass material which is softened by heating. The processing conditions at this time can be optionally changed depending on temperature and pressure, etc., of the glass, for example, glass temperature of 600° C. and glass pressure of 25 $kgf/cm^2$. Obviously, the glass to be placed may be a planar shape without having concave portions formed thereon.

Figure 5:
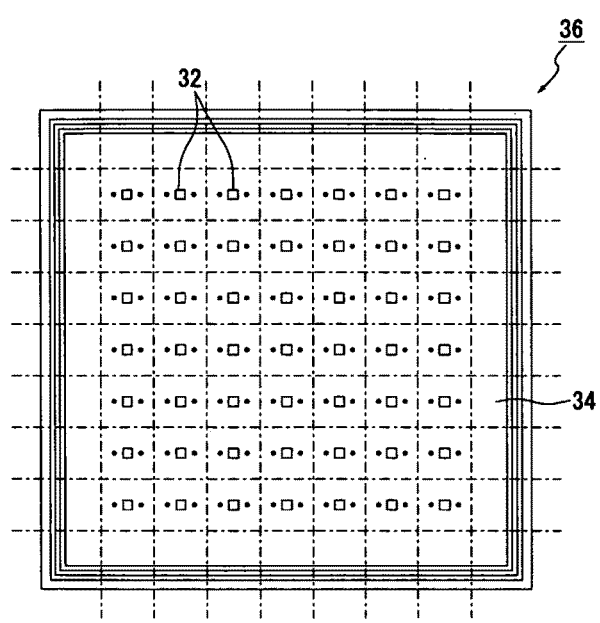
FIG. 5 is a plan view showing an intermediary body to which the light source is coupled.

An intermediary body 36 shown in FIG. 5 in which plural the light source 3 are coupled in longitudinal and lateral directions is made by the above-mentioned processes. After this, the element mounting substrate 33 integrated with the glass sealing portion 34 is placed on a dicing apparatus, dicing is performed by a dicing blade so as to divide the glass sealing portion 34 and the element mounting substrate 33 per each LED element 32, thereby completing the light source 3.

As shown in FIG. 2, the mounting substrate 4 is made of aluminum as a base and is provided along the lower surface 12 of the light guide plate 1. In the present embodiment, the mounting substrate 4 is provided so as to block each housing hole 2. The mounting substrate 4 has a substrate main body 41 formed of aluminum, an insulation layer 42 provided on the substrate main body 41, a circuit pattern 43 provided on the insulation layer 42 and a white resist layer 44 provided on the circuit pattern 43.

Next, a relation between the light source 3 and the housing hole 2 will be described.

The light source 3 of 1.0 mm square in a plan view is mounted at the center of the housing hole 2 having a diameter of 2 mm in a plan view. The light source 3 is housed in the housing hole 2 so that the element mounting substrate 33 is located on the lower surface 12 side of the light guide plate 1 and that the optical axis thereof is parallel to the thickness direction of the light guide plate 1. In addition, the light source 3 having a height of 0.85 mm is mounted on the mounting substrate 4 via a solder 31. Thus, the light source 3 is arranged at a height of 0.85 mm from the bottom edge of the housing hole 2 which has a vertical length of 3 mm. This results in that a solid angle of the inner surface 21 of the housing hole 2 with respect to the center of the upper surface 34a of the light source 3 is 90% (5.65 steradians) of $2\pi$ steradians in the upper hemisphere of the inner surface 21 of the housing hole 2. A ratio of the solid angle of the inner surface 21 of the housing hole 2 with respect to the center of the side surface 34*b* (a ratio to π steradian in the upper side of the hemisphere of the side surface) is larger than that of the upper surface 34*a*, hence, a ratio of the solid angle of the whole light source 3 is at least 90% or more. Meanwhile, a direction to maximize the light intensity of the light source 3 is about 45° and the inner surface 21 is present in this direction.

In the light-emitting device 100 configured as mentioned above, at least 90% or more of the light emitted from the light source 3 is incident on the inner surface 21 of the light guide plate 1. Since the light is refracted in a direction close to parallel to the upper surface 11 and the lower surface 12 of the light guide plate 1 at the time of light incidence, most of the incident light can be used as propagation light. Here, the refractive index of the light guide plate 1 is preferably 1.41 or more since the critical angle can be adjusted to be 45° or less. In other words, even the light incident substantially parallel to the inner surface 21 of the housing hole 2 (substantially 90° with respect to a normal direction of the inner surface 21) is refracted and becomes light within 45° with respect to the normal direction of the inner surface 21. In addition, since the upper surface 11 and the lower surface 12 of the light guide plate 1 are 90° with respect to the normal direction of the inner surface 21 of the housing hole 2, the condition for the total reflection of the incident light is fulfilled at the upper surface 11 and the lower surface 12, which results in that all light incident from the inner surface 21 of the housing hole 2 becomes propagation light. As a result, it is possible to obtain an effect contrary to the common technical knowledge, in which the light can be precisely incident on the light guide plate 1 and become the propagation light thereof without using, in the light source 3 or the light guide plate 1, a particular optical controller for controlling the light emitted upwardly from the light source 3 to orient in an in-plane direction of the light guide plate 1 even though the optical axis of the light source 3 is oriented in the thickness direction of the light guide plate 1. Therefore, the number of components can be reduced by eliminating the optical controller and it is thereby possible to simply and easily manufacture the light-emitting device 100.

In other words, a light source is conventionally coupled to a light guide plate using an optical system for narrowing a light exit area and a range of an incident angle to the light guide plate. However, in the present embodiment, the LED element 32 is formed surrounded by a side wall along a central axis thereof and is not provided with an optical system for narrowing a light exit area for the mass production of the light source 3. Even though a high-reflectivity member is selected for a reflective frame, an optical loss occurs unless using a completely non-light absorbing member, and thus, the light source of the present embodiment has an effect of high efficiency, and further, an effect of downsizing. In addition, in the light source of the present embodiment, the light, which is emitted from the LED element 32 formed surrounded by a side wall along the central axis thereof and reaches the side wall, is refracted in a direction close to a central axis direction of the LED element 32. Then, a large portion of the light emitted from the LED element 32, e.g., 50% or more of the total amount of light, is emitted in a direction at a large angle with respect to the central axis of the LED element 32 since the solid angle in this direction is large, although depending on the light distribution characteristics of the LED element 32. In other words, an incident angle to the light guide plate 32 from the light source rather increases. In addition, since the refractive index of the glass sealing portion 34 enhances light extraction from the LED element 32, it is possible to select a member having a refractive index of 1.6 or more which is larger than that of a silicon resin (refractive index: about 1.4-1.5) or an epoxy resin (about 1.5-1.6), and in this case, refractivity in the direction close to the central axis direction of the LED element 32 further increases. Meanwhile, among the light which is emitted from the LED element 32 and is excited by a phosphor or is scattered, the light reaching the side wall is also refracted in the direction close to the central axis direction of the LED element 32 in the same manner. Yet, a combination of the light source of the present embodiment with the light guide plate having a housing hole for the light source formed to be parallel to the thickness direction of the light guide plate, refraction in the housing hole as an incident surface of the light guide plate at the time of light incidence and a light guide plate having a refractive index generating total reflection on upper and lower surfaces of the light guide plate which is a plane direction orthogonal to the incident surface thereof allow the light source to be coupled to the light guide plate with high efficiency, thereby allowing reduction of the number of components and simple and easy manufacturing.

It should be noted that, although the ratio of the solid angle of the inner surface 21 of the housing hole 2 with respect to the center of the upper surface 34*a* of the light source 3 is not necessarily 90% or more of 2π steradians in the upper hemisphere, 70% (4.44 steradians) or more is desirable for optical efficiency. Furthermore, it is desirable that the inner surface 21 of the housing hole 2 is present in a direction in which the light intensity of the light source 3 is maximized. In addition, the inner surface 21 of the housing hole 2 is desirably a surface which is perpendicular to the light guide plate 1 and is not a rough surface but a smooth surface, however, regarding the refractive index of the light guide plate 1 and an incident angle from the light source 3 to the inner surface 21 of the housing hole 2, slight inclination and roughness from a direction 90° with respect to the thickness direction of the light guide plate 1 are acceptable since efficiency is not significantly deteriorated.

Figure 6:
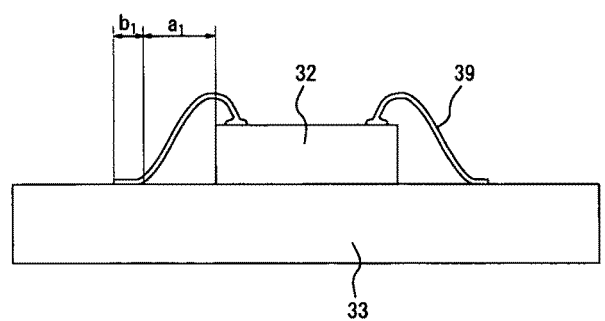
FIG. 6 is an explanatory view showing the case where an LED element of the light source is connected by e.g., wire bonding.

In addition, according to the present embodiment, since the LED element 32 of the light source 3 is mounted by flip-chip connection, it is possible to reduce a plan view size of the light source 3, thereby reducing the diameter of the housing hole 2. As a result, it is possible to mount the light source 3 which has an optical axis in a thickness direction of the light guide plate 1 without increasing the thickness thereof. For example, as shown in FIG. 6, when the LED element 32 is mounted by wire bonding connection, a first distance $a_1$ for a wire loop and a second distance $b_1$ for connecting the element mounting substrate 33 to a wire 39 are additionally required to be provided around the LED element 32. Since the first distance $a_1$ is, e.g., 0.3-0.5 mm and the second distance $b_1$ is, e.g., 0.2-0.5 mm, the element mounting substrate 33 needs to be larger than 1.0 mm square of the above-mentioned embodiment when the wire bonding is employed. When the element mounting substrate 33 is, e.g., 2.5 mm square in size, the diameter of the housing hole 2 in the light guide plate 1 also needs to be increased to, e.g., 5 mm. Then, if the light-emitting device 100 in this size is manufactured, the ratio of the solid angle of the inner surface 21 with reference to the center of the upper surface 34*a* of the light source 3 is reduced to 75% even though the same LED element 32 is mounted. In addition, if the light source 3 is the same in height but is reduced in plan view size, light distribution in a horizontal direction relatively increases. In a case that a phosphor is dispersed in a sealing material, a difference in chromaticity between light in an upper direction and that in a horizontal direction is likely to be remarkable when a planar direction size of the sealing material is smaller than height thereof, however, the light can be mixed in the light guide plate 1 even if the difference in chromaticity occurs.

In addition, since the present embodiment does not require optical processes of the upper surface 34a and the side surface 34b of the light source 3, the light source 3 is simply and easily manufactured. For this light-emitting device 100, the light source 3 having light distribution in which the maximum light intensity does not exist on the optical axis is more preferable, and it is very advantageous for practical use since a cubic light source 3 is not processed and it is only necessary to form a simple housing hole 2.

Although the light source 3 in which the LED element 32 is sealed with glass has been described in the above-mentioned embodiment, the sealing material can be changed as long as the LED element 32 is flip-chip connected to the element mounting substrate 33 and the light source 3 does not have a frame portion of the sealing material in a plan view.

Figure 7:
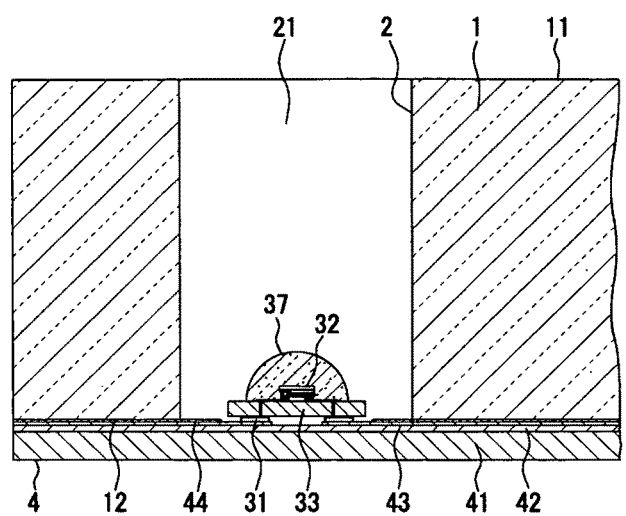
FIG. 7 is a cross sectional view showing a light-emitting device in a modification.

A thermal fusion glass sealed LED is desirable for increasing the light distribution in a horizontal direction since formation in a height direction is easy, a thermal expansion coefficient is equivalent to that of the element mounting substrate and a bonded area between the sealing material and the element mounting substrate can be reduced due to a strong bonding force of the both members, however, the LED element 32 may be sealed with a resin sealing portion 37 such as a silicon resin or an epoxy resin, etc., as shown in FIG. 7. In the light source 3 of FIG. 7, the resin sealing portion 37 is formed in a hemispherical shape on the element mounting substrate 33.

Figure 8:
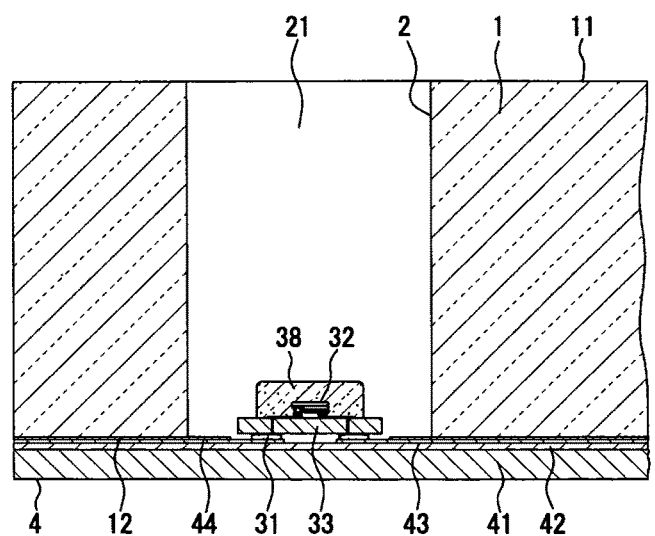
FIG. 8 is a cross sectional view showing a light-emitting device in a modification.

Alternatively, the LED element 32 may be sealed with, e.g., an inorganic paste 38 with a predetermined thickness as shown in FIG. 8. The inorganic paste 38 can be formed of, e.g., a $SiO_2$—, $Al_2O_3$— or $TiO_2$-based material, etc.

Figure 9:
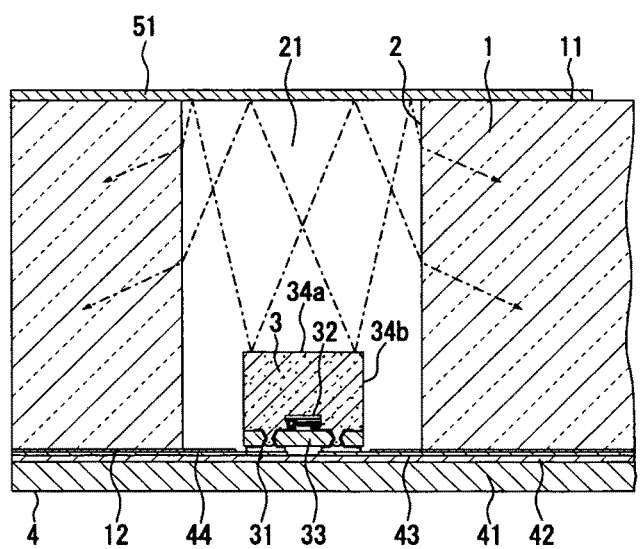
FIG. 9 is a cross sectional view showing a light-emitting device in a modification.

Meanwhile, although the housing hole 2 of which upper portion is open has been described in the above-mentioned embodiment, a member for blocking the upper portion of the housing hole 2 may be provided so that secondary light due to reflection also becomes the propagation light of the light guide plate 1. For example, light traveling upwardly from the housing hole 2 can be incident on the inner surface 21 of the light guide plate 1 by blocking the upper portion of the housing hole 2 with a reflecting plate 51 as shown in FIG. 9. When a reflecting surface of the reflecting plate 51 is formed of a material having a relatively high surface reflectance, e.g., aluminum, it is possible to efficiently use specular reflection. When the reflecting surface is aluminum, for example, the reflecting plate 51 itself is an aluminum plate or an aluminum foil is stuck on the reflecting surface of the reflecting plate 51. In this case, it is possible to block direct light from the light source 3 to the outside, and it is thereby effective to prevent emission of direct light.

Figure 10:
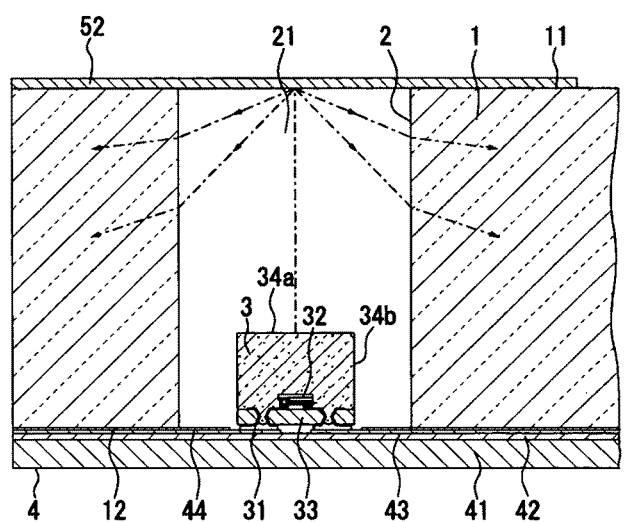
FIG. 10 is a cross sectional view showing a light-emitting device in a modification.

Alternatively, a reflecting plate 52 mainly using diffuse reflection may be used as shown in FIG. 10. In this case, it is possible to use a white diffusion sheet for the inner surface of the reflecting plate 52. In the above-mentioned embodiment, it is preferable to use diffuse reflection rather than specular reflection since the incident angle of, the light incident on the reflecting plate 52 is relatively small.

Figure 11:
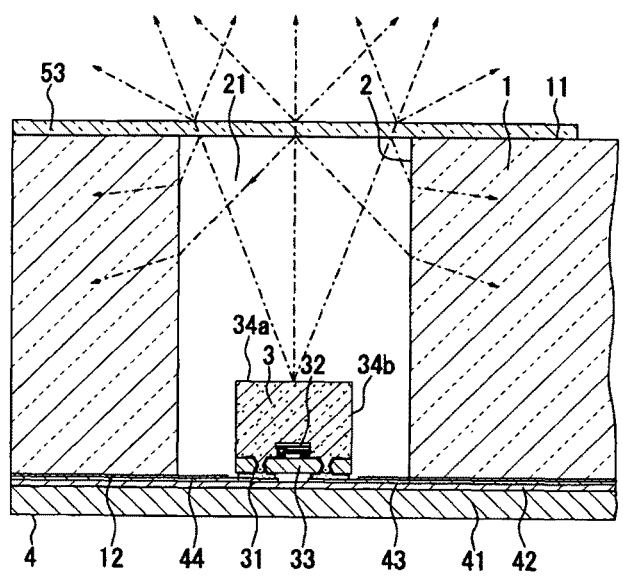
FIG. 11 is a cross sectional view showing a light-emitting device in a modification.

Moreover, for example, light may be partially transmitted through a reflecting plate 53 as shown in FIG. 11. As a result, only the amount of light required for external emission is extracted to the outside and the rest of the light is incident on the light guide plate 1.

Figure 12:
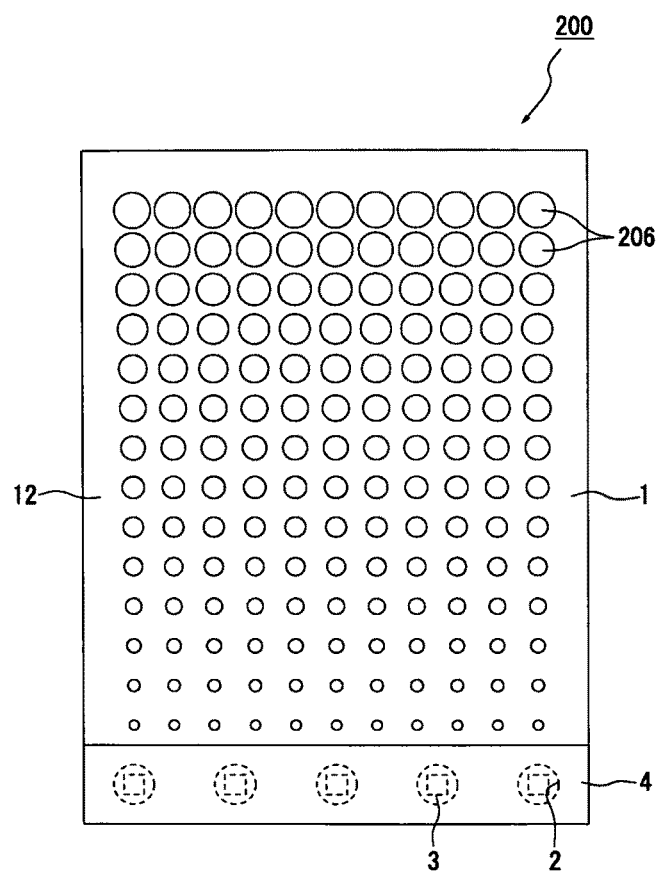
FIG. 12 is a bottom view showing a light-emitting device in a modification.
Figure 13:
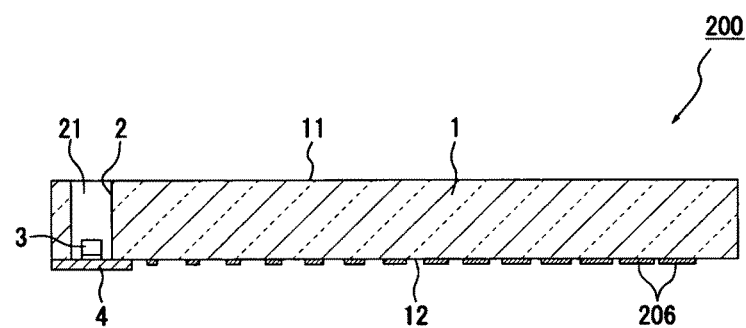
FIG. 13 is a cross sectional view showing a light-emitting device in a modification.

In addition, although any process is not performed on both surfaces of the light guide plate 1 in the above-mentioned embodiment, optional processes may be, of course, performed, if necessary. For example, a reflection process may be performed on at least one surface of the light guide plate 1 as shown in FIGS. 12 and 13. In a light-emitting device 200 of FIGS. 12 and 13, plural circular reflective portions 206 are formed on the lower surface 12 so that the light in the light guide plate 1 is reflected at the reflective portions 206 and is extracted through the upper surface 11. In this case, if the reflective portions 206 are smaller as closer to the light source 3 and larger as further from the light source 3 as shown in FIGS. 12 and 13, the amount of the light extracted from the upper surface 11 can be uniform regardless of a distance from the light source 3.

The reflective portion 206 can be formed by screen printing, ink jet printing, a laser process or thermal transfer using a die, etc. Particularly, a block used for the screen printing, etc., is not required for the ink jet printing and the laser process, etc., and the reflective portion 206 can be processed depending on, e.g., emission properties of the actually manufactured light-emitting device 200. The ink jet printing has a further advantage in that a process for a wide area is simultaneously performed by arranging nozzles entirely above the light guide plate 1, resulting in excellent workability.

Figure 14:
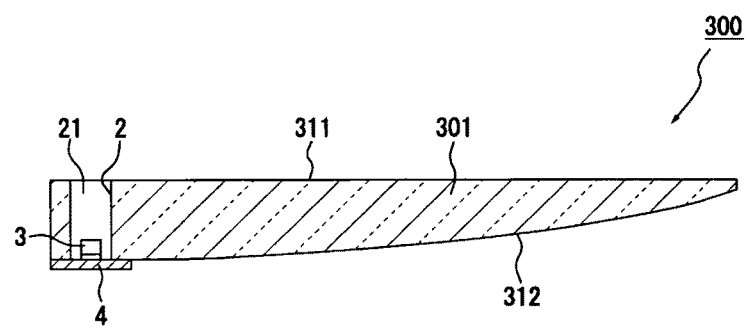
FIG. 14 is a cross sectional view showing a light-emitting device in a modification.

In addition, although the light guide plate 1 formed in a plate-like shape has been described in the above-mentioned embodiment, the shape of the light guide plate 1 may be, of course, appropriately changed as long as it guides the light incident from the housing hole 2. For example, a lower surface 312 may be curved so as to come close to an upper surface 311 with increasing a distance from the light source 3 as shown in FIG. 14. The uniform light extraction from the upper surface 311 is also possible in a light-emitting device 300. In addition, since the light source 3 does not include an optical system and is thus small, a light guide plate 301 having high brightness can be obtained by closely arranging many light sources 3. On the other hand, it is possible to prevent deterioration in brightness at each space between the light sources 3 when the light sources 3 are arranged at relatively wide intervals since the light is emitted 360° in a lateral orientation. Furthermore, since a space between the adjacent housing holes 2 increases and a region of a main portion of the light guide plate 301 thus increases, the light of the light sources 3 which is emitted on the left side in FIG. 14 can be easily transmitted to the right side thereof.

Second Embodiment

Figure 15:
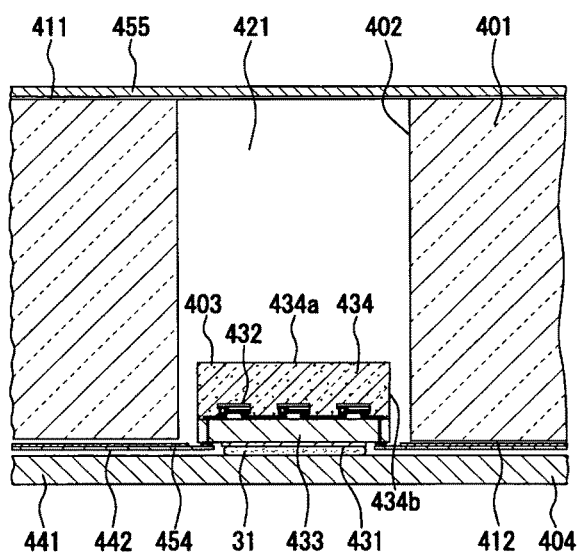
FIG. 15 is a cross sectional view showing a light-emitting device in a second embodiment.
Figure 16:
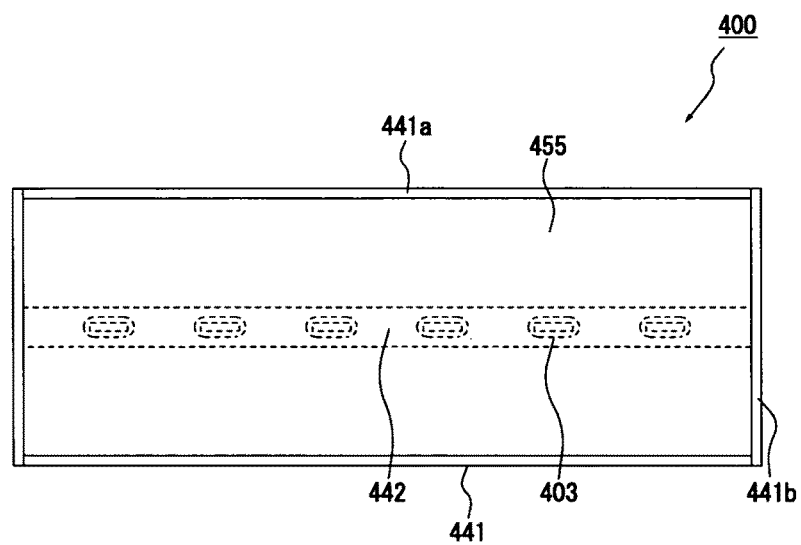
FIG. 16 is a plan view showing the light-emitting device.

FIGS. 15 and 16 show the second embodiment of the invention, and FIG. 15 is a cross sectional view showing a light-emitting device.

As shown in FIG. 15, a light-emitting device 400 is provided with a light guide plate 401, a housing hole 402 formed in the light guide plate 401, a light source 403 housed in the housing hole 402 and a circuit pattern 442 electrically connected to the light source 403. The light guide plate 401 is formed of a material transparent to light emitted from the light source 403, and the light emitted from the light source 403 in the housing hole 402 is incident on the light guide plate 401. In the present embodiment, the light guide plate 401 is formed in a flat-plate shape having an entirely constant thickness. The thickness of the light guide plate 401 is 5 mm in the present embodiment.

The housing holes 402 extends from an upper surface 411 toward a lower surface 412 side of the light guide plate 401, and an area of an inner surface 421 on which light is incident from the light source 403 is parallel to a thickness direction of the light guide plate 401. In the present embodiment, the housing hole 402 is formed in an oval shape composed of semicircular portions having a radius of 0.75 mm and straight portions having a length of 3.0 mm in a plan view so as to penetrate the light guide plate 401, and has the same cross section from top to bottom.

The light source 403 has plural flip-chip-type LED elements 432 formed of a GaN-based semiconductor material, an element mounting substrate 433 for mounting each LED element 432, a glass sealing portion 434 as an inorganic sealing portion which seals each of the LED elements 432 and is adhered to the element mounting substrate 433, and a heat radiation pattern 431 formed on the back surface of the element mounting substrate 433. The element mounting substrate 433 is formed of a polycrystalline sintered material of alumina ($Al_2O_3$), and is formed in a rectangle shape with a thickness of 0.25 mm, a long side of 2.8 mm and a short side of 0.75 mm.

The glass sealing portion 434 covers the LED element 432 as well as the element mounting substrate 433 on the side mounting the LED element 432, and has a thickness of 0.7 mm. In addition, the glass sealing portion 434 has an upper surface 434*a* parallel to the element mounting substrate 433 and a side surface 434*b* extending downwardly from an outer edge of the upper surface 434*a* and being vertical to the element mounting substrate 433.

A mounting substrate 404 is made of polyimide as a base and is provided along the lower surface 412 of the light guide plate 401. In the present embodiment, a white reflective sheet 454 is provided between the lower surface 412 of the light guide plate 401 and the mounting substrate 404. A white reflective sheet 455 is further provided on the upper surface 411 of the light guide plate 401 in the present embodiment. In addition, a connecting hole 404*a* is formed in the mounting substrate 404 below the light source 403, and the heat radiation pattern 431 and an aluminum frame 441 are connected by the solder 31 through the connecting hole 404*a*. The aluminum frame 441 is formed on the entire light guide plate 401 on the lower surface 412 side. Alternatively, the mounting substrate 404 may be made of aluminum or copper as a base and, in this case, may be solder-connected to the heat radiation pattern 431 via an insulation layer. Furthermore, the aluminum or copper of the mounting substrate 404 may be solder-connected to the heat radiation pattern 431 without interposing an insulation layer to increase heat dissipation by not forming an insulation layer on a portion corresponding to the heat radiation pattern 431.

Next, a relation between the light source 403 and the housing hole 402 will be described.

The light source 403 is mounted so that a center of gravity thereof coincides with the center of the housing hole 402 in a plan view. In addition, the light source 403 having a height of 0.95 mm is mounted on the mounting substrate 404 via the solder 31. Thus, the light source 403 is arranged at a height of 0.95 mm from the bottom edge of the housing hole 402 which has a vertical length of 5 mm. This results in that a ratio of the solid angle of the inner surface 421 of the housing hole 402 with respect to the center (center of gravity) of the upper surface 434*a* of the light source 403 is less than 90%. In addition, since the solid angle with respect to the center of the side surface 434*b* is larger than that of the upper surface 434*a*, the solid angle of the whole light source 403 is at least 90% or more.

FIG. 16 is a plan view showing the light-emitting device.

As shown in FIG. 16, the aluminum frame 441 has, at the edges thereof, a pair of horizontal flanges 441*a* and a pair of vertical flanges 441*b* which extend upwardly, and the light guide plate 401 (not shown in FIG. 16) and the white reflective sheet 455, etc., are arranged inside the respective flange portions 441*a* and 441*b*. In the present embodiment, plural horizontally-long light sources 403 are arranged in a row in a lateral direction. Meanwhile, the housing holes 402 in the light guide plate 401 are formed horizontally long so as to correspond to the light sources 403 and are lined up in a lateral direction at the vertical center of the light guide plate 401.

In the light-emitting device 400 configured as mentioned above, at least 90% or more of the light emitted from the light source 403 is incident on the inner surface 421 of the light guide plate 401. Since the light is refracted in a direction close to parallel to the upper surface 411 and the lower surface 412 of the light guide plate 401 at the time of light incidence, most of the incident light can be used as propagation light. As a result, it is possible to obtain an effect contrary to the common technical knowledge, in which the light can be precisely incident on the light guide plate 401 and become the propagation light thereof without using, in the light source 403 or the light guide plate 401, a particular optical controller for controlling the light emitted upwardly from the light source 403 to orient in an in-plane direction of the light guide plate 401 even though the optical axis of the light source 403 is oriented in the thickness direction of the light guide plate 401. Therefore, the number of components can be reduced by eliminating the optical controller and it is thereby possible to simply and easily manufacture the light-emitting device 400. In addition, the light source 403 which emits light not only from the side surface 434*b* but also from the upper surface 434*a* can be housed in the housing hole 402 extending in the thickness direction of the light guide plate 401 without losing luminous efficiency.

In addition, in the present embodiment, it is possible to obtain good heat dissipation characteristics and to realize thinning since the heat generated in the light source 403 is diffused into the aluminum frame 441 which is placed parallel to the light guide plate 401. In addition, since the white reflective sheet 454 is interposed between the aluminum frame 441 and the light guide plate 401, the light in the light guide plate 401 can be precisely reflected toward the upper surface 411 side. Furthermore, since the upper surface 411 of the light guide plate 401 is covered by the white reflective sheet 455, uniform white light is outwardly emitted from the white reflective sheet 455.

In addition, according to the present embodiment, since the LED element 432 of the light source 403 is mounted by flip-chip connection and the light source 403 is not provided with a particular optical system for horizontal emission, it is possible to reduce a plan view size of the light source 403, thereby reducing the diameter of the housing hole 402. As a result, it is possible to mount the light source 403 having an optical axis in a thickness direction of the light guide plate 401 without increasing the thickness thereof. In addition, since the housing hole 402 in the light guide plate 401 is not provided with a particular optical system therein and is simply a vertical hole formed in the light guide plate 401, the light source 403 and the housing hole 402 in the light guide plate 401 can be relatively hard to see in the whole view of the light guide plate 401. In addition, since optical processes of the upper surface 434*a* and the side surface 434*b* of the light source 403 are not required, the light source 403 is also simply and easily manufactured. Furthermore, since the light source 403 is mounted so as to have an optical axis in a thickness direction, a heat dissipation countermeasure can be taken only by mounting the light source 403 on the aluminum frame 441 which is parallel to the light guide plate 401.

Figure 17:
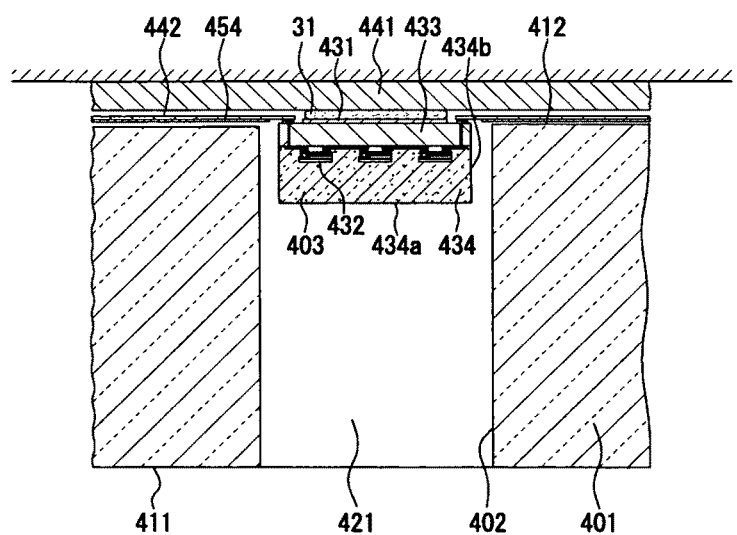
FIG. 17 is a cross sectional view showing a light-emitting device in a modification.

Although the white reflective sheet 455 provided on the upper surface 411 of the light guide plate 401 has been described in the second embodiment, the white reflective sheet 455 may be omitted as, for example, shown in FIG. 17.

For example, as shown in FIG. 17, by fixing the light guide plate 401 to a ceiling, etc., on the lower surface 412 side such that light is not emitted at an angle of, e.g., 45° or more, preferably 30° or more, with respect to the optical axis of the light source 403, the glaring light source 403 having high brightness cannot be seen directly unless a user, etc., looks up the light-emitting device 400, and also a lighting equipment not generating glare is realized by light emission from the entire light guide plate 401 while light intensity just below the lighting equipment can be increased by the light which exits directly outside from the housing hole 402. Assuming that the light distribution characteristics of the light source 403 are axially symmetric, when the light is not emitted at an angle of 45° or more, preferably 30° or more, with respect to the optical axis of the light source 403, a solid angle of the inner surface 421 of the housing hole 402 with respect to the center of the upper surface 434a of the light source 403 is 4.44 steradians, or preferably 5.44 steradians.

Figure 18:
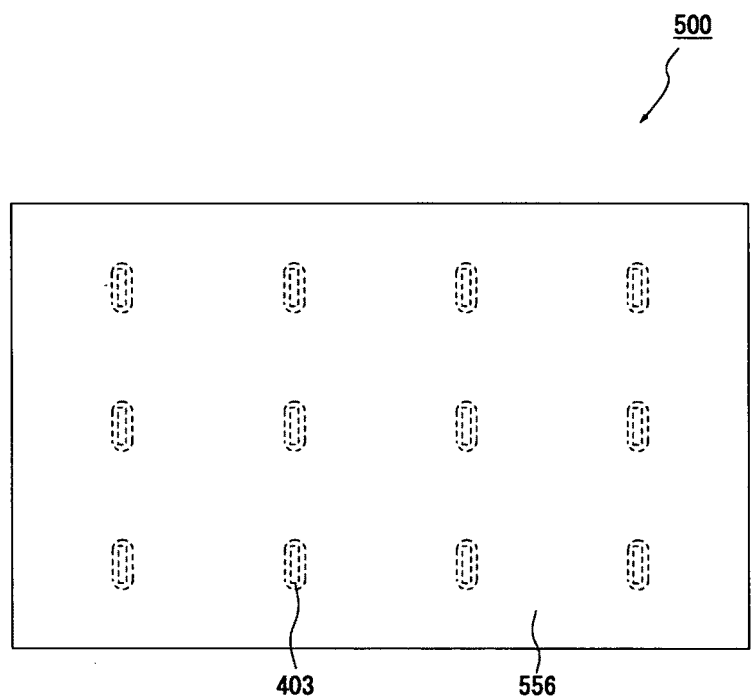
FIG. 18 is a plan view showing a light-emitting device in a modification.

In addition, although the horizontally-long light sources 403 arranged in a row in a horizontal direction have been described in the second embodiment, the layout of the light sources is optional, and for example, the light sources 403 may be arranged in a longitudinal direction or arranged in plural rows as shown in FIG. 18. Meanwhile, the light source 403 and the housing hole 402 in the light guide plate 401 are relatively hard to see but can be used as an accent, and it is possible to improve appearance by arranging at uniform intervals or in a regular pattern or randomly.

Figure 19:
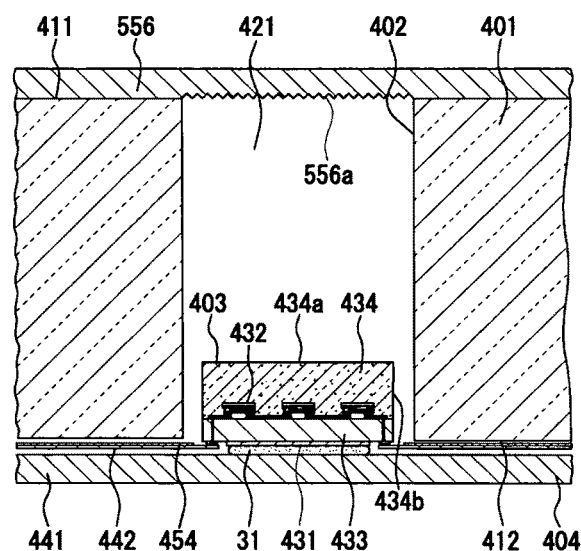
FIG. 19 is a cross sectional view showing a light-emitting device in a modification.
Figure 20:
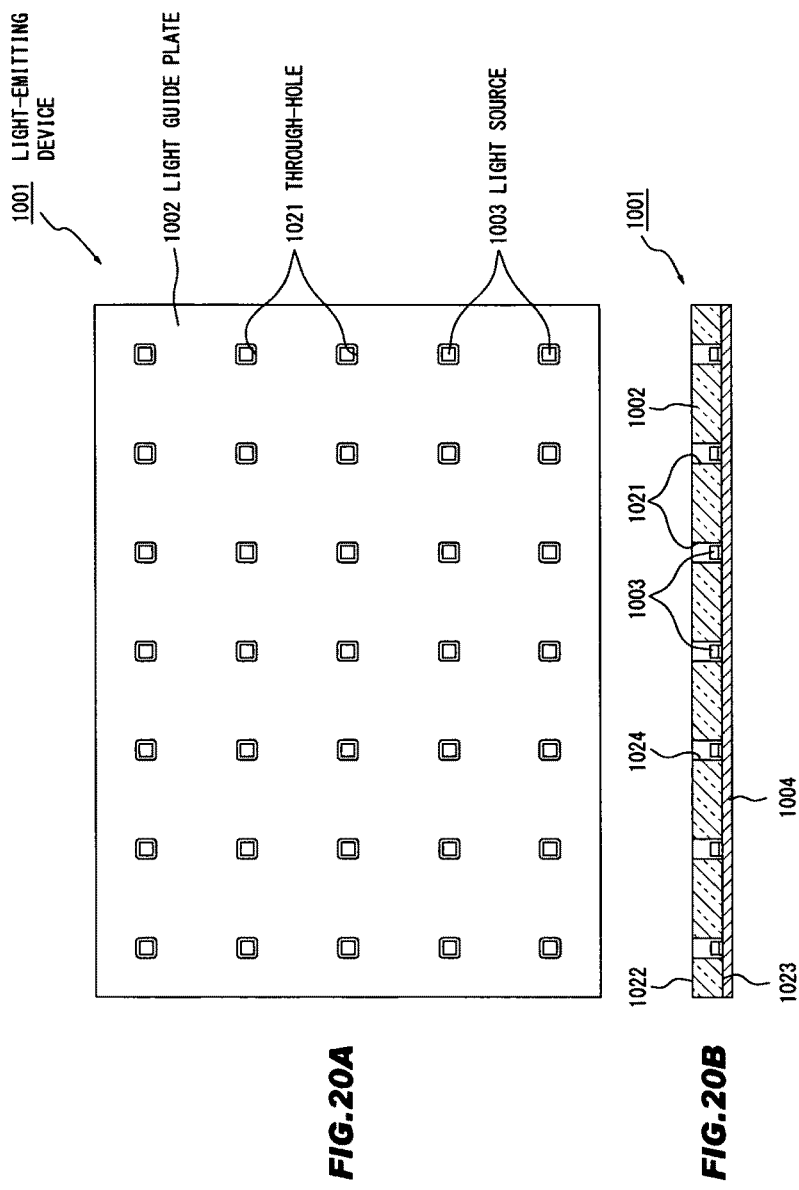

Here, in a light-emitting device 500 in FIG. 18, a diffuser plate 556 is provided on the upper surface 411 of the light guide plate 401, instead of the white reflective sheet 455. As shown in FIG. 19, a diffusion enhancing portion 556a on which a roughening process is performed is formed on a portion of the diffuser plate 556 blocking the housing hole 402. The diffusion enhancing portion 556a can be formed by applying a diffusion coating. The light-emitting device 500 allows the light in the housing hole 402 to be effectively diffused, and the light outwardly emitted from the diffuser plate 556 can be more uniform while light extraction efficiency is improved.

In addition, although a light-emitting device using an LED element as a light-emitting element has been described in the above-mentioned embodiment, the light-emitting element is not limited to the LED element and other specific detailed structure, etc., can be, of course, appropriately changed.

Third Embodiment

FIGS. 20 to 26 show the third embodiment of the invention. FIG. 20A is a plan view of a light-emitting device and FIG. 20B is a cross sectional view thereof.

As shown in FIG. 20A, a light-emitting device 1001 is provided with a light guide plate 1002, plural through-holes 1021 formed in the light guide plate 1002, a light source 1003 housed in the through-hole 1021 and a mounting substrate 1004 electrically connected to the light source 1003. The light guide plate 1002 is formed of a material transparent to light emitted from the light source 1003 and the light emitted from the light source 1003 in the through-hole 1021 is incident on the light guide plate 1002. In the present embodiment, the light guide plate 1002 is formed in a flat-plate shape having an entirely constant thickness. A material of the light guide plate 1002 is optional as long as it is transparent to the light from the light source 1003, and it is possible to use, e.g., an acrylic resin. Here, one surface of the light guide plate 1002 is described as an upper surface 1022 and another surface thereof is described as a lower surface 1023 hereinafter. A scattering surface is formed on the lower surface 1023 by white paint, surface roughening or prism formation.

In the through-hole 1021, an area of an inner surface 1024 on which light is incident from the light source 1003 is parallel to a thickness direction of the light guide plate 1001. In the present embodiment, the through-hole 1021 is formed in a square shape of which corners are cut in a plan view, and has the same cross section from top to bottom. In detail, the corners of the through-hole 1021 are curved at a predetermined radius of curvature. Light is emitted upwardly and laterally from the light source 1003, and the light from the light source 1003 is incident on the whole area of the inner surface 1024 of the through-hole 1021, as described later. In the present embodiment, plural through-holes 1021 are regularly formed in the light guide plate 1002 in a plan view. In detail, the through-holes 1021 are arranged in a lattice point pattern on the entire surface of the planar light-emitting device 1001 at equal intervals longitudinally and laterally.

Figure 21:
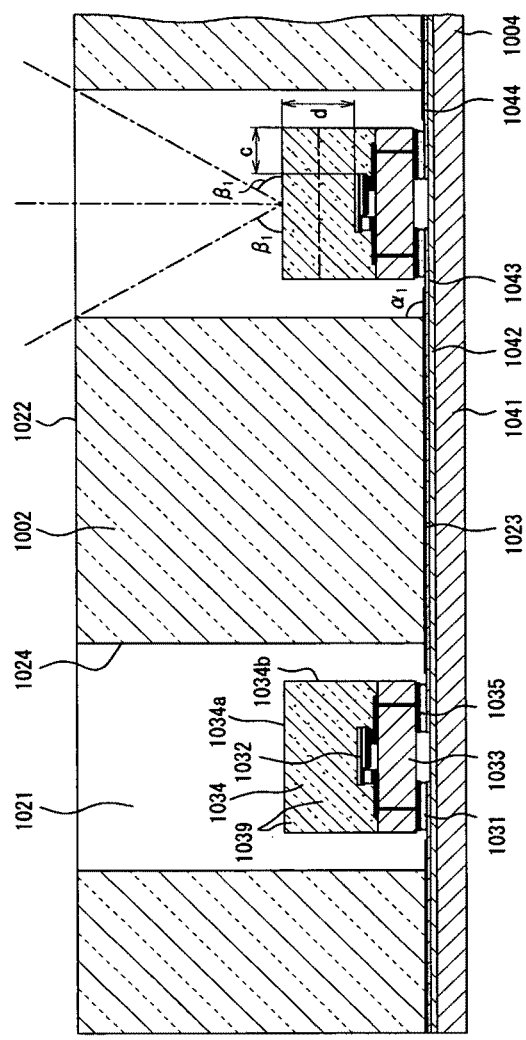
FIG. 21 is a partial cross sectional view showing the light-emitting device.

FIG. 21 is a partial cross sectional view showing the light-emitting device.

As shown in FIG. 21, the light source 1003 has a flip-chip-type LED element 1032 formed of a GaN-based semiconductor material, an element mounting substrate 1033 for mounting the LED element 1032, and a glass sealing portion 1034 as an inorganic sealing portion which seals the LED element 1032 and is adhered to the element mounting substrate 1033. In addition, a circuit pattern 1035 for electrically connecting the LED element 1032 to the mounting substrate 1004 is formed on the element mounting substrate 1033. The circuit pattern 1035 has a front surface pattern formed on the front surface of the element mounting substrate 1033, a rear surface pattern formed on the rear surface of the element mounting substrate 1033, and a via pattern for connecting the front surface pattern to the rear surface pattern. The element mounting substrate 1033 is formed of a polycrystalline sintered material of alumina ($Al_2O_3$), and is formed 250 μm thick in 1000 μm square. Meanwhile, the LED element 1032 is formed 100 μm thick in 346 μm square. In other words, as shown in FIG. 21, a distance c from a side edge of the LED element 1032 to a side surface 1034b of the glass sealing portion 1034 is 320 μm and a distance d from an upper edge of the LED element 1032 to an upper surface 1034a of the glass sealing portion 1034 is 500 μm.

Figure 22A:
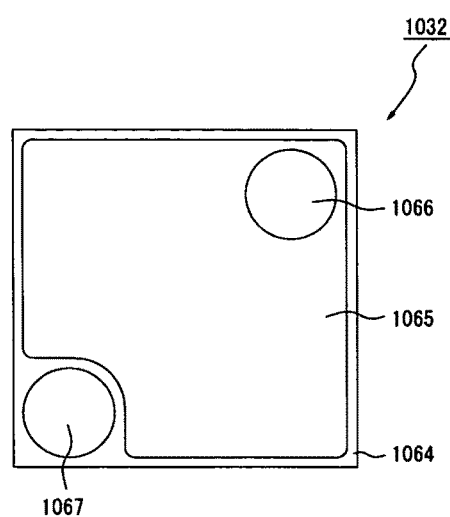
Figure 22B:
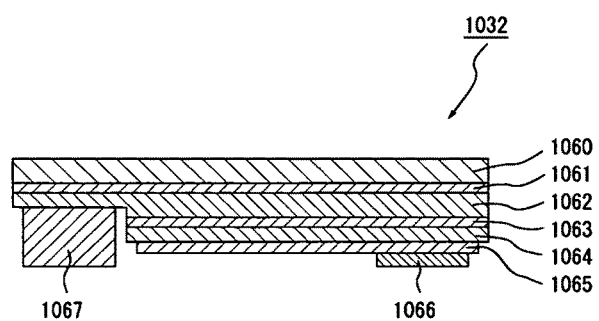

FIG. 22 show an LED element, wherein FIG. 22A is a plan view and FIG. 22B is a cross sectional pattern diagram.

As shown in FIG. 22A, a buffer layer 1061, an n-type layer 1062, a MQW layer 1063 and a p-type layer 1064 are formed in this order in the LED element 1032 as a light-emitting element by epitaxially growing a Group III nitride-based semiconductor on a surface of a supporting substrate 1060 which is formed of sapphire ($Al_2O_3$). The LED element 1032 is epitaxially grown at 700° C. or more, has a heat resistance temperature of 600° C. or more, and is stable at the processing temperature during the sealing process using the below-described low-melting point glass. In addition, the LED element 1032 has a p-side electrode 1065 provided on a surface of the p-type layer 1064, a p-side pad electrode 1066 formed on the p-side electrode 1065 and an n-side electrode 1067 formed on the n-type layer 1062 which is exposed by partially etching from the p-type layer 1064 to the n-type layer 1062.

The p-side electrode 1065 is formed of, e.g., transparent conductive oxide such as ITO (Indium Tin Oxide), and functions as a light reflection layer for reflecting the light emitted from the MQW layer 1063 as a light emitting layer toward a direction of the supporting substrate 1060. Meanwhile, the n-side electrode 1067 is made of a metal such as, e.g., Ni/Au or Al, etc., and is formed at one corner of the LED element 1032 in a plan view. In the present embodiment, the p-side electrode 1065 is formed on the substantially entire LED element 1032 in a plan view except a formation region of the n-side electrode 1067, as shown in FIG. 22B. Meanwhile, the p-side pad electrode 1066 is made of, e.g., Ni/Au and is formed at a corner of the LED element 1032 diagonal to the n-side electrode 1067 in a plan view. The n-side electrode 1067 and the p-side pad electrode 1066 are formed in a circular shape in a plan view.

Figure 23:
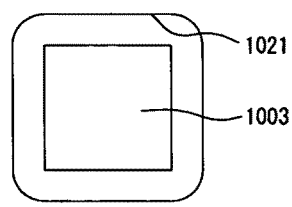
FIG. 23 is an explanatory view showing a relation between a light source and a through-hole.

FIG. 23 is an explanatory view showing a relation between a light source and a through-hole.

As shown in FIG. 23, the light source 1003 of 1.0 mm square in a plan view is mounted at the center of the through-hole 1021 of 1.5 mm square in a plan view. Here, the corners of the through-hole 1021 are rounded so that a radius of curvature is 0.25. The light source 1003 is housed in the through-hole 1021 so that the element mounting substrate 1033 is located on the lower surface 1023 side of the light guide plate 1002 and that the optical axis thereof is parallel to the thickness direction of the light guide plate 1002.

As shown in FIG. 21, the glass sealing portion 1034 covers the LED element 1032 as well as the element mounting substrate 1033 on the side mounting the LED element 1032, and has a thickness of 0.6 mm. The glass sealing portion 1034 has the upper surface 1034a parallel to the element mounting substrate 1033 and the side surface 1034b extending downwardly from an outer edge of the upper surface 1034a and being vertical to the element mounting substrate 1033. The glass sealing portion 1034 can be formed of, e.g., ZnO—$B_2O_3$—$SiO_2$-based glass and the refractive index in this case is 1.7. In addition, this glass is thermal fusion glass fused to the element mounting substrate 1033 by heating and is different from glass formed by a sol-gel reaction. However, the composition and refractive index of the glass are not limited thereto.

Figure 30:
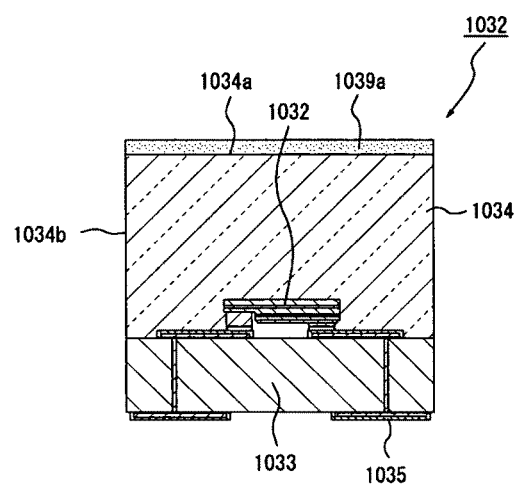
FIG. 30 is a cross sectional view showing a light source in a modification.

Meanwhile, the glass sealing portion 1034 includes a phosphor 1039 which converts a wavelength of the light emitted from the LED element 1032. As the phosphor 1039, it is possible to use, e.g., YAG (Yttrium Aluminum Garnet) phosphor, silicate phosphor and a mixture thereof mixed at a predetermined ratio, etc., and white light is obtained by a blue LED element 1032 and a yellow phosphor 1039 in the present embodiment. Alternatively, the white light may be obtained by combining an LED element emitting ultraviolet light with a blue phosphor, a green phosphor or a red phosphor. In addition, the phosphor 1039 is not necessarily included in the glass sealing portion 1034, and for example, a phosphor 1039a may be applied to the surface of the glass sealing portion 1034 or the phosphor 1039 may not be used, as shown in FIG. 30.

In the light source 1003, blue light is emitted from the LED element 1032 when voltage is applied thereto. The blue light emitted from the LED element 1032 is partially converted into yellow by the phosphor 1039, and is subsequently outwardly emitted through the upper surface 1034a or the side surface 1034b of the glass sealing portion 1034. Here, since the distance c from the side edge of the LED element 1032 to the side surface 1034b of the glass sealing portion 1034 and the distance d from the upper edge of the LED element 1032 to the upper surface 1034a of the glass sealing portion 1034 are different, the light emitted from the upper surface 1034a and the light emitted from the side surface 1034b are different in chromaticity. An optical axis of the light source 1003 is perpendicular to the element mounting substrate 1033 and passes through the center of the upper surface 1034a. The light source 1003 has light distribution characteristics in which the light intensity is maximized not on the optical axis but in a direction inclined at about 30°-45° to the optical axis. The light source 1003 is manufactured through the following processes.

Firstly, oxide powder as a glass component and phosphor powder are heated to 1200° C. and are stirred in a molten state. Then, after the glass is solidified, a pre-sealing glass 1034c is sliced so as to correspond to a thickness of the glass sealing portion 1034 and is processed into a plate shape.

Meanwhile, a circuit pattern is formed on the plate-like element mounting substrate 1033. For example, metal paste is screen printed, the element mounting substrate 1033 is heat-treated at a predetermined temperature (e.g., 1000° C. or more) to bake the metal thereon and other metal is plated on the aforementioned metal, thereby forming the circuit pattern 1035. Subsequently, plural LED elements 1032 are mounted by flip-chip connection on the element mounting substrate 1033 at equal intervals longitudinally and laterally. The circuit pattern of the element mounting substrate 1033 may be formed by heat treatment of the metal paste only or can be formed by other methods such as metal sputtering followed by metal plating.

Figure 24:
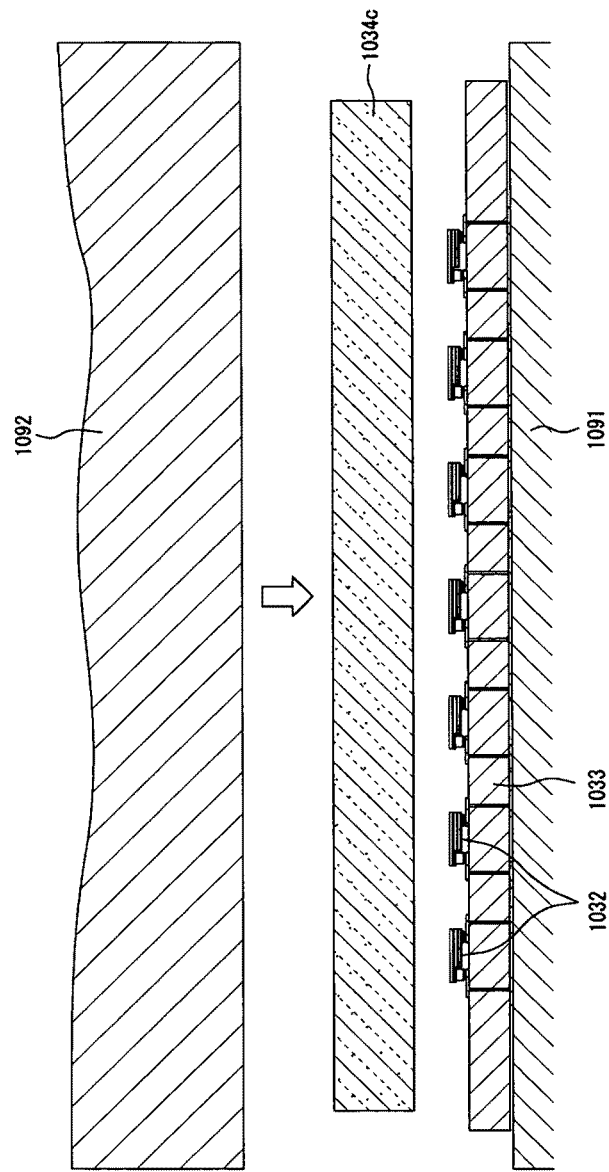
FIG. 24 is an explanatory view showing manufacturing process of the light source.
Figure 25:
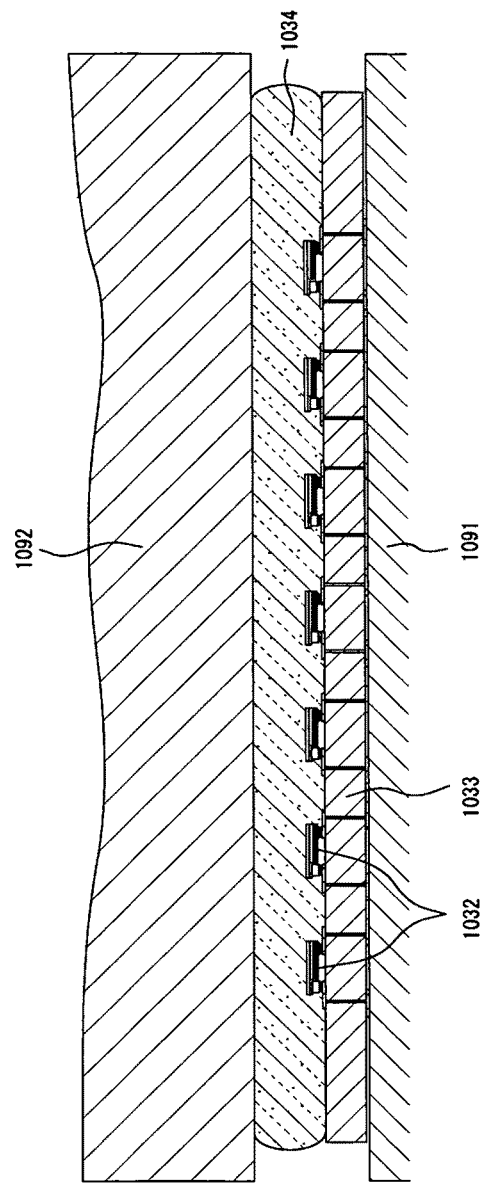
FIG. 25 is an explanatory view showing manufacturing process of the light source.

Then, as shown in FIG. 24, the element mounting substrate 1033 having the LED elements 1032 each mounted thereon is set on a lower die 1091, an upper die 1092 is arranged so as to face the mounting surface of the element mounting substrate 1033, and the pre-sealing glass 1034c is placed between the element mounting substrate 1033 and the upper die 1092 so as to cover the mounting region of each of the LED elements 1032. Subsequently, as shown in FIG. 25, the pressure is applied on the lower die 1091 and the upper die 1092 and a hot pressing process is performed in a nitrogen atmosphere on the glass material which is softened by heating. The processing conditions at this time can be optionally changed depending on temperature and pressure, etc., of the glass, for example, glass temperature of 600° C. and glass pressure of 25 kgf/cm$^2$.

Figure 26:
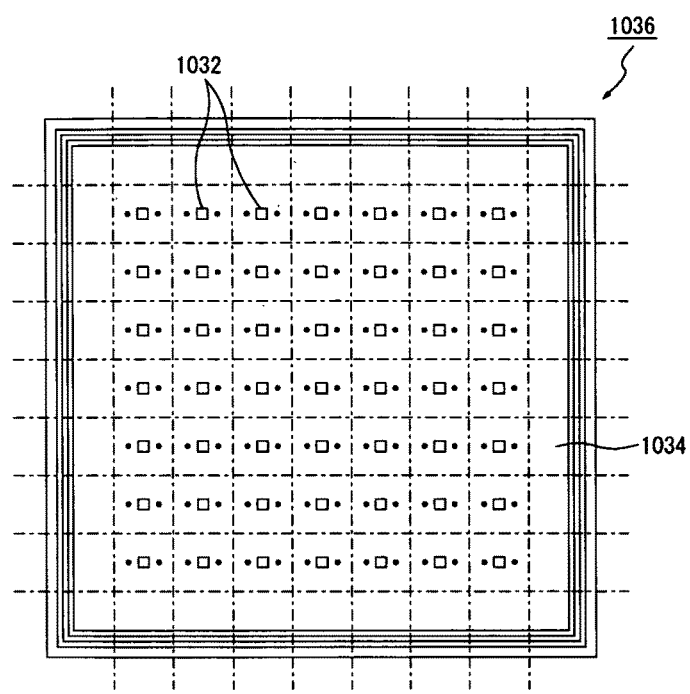
FIG. 26 is a plan view showing an intermediary body to which the light source is coupled.

An intermediary body 1036 shown in FIG. 26 in which plural the light source 1003 are coupled in longitudinal and lateral directions is made by the above-mentioned processes. After this, the element mounting substrate 1033 integrated with the glass sealing portion 1034 is placed on a dicing apparatus, dicing is performed by a dicing blade so as to divide the glass sealing portion 1034 and the element mounting substrate 1033 per each LED element 1032, thereby completing the light source 1003.

As shown in FIG. 21, the mounting substrate 1004 is made of aluminum as a base and is provided along the lower surface 1023 of the light guide plate 1002. In the present embodiment, the mounting substrate 1004 is provided so as to block each of the through-holes 1021. The mounting substrate 1004 has a substrate main body 1041 formed of aluminum, an insulation layer 1042 provided on the substrate main body 1041, a circuit pattern 1043 provided on the insulation layer 1042 and a white resist layer 1044 provided on the circuit pattern 1043.

This provides that heat generated by the light source 1003 is diffused into the entire substrate via the mounting substrate 1004, which prevents localization of heat and allows enhancement of heat dissipation to the outside. And in this case, the mounting substrate 1004 formed along the light guide plate 1002 can have a heat dissipation function while avoiding influence on the shape such as thickening, etc., which damages a design of the planar light-emitting device 1001. Meanwhile, as described in WO 2004/82036, light sources are localized if plural rows of cylindrical bore shaped or concave light incident portions are provided on a rear surface of the light guide plate in the vicinity of at least one side surface so as to be parallel thereto, and a problem arises in that the light guide plate is bent due to localization of heat when a sufficient heat dissipation countermeasure is not taken. In contrast, in the light-emitting device 1001 of the present embodiment, it is possible to suppress bending of the light guide plate 1002 caused by heat since the light sources 1003 are arranged in a dispersed manner, heat of each light source 1003 is diffused into the planar mounting substrate 1004 and it is possible to release the heat to the outside from a large area.

Meanwhile, the light source 1003 having a height of 0.85 mm is mounted on the mounting substrate 1004 via a solder 1031. Thus, the light source 1003 is arranged at a height of 0.85 mm from the bottom edge of the through-hole 1021 which has a vertical length of 3 mm. In other words, the edge of the light source 1003 on the element mounting substrate 1033 side (a back surface of the element mounting substrate 1033 in the present embodiment) and the lower surface 1023 of the light guide plate 1002 are located at the same height in a thickness direction of the light guide plate 1002. As a result, the surface of the glass sealing portion 1034 as a light-emitting face of the light source 1003 is located higher than the lower surface 1023 of the light guide plate 1002 by the thickness of the element mounting substrate 1033 and the solder 1031, hence, much of the light is directly incident on an inner surface 1024 of the through-hole 1021 even in the case of scattered radiation from the glass sealing portion 1034 of the light source 1003 including the phosphor 1039.

Meanwhile, all light incident into the light guide plate 1002 from the inner surface 1024 among the light traveling in the thickness direction of the light guide plate 1002 becomes propagation light in the light guide plate 1002 by satisfying the formula, $$90°-\sin^{-1}[\{\sin(90°-\alpha_1)\}/n_1]+\alpha_1 \geq \sin^{-1}(1/n_1) \quad (1)$$

where $\alpha_1$ is an angle of the inner surface 1024 of the through-hole 1021 with respect to the lower surface 1023 of the light guide plate 1002 and $n_1$ is the refractive index of the light guide plate 1002. In the present embodiment, the condition of the above-mentioned formula (1H) is satisfied since $\alpha_1$ is 90° and $n_1$ is 1.5.

Additionally, all light incident into the light guide plate 1002 from the inner surface 1024 among the light traveling along the inner surface 1024 of the light guide plate 1002 becomes propagation light in the light guide plate 1002 by satisfying the formula, $$\alpha_1 \leq 90°-2\times\sin^{-1}[\sin\{(90°-\alpha_1)/n_1\}] \quad (2).$$

In the present embodiment, the condition of the above-mentioned formula (2) is satisfied since $\alpha_1$ is 90° and $n_1$ is 1.5.

In addition, a solid angle $\beta_1$ of the inner surface 1024 of the through-hole 1021 with respect to the center of the upper surface 1034a of the light source 1003 is 90% (5.65 steradians) or more of $2\pi$ steradians in the upper hemisphere of the inner surface 1024 of the through-hole 1021. A ratio of the solid angle of the inner surface 1024 of the through-hole 1021 with respect to the center of the side surface 1034b (a ratio to $\pi$ steradian in the upper side of the hemisphere of the side surface) is larger than that of the upper surface 1034a, hence, a ratio of the solid angle of the whole light source 1003 is at least 90% or more. Meanwhile, a direction to maximize the light intensity of the light source 1003 is about 45° and the inner surface 1024 is present in this direction.

In the light-emitting device 1001 configured as mentioned above, since the angle $\alpha_1$ of the inner surface 1024 of the through-hole 1021 with respect to the lower surface 1023 of the light guide plate 1002 and the refractive index $n_1$ of the light guide plate 1002 are determined so as to satisfy the above-mentioned formulas (1) and (2), most of the light incident from the inner surface 1024 of the through-hole 1021 becomes propagation light. As a result, it is possible to obtain an effect contrary to the common technical knowledge, in which the light can be precisely incident on the light guide plate 1002 and become the propagation light thereof without using, in the light source 1003 or the light guide plate 1002, a particular optical controller for controlling the light emitted upwardly from the light source 1003 to orient in an in-plane direction of the light guide plate 1002 even though the optical axis of the light source 1003 is oriented in the thickness direction of the light guide plate 1002. Therefore, the number of components can be reduced by eliminating the optical controller and it is thereby possible to simply and easily manufacture the light-emitting device 1001. In addition, since at least 90% or more of the light emitted from the light source 1003 is incident on the inner surface 1024 of the light guide plate 1002, the light emitted from the light source 1003 can be used without loss.

As described above, white light can be emitted from the entire light guide plate 1002 by a very simple structure in which plural through-holes 1021 are regularly arranged in the light guide plate 1002 in two predetermined directions and the light source 1003 is placed in each through-hole 1021. At this time, uniform emission from the light guide plate 1002 can be realized by uniformly arranging the light sources 1003 on the entire light guide plate 1002. Therefore, it is possible to thin and downsize the light-emitting device 1001 while reducing the manufacturing cost.

In addition, since the through-hole 1021 is formed in a square shape having curved corners in a plan view and the light source 1003 also in a square shape is arranged inside the through-hole 1021, the amount of the incident light into the through-hole 1021 can be increased while downsizing the through-hole 1021 as compared to a circular through-hole. On the other hand, the present embodiment uses refraction at the time of incidence on the light guide plate 1002 but refracting light is emitted only in a direction of less than 45° with respect to a perpendicular of each incidence plane, thus, a direction in which light is not emitted emerges if the shape is a simple square. In contrast, the direction in which light is not emitted can be prevented from emerging by forming a square having curved corners. The direction in which light is not emitted may be prevented from emerging by chamfering the corners instead of forming a curve, however, it is possible to have smoother emission intensity distribution when a curve is formed. Furthermore, although the chromaticity is different between the light emitted from the upper surface 1034a and that emitted from the side surface 1034b of the glass sealing portion 1034, there is no variation in the chromaticity of the light emitted from the light guide plate 1002 since the light is mixed in the light guide plate 1002.

It should be noted that, although the ratio of the solid angle of the inner surface 1024 of the through-hole 1021 with respect to the center of the upper surface 1034a of the light source 1003 is not necessarily 90% or more of $2\pi$ steradians in the upper hemisphere, 70% or more is desirable for optical efficiency. Furthermore, it is desirable that the inner surface 1024 of the through-hole 1021 is present in a direction in which the light intensity of the light source 1003 is maximized.

Figure 27:
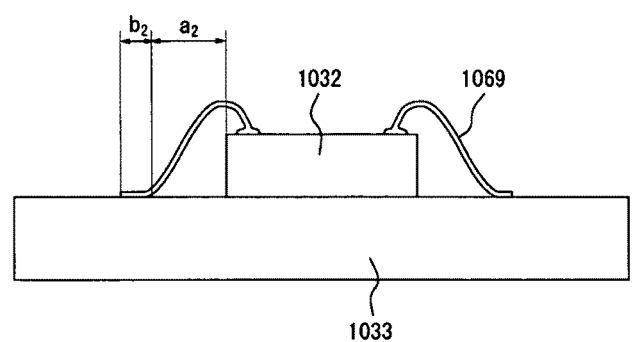
FIG. 27 is an explanatory view showing the case where an LED element of the light source is connected by e.g., wire bonding.

In addition, according to the present embodiment, since an optical surface for controlling an emission direction of the light source 1003 to be a lateral direction of LED element 1032 is eliminated and the LED element 1032 is mounted by flip-chip connection, it is possible to reduce a plan view size of the light source 1003, thereby reducing the diameter of the through-hole 1021. This makes the light source 1003 compact and hard to see even though the light sources 1003 are arranged not only at an end portion but also at the center portion of the planar light-emitting device 1001. In addition, it is possible to mount the light source 1003 having an optical axis in a thickness direction without increasing the thickness of the light guide plate 1002. For example, as shown in FIG. 27, when the LED element 1032 is mounted by wire bonding connection, a first distance $a_2$ for a wire loop and a second distance $b_2$ for connecting the element mounting substrate 1033 to a wire 1069 are additionally required to be provided around the LED element 1032. Since the first distance $a_2$ is, e.g., 0.3-0.5 mm and the second distance $b_2$ is, e.g., 0.2-0.5 mm, the element mounting substrate 1033 needs to be 3 times or more the LED element 1032, which is larger than 1.0 mm square of the above-mentioned embodiment, when the wire bonding is employed. To provide a tolerance for mounting or fitting, size of the through-hole 1021 in the light guide plate 1002 needs to be 5 times or more the LED element 1032. Furthermore, the element mounting substrate 1033 needs to be 10 times or more the LED element 1032 and the through-hole 1021 in the light guide plate 1002 needs to be 12 times or more when an optical surface for controlling an emission direction to be a lateral direction is provided.

When the element mounting substrate 1033 is, e.g., 2.5 mm square in size, the through-hole 1021 in the light guide plate 1002 needs to be increased to, e.g., 3 mm square. Then, if the light-emitting device 1001 in this size is manufactured, the ratio of the solid angle of the inner surface 1024 with reference to the center of the upper surface 1034a of the light source 1003 is reduced 35% even though the same LED element 1032 is mounted. In addition, if the light source 1003 is the same in height but is reduced in plan view size, light distribution in a horizontal direction relatively increases. In a case that a phosphor is dispersed in a sealing material, a difference in chromaticity between light in an upper direction and that in a horizontal direction is likely to be remarkable when a planar direction size of the sealing material is smaller than height thereof, however, the light can be mixed in the light guide plate 1002 even if the difference in chromaticity occurs.

In addition, since the present embodiment does not require optical processes of the upper surface 1034a and the side surface 1034b of the light source 1003, the light source 1003 is simply and easily manufactured. For this light-emitting device 1001, the light source 1003 having light distribution in which the maximum light intensity does not exist on the optical axis is more preferable, and it is very advantageous for practical use since a cubic light source 1003 is not processed and it is only necessary to form a simple through-hole 1021.

Although the light source 1003 in which the LED element 1032 is sealed with glass has been described in the above-mentioned embodiment, the sealing material can be changed as long as the LED element 1032 is flip-chip connected to the element mounting substrate 1033 and the light source 1003 does not have a frame portion of the sealing material in a plan view.

Figure 28:
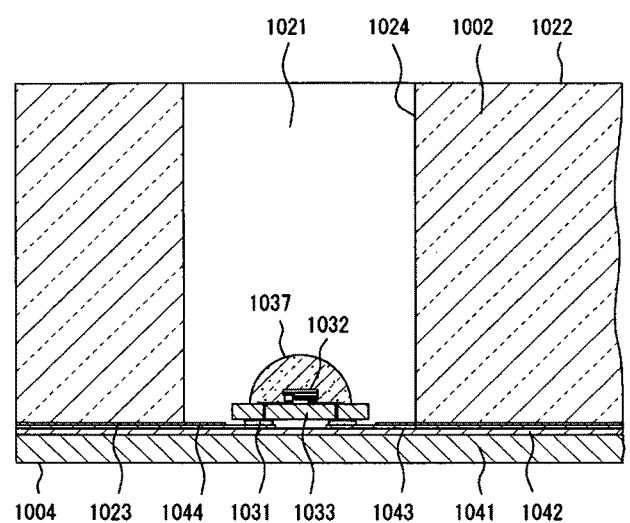
FIG. 28 is a partial cross sectional view showing a light-emitting device in a modification.

In a thermal fusion glass sealed LED, formation in a height direction is easy, a thermal expansion coefficient is equivalent to that of the element mounting substrate and a bonded area between the sealing material and the element mounting substrate can be reduced due to a strong bonding force of the both members. In addition, it is desirable, since it is formed in a rectangular parallelepiped shape including a side emitting surface, and the light distribution in a horizontal direction can be increased by increasing the total area of the side surfaces twice, preferably 4 times, the upper surface. Alternatively, the LED element 1032 may be sealed with a resin sealing portion 1037 such as, e.g., a silicon resin or an epoxy resin, etc., as shown in FIG. 28. In the light source 1003 of FIG. 28, the resin sealing portion 1037 is formed in a hemispherical shape on the element mounting substrate 1033.

Figure 29:
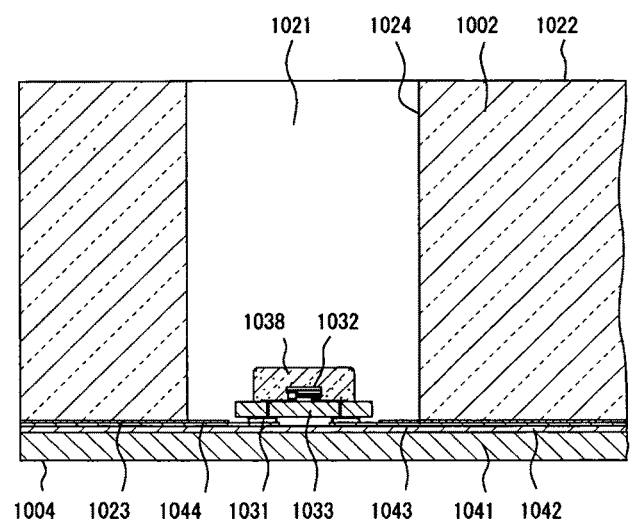
FIG. 29 is a partial cross sectional view showing a light-emitting device in a modification.

Alternatively, the LED element 1032 may be sealed with, e.g., an inorganic paste 1038 with a predetermined thickness as shown in FIG. 29. The inorganic paste 1038 can be formed of, e.g., a $SiO_2$—, $Al_2O_3$— or $TiO_2$-based material, etc.

In addition, although the glass sealing portion 1034 having the phosphor 1039 dispersed therein has been described in the above-mentioned embodiment, for example, the phosphor 1039a may be applied to the surface of the glass sealing portion 1034, as shown in FIG. 30. In FIG. 30, a layer of the phosphor 1039a is applied only to the upper surface 1034a of the glass sealing portion 1034. In this light source 1003, although the difference in chromaticity occurs between the light emitted upwardly and the light emitted horizontally, there is no problem since the light is mixed in the light guide plate 1002. In addition, it is possible to omit a phosphor dispersion and manufacturing process and to eliminate influence on a yield of a glass material in this process, thereby reducing the manufacturing cost.

In addition, it is not limited to the light sources 1003 arranged in a lattice point pattern on the planar light-emitting device 1001, and the light sources 1003 may be arranged at the middle either densely or sparsely. The light-emitting device 1001 can have characteristics such that the light source is particularly compact, the light is propagated in a 360-degree direction on the surface of the light guide plate 1002 by using refraction of the light guide plate and the light source is hard to see. The characteristics, in which the light source is hard to see even if the light sources are arranged only at a periphery of the light guide plate, are also possible.

Figure 31A:
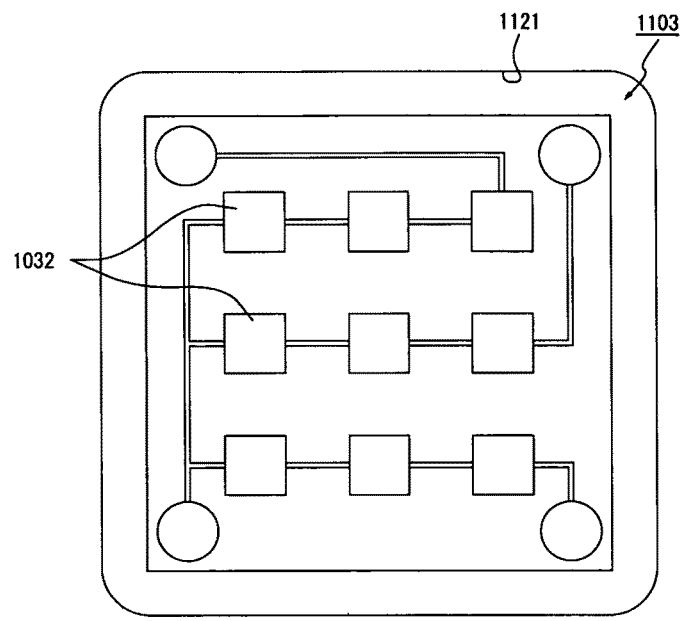
Figure 31B:
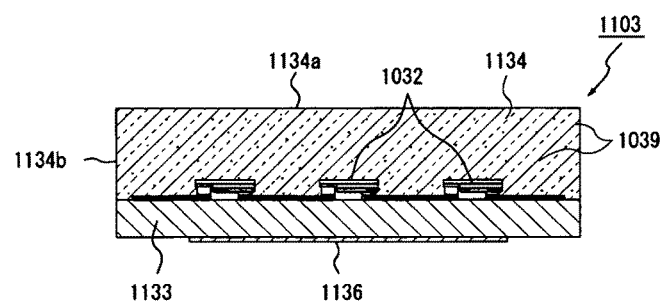

In addition, although the light source 1003 having one LED element 1032 has been described in the above-mentioned embodiment, the light source may have, of course, plural light-emitting elements. For example, the light source can be a light source 1103 in which plural LED elements 1032 are arranged in longitudinal and lateral directions on a square element mounting substrate 1133, as shown in FIG. 31A. It is desirable, also in this case, that a through-hole 1121 is formed in a square shape and the light source 1103 is arranged at the center of the through-hole 1121. A 2.6 mm square light source 1103 and a 3.1 mm square through-hole 1121 are formed in FIG. 31A. In other words, the length of the one side of the through-hole 1121 is shorter than the diagonal length of the light source 1103. Corners of the through-hole 1121 are rounded so that a radius of curvature is 0.25 mm. As shown in FIG. 31B, the element mounting substrate 1133 of the light source 1103 has a heat radiation pattern 1136 at the middle of the back side.

The light source 1103 provided with the heat radiation pattern 1136 is mounted on the metal-based mounting substrate 1004 such as shown in FIG. 21. By omitting the insulation layer 1042 at a position corresponding to the heat radiation pattern 1136 and metallically bonding the heat radiation pattern 1136 to the metallic substrate main body 1041 directly or via a eutectic material, etc., thermal resistance at the bonded portion is reduced to easily transmit heat to the entire mounting substrate 1004 and it is thereby possible to significantly improve heat dissipation efficiency. In addition, a glass sealing portion 1134 of the light source 1103 also has an upper surface 1134a parallel to the element mounting substrate 1133 and a side surface 1134b extending downwardly from an outer edge of the upper surface 1134a and being vertical to the element mounting substrate 1133.

Figure 32A:
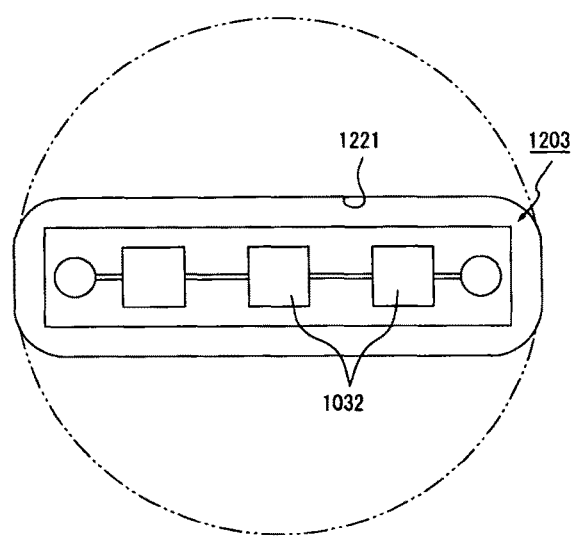
Figure 32B:
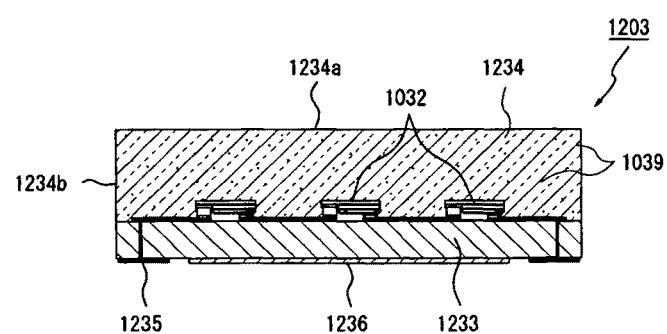

Alternatively, the light source can be, e.g., a light source 1203 in which plural LED elements 1032 arranged in a row are mounted on a rectangular element mounting substrate 1233, as shown in FIG. 32A. In this case, it is desirable that a through-hole 1221 is formed in a rectangular shape substantially similar to the shape of the light source 1203 and the light source 1203 is arranged at the center of the through-hole 1221. As a result, the dimension of the through-hole 1221 can be significantly reduced as compared to a circular hole indicated by a two-dot chain line in FIG. 32A. As shown in FIG. 32B, the element mounting substrate 1233 of the light source 1203 has a heat radiation pattern 1236 at the middle of the back side, and a circuit pattern 1235 is arranged on the back side of the element mounting substrate 1233 around the heat radiation pattern 1236. In addition, a glass sealing portion 1234 of the light source 1203 also has an upper surface 1234a parallel to the element mounting substrate 1233 and a side surface 1234b extending downwardly from an outer edge of the upper surface 1234a and being vertical to the element mounting substrate 1233. Alternatively, the through-hole 1221 can be composed of, e.g., semicircular portions formed on both edges and linear portions linearly extending between the semicircular portions. As a result, a plan view area of the through-hole 1221 can be significantly reduced as compared to a circular hole of which diameter is equal to the diagonal length of the light source.

Here, an angle $\alpha_1$ of an inner surface of a through-hole with respect to another surface of a light guide plate will be described in detail in reference to FIGS. 33A and 33B.

Figure 33A:
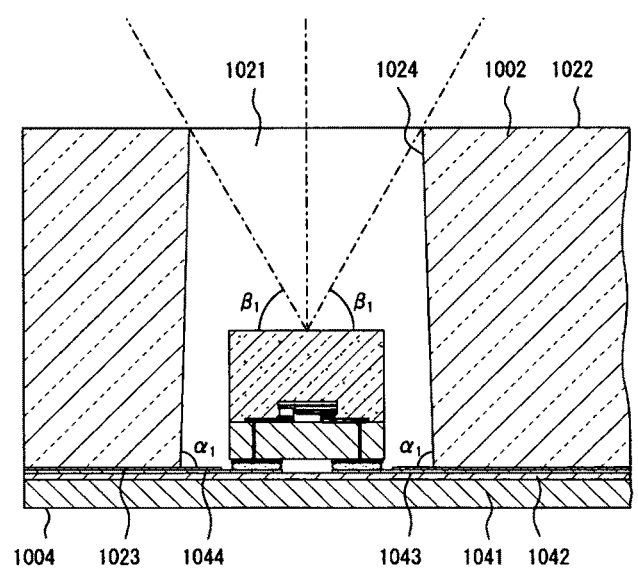
FIG. 33A is a partial cross sectional view showing a light-emitting device in a modification.

When the light guide plate 1002 is formed by injection molding, a slight taper (inclination) may be preferably formed in the through-hole 1021, as shown in FIG. 33A. Here, FIG. 33B shows how many degrees the inner surface 1024 should be smaller than 90° to satisfy the propagation condition of the above-mentioned formulas (1) and (2) for each refractive index $n_1$ of the light guide plate 1002. As shown in FIG. 33B, 2.8° or less satisfies both of the formulas (1) and (2) at $n_1$ of 1.45 or less. At $n_1$ of 1.50 or less, the propagation condition of the formula (1) is satisfied by 6.7° or less and that of the formula (2) is satisfied by 6.4° or less. At $n_1$ of 1.55 or less, the propagation condition of the formula (1) is satisfied by 10.4° or less and that of the formula (2) is satisfied by 9.6° or less. In addition, at $n_1$ of 1.60 or less, the propagation condition of the formula (1) is satisfied by 13.9° or less and that of the formula (2) is satisfied by 12.6° or less. Furthermore, at $n_1$ of 1.65 or less, the propagation condition of the formula (1) is satisfied by 17.3° or less and that of the formula (2) is satisfied by 15.4° or less. In this regard, however, it is desirable that the inner surface 1024 is basically a vertical surface but an inclined angle can be less than 5°, taking into consideration that surface flatness of the light guide plate 1002 and the refractive index therein are not exactly constant.

Figure 34:
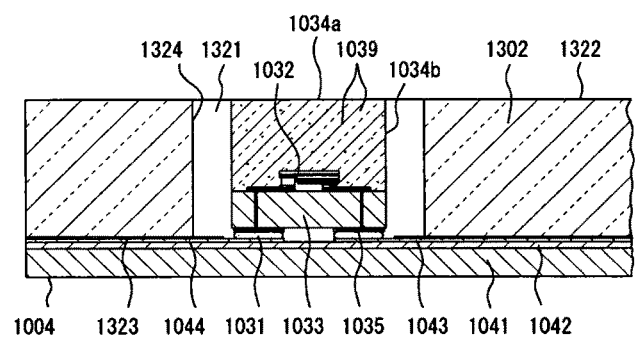
FIG. 34 is a partial cross sectional view showing a light-emitting device in a modification.

Alternatively, the upper surface 1034a of the light source 1003 may be at the same level as an upper surface 1322 of a light guide plate 1302 as, for example, shown in FIG. 34. In this case, the light guide plate 1302 can be thinned and it is possible to add an accent to the design of the light source 1003 by increasing the amount of the light which outwardly emitted directly from a through-hole 1321.

Figure 35:
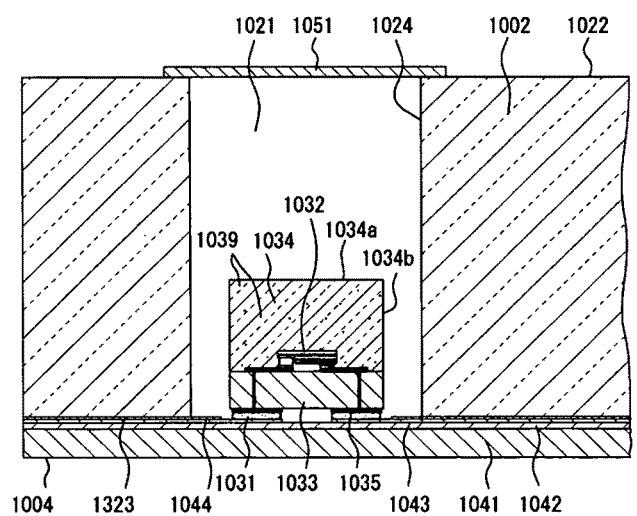
FIG. 35 is a partial cross sectional view showing a light-emitting device in a modification.

In addition, although the through-hole 1021 of which upper portion is open has been described in the above-mentioned embodiment, a member for blocking the upper portion of the through-hole 1021 may be provided so that secondary light due to reflection also becomes the propagation light of the light guide plate 1002. For example, as shown in FIG. 35, light traveling upwardly from the through-hole 1021 can be incident on the inner surface 1024 of the light guide plate 1002 by blocking the upper portion of the through-hole 1021 with a reflecting plate 1051. The reflecting plate 1051 is provided on the upper surface 1022 of the light guide plate 1002 only at a portion corresponding to the through-hole 1021. When a material having a relatively high surface reflectance, e.g., aluminum, is used for the reflecting surface of the reflecting plate 1051, it is possible to efficiently use specular reflection. When the reflecting surface is aluminum, for example, the reflecting plate 1051 itself is an aluminum plate or an aluminum foil is stuck on the reflecting surface of the reflecting plate 1051. In this case, it is possible to block direct light from the light source 1003 to the outside, thereby effective to prevent emission of direct light.

Figure 36:
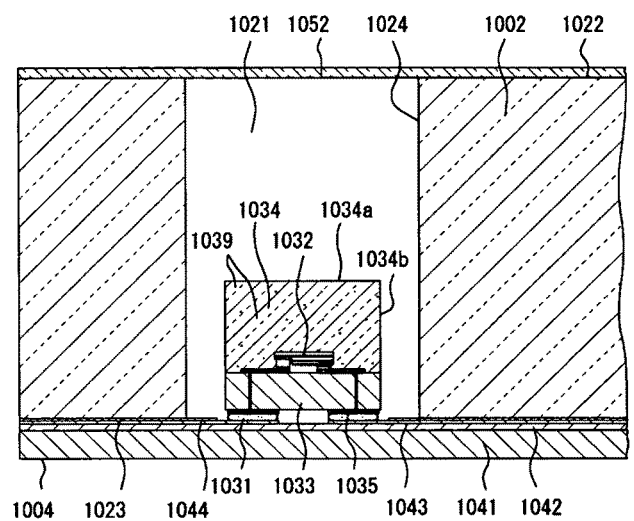
FIG. 36 is a partial cross sectional view showing a light-emitting device in a modification.

Alternatively, a reflecting plate 1052 may be formed on the entire upper surface 1022 of the light guide plate 1002 as, for example, shown in FIG. 36. The reflecting plate 1052 is, e.g., to mainly use diffuse reflection. In this case, a white diffusion sheet can be used for the inner surface of the reflecting plate 1052. In the above-mentioned embodiment, it is preferable to use diffuse reflection rather than specular reflection since the incident angle of the light incident on the reflecting plate 1052 is relatively small.

Moreover, for example, light may be partially transmitted through a reflecting plate. As a result, only the amount of light required for external emission is extracted to the outside and the rest of the light is incident on the light guide plate 1002.

Meanwhile, it is not limited to the aluminum-based mounting substrate 1004, and another metal such as magnesium or copper may be used as a base. In addition, it is not limited to the mounting substrate having an insulation layer provided on the above-mentioned metal and a circuit pattern formed thereon, and a flexible substrate having a circuit pattern formed on polyimide or liquid crystal polymer may be provided on a metal plate.

Fourth Embodiment

Figure 37A:
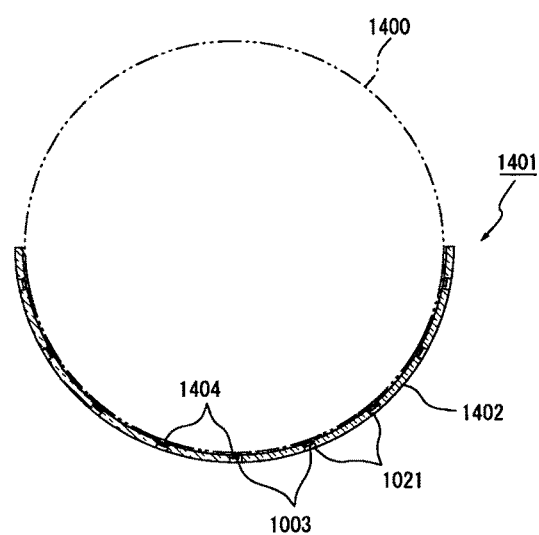
Figure 37B:
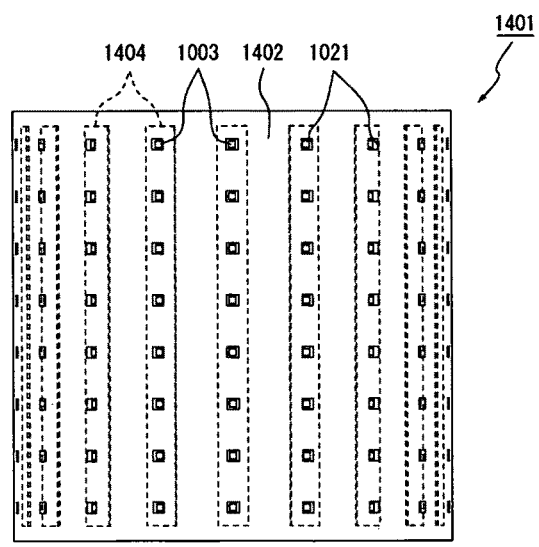

FIG. 37 show the fourth embodiment of the invention, wherein FIG. 37A is a cross sectional view of a light-emitting device and FIG. 37B is a front view thereof.

As shown in FIG. 37A, a light-emitting device 1401 is provided with a light guide plate 1402 formed in a curved shape, plural through-holes 1021 formed in the light guide plate 1402, a light source 1003 housed in the through-hole 1021 and a mounting substrate 1404 electrically connected to the light source 1003. In the present embodiment, the light guide plate 1402 is formed having an entirely constant thickness and a semicircular cross section. The thickness of the light guide plate 1402 and the size of the through-hole 1021, etc., are the same as the third embodiment.

The through-hole 1021 is formed parallel to a thickness direction of the light guide plate 1402, and is perpendicular to inner and outer surfaces of the light guide plate 1402. The light sources 1003 is arranged in the light guide plate 1402 on the inner surface side in the present embodiment. The inner surface of the through-hole 1021 is not necessarily completely vertical to the inner surface of the light guide plate 1402 in the present embodiment, neither, as long as the angle $\alpha_1$ formed therebetween satisfies the above-mentioned formula (1). In addition, it is further preferable if the angle $\alpha_1$ satisfies the above-mentioned formula (2).

As shown in FIG. 37B, plural through-holes 1021 are formed at equal intervals in vertical and circumferential directions. Meanwhile, the mounting substrate 1404 for the light source 1003 extends in a vertical direction and plural mounting substrates 1404 are arranged in parallel in a circumferential direction. This prevents the mounting substrate 1404 from being excessively bent along the curved light guide plate 1402.

The light-emitting device 1401 configured as mentioned above is arranged on a columnar portion 1400 having a circular cross section as shown in FIG. 37A. Therefore, in addition to the effect of the above-mentioned embodiment, the light-emitting device 1401 can be used for lighting up an advertisement, etc., placed on the columnar portion 1400, which is highly advantageous for practical use. Especially in this case, it is desirable that the above-mentioned formulas (1) and (2) are relatively easily satisfied, such as a vertical hole at a refractive index of 1.45 or more or an inclined angle of 4° or less at a refractive index of 1.50 or more, and a curvature effect due to the semicircular shape of the light guide plate 1002 does not occurs.

Fifth Embodiment

Figure 38A:
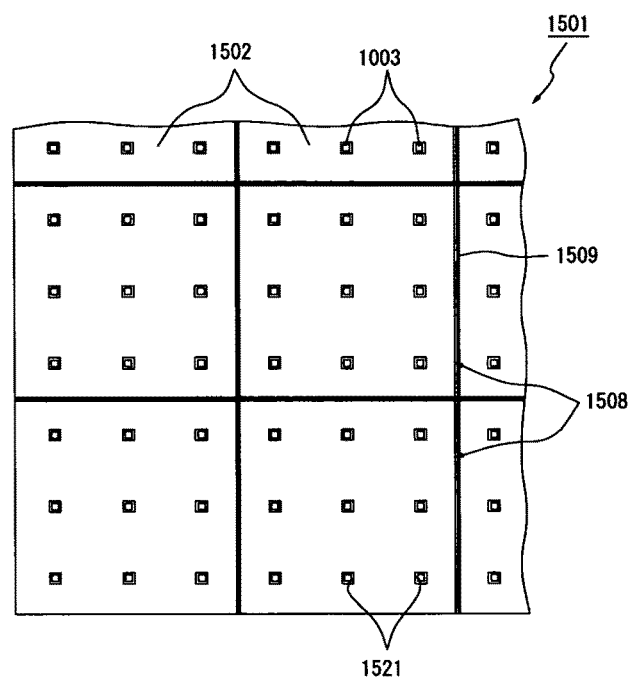
Figure 38B:
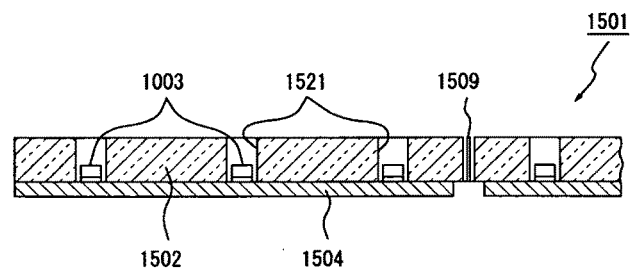

FIG. 38 show the fifth embodiment of the invention, wherein FIG. 38A is a plan view of a light-emitting device and FIG. 38B is a cross sectional view thereof.

As shown in FIG. 38A, a light-emitting device 1501 is composed of plural light-emitting units 1508. Each light-emitting unit 1508 has the same configuration as the light-emitting device 1001 of the third embodiment, and is provided with a light guide plate 1502, a through-hole 1521, a light source 1003 and a mounting substrate 1504. In the present embodiment, each light-emitting unit 1508 is formed in a square shape and has plural light sources 1003 which are arranged in longitudinal and lateral directions.

As shown in FIG. 38B, the light-emitting units 1508 are arranged at intervals and an air layer is formed in each gap between end faces of the light guide plates 1502 of the light-emitting units 1508. A white reflecting plate 1509 is arranged in the air layer in order to uniform in-plane brightness of the light guide plate 1502 of every light-emitting unit 1508. Longitudinal and lateral distances between the individual light sources 1003 are set to be the same for the case of crossing over the air layer and the white reflecting plate 1509 and for the case of not crossing over.

The light-emitting device 1501 configured as mentioned above is capable of individually controlling on/off of emission and light intensity of the light-emitting units 1508. In addition, it is possible to suppress an increase in the amount of light near the end face of the light guide plate 1502 by providing the white reflecting plate 1509 in the air layer without providing a white reflective coating directly on the end face of the light guide plate 1502. In other words, when white paint is applied directly to the end face of the light guide plate 1502, diffuse reflection occurs thereon. As a result, the light is outwardly emitted from the light guide plate 1502, thereby increasing brightness in the vicinity of the end portion of the light guide plate 1502. On the other hand, when the air layer is present between the end face of the light guide plate 1502 and the white reflecting plate 1509, the light which is diffusely reflected by the white reflecting plate 1509 is refracted at an angle to become propagation light of the light guide plate 1502 when incident thereon again, and thus, it is possible to prevent high brightness in the vicinity of the end face of the light guide plate 1502. In this regard, this is not limited to the case of plural light-emitting units 1508 and is the same for a single light-emitting device 1001, etc.

In addition, the white reflecting plate 1509 prevents light from reaching the adjacent light-emitting units 1508 and is thus effective for independent lighting of each light-emitting unit 1508. Alternatively, the white reflecting plate 1509 may be provided only at an end portion of a group composed of plural light-emitting units 1508 instead of providing in all gaps between the light-emitting units 1508. In this case, since the light is transmitted to the light guide plate 1502 of the adjacent light-emitting unit 1508 in the group, the overall brightness of the light-emitting units 1508 in the group can be uniform.

Although the LED element 1032 having the p-side electrode 1065 formed of ITO has been described above-mentioned embodiment, the p-side electrode 1065 may be made of an Ag alloy. In this case, it is possible to reduce light leakage into the element mounting substrate 1033, thereby increasing light extraction efficiency of the light source 1003.

Furthermore, the p-side electrode 1065 of the LED element 1032 can be composed of a contact electrode formed of ITO and a surface reflective layer formed of Al. In this case, it is also possible to reduce light leakage into the element mounting substrate 1033, thereby increasing light extraction efficiency of the light source 1003.

Still further, although the supporting substrate 1060 formed of sapphire has been described, an electrical current may be diffused by using, e.g., a conductive substrate such as SiC or GaN. In addition, it is possible to improve the light extraction efficiency from the LED element 1032 by combining the supporting substrate 1060 having the same refractive index as the MQW layer 1063 with glass having a refractive index of 1.7 or more.

In addition, although any process is not performed on both surfaces of the light guide plate in each of the above-mentioned embodiments, optional processes may be, of course, performed, if necessary, and for example, a reflection process may be performed on at least one surface of the light guide plate.

In addition, although a light-emitting device using an LED element as a light-emitting element has been described in the above-mentioned embodiment, the light-emitting element is not limited to the LED element and other specific detailed structure, etc., can be, of course, appropriately changed.

Sixth Embodiment

Figure 39:
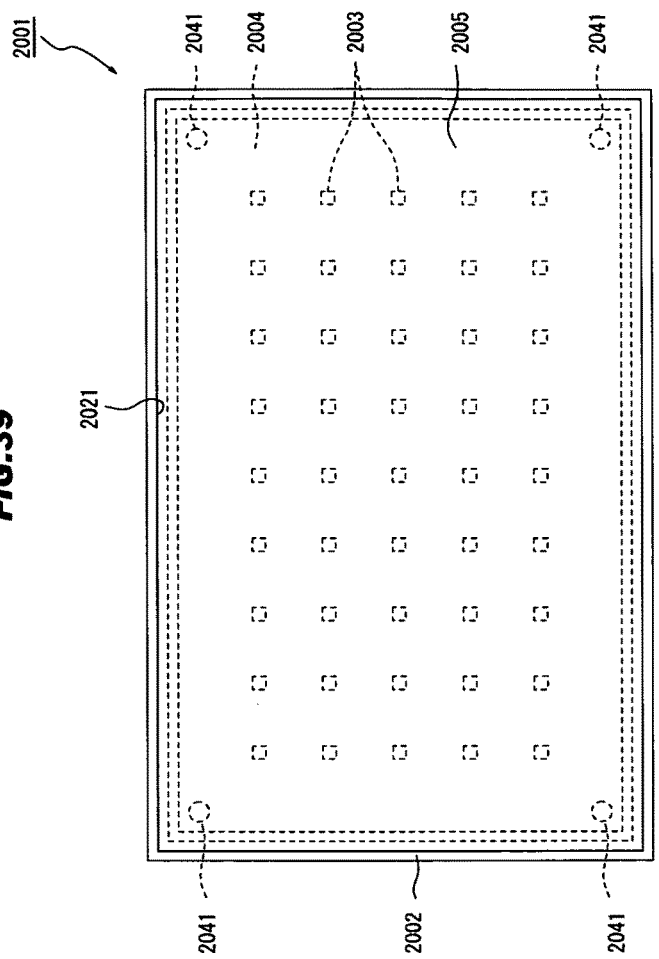
FIG. 39 is a plan view showing a light-emitting device in a sixth embodiment of the invention.
Figure 40:
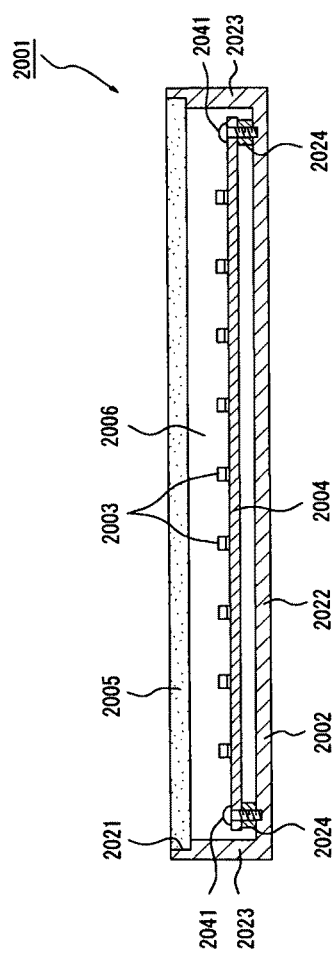
FIG. 40 is a cross sectional view showing the light-emitting device.

FIGS. 39 to 43 show the sixth embodiment of the invention, wherein FIG. 39 is a plan view of a light-emitting device and FIG. 40 is a cross sectional view thereof.

As shown in FIG. 39, a light-emitting device 2001 is provided with a frame 2002 in a rectangular shape in a plan view which has an opening 2021 on the upper side, and plural light sources 2003 arranged in the frame 2002. The light sources 2003 are each mounted on a plate-like mounting substrate 2004 which is fixed to the frame 2002 by screws 2041 at four corners. In addition, the light-emitting device 2001 has a diffuser plate 2005 which is provided on the opening 2021 of the frame 2002, and the light sources 2003 are hidden by the diffuser plate 2005. The light sources 2003 are arranged in a lattice point pattern on the mounting substrate 2004 at equal intervals in longitudinal and lateral directions.

As shown in FIG. 40, the frame 2002 has a bottom portion 2022 and a side wall 2023, and female screw portions 2024 which are joined together with the screws 2041 are provided on the bottom portion 2022. The female screw portions 2024 are provided so as to protrude upwardly from the bottom portion 2022 and the mounting substrate 2004 is placed on the female screw portions 2024, hence, the mounting substrate 2004 is arranged at a distance from the bottom portion 2022. As a result, heat of the mounting substrate 2004 is not transmitted directly to the bottom portion 2022.

The mounting substrate 2004 is formed of aluminum as a base, and is provided parallel to the bottom portion 2022 of the frame 2002. The mounting substrate 2004 is arranged at a distance from each of the side walls 2023 in the present embodiment. The mounting substrate 2004 can be configured to have, e.g., a substrate main body formed of aluminum, an insulation layer provided on the substrate main body, a circuit pattern provided on the insulation layer and a white resist layer provided on the circuit pattern. This configuration allows heat generated by the light source 2003 to be diffused into the entire substrate via the mounting substrate 2004, and it is thus possible to prevent localization of heat.

The diffuser plate 2005 is provided at a distance from the light source 2003 and the mounting substrate 2004, and a light mixing space 2006 for mixing light emitted from each of the light sources 2003 is formed between the diffuser plate 2005 and the mounting substrate 2004. Since the diffuser plate 2005 diffuses the light emitted from each of the light sources 2003, the light is also mixed in the diffuser plate 2005.

Figure 41:
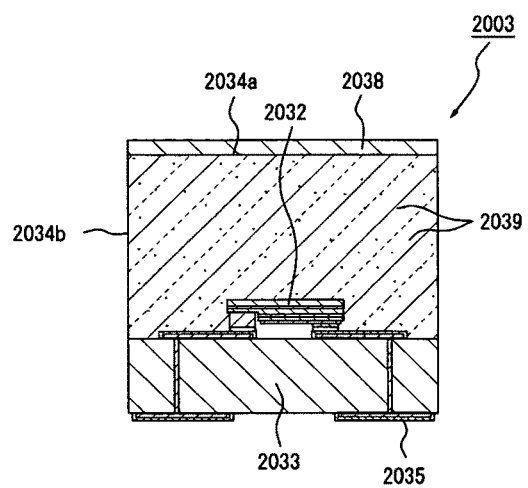
FIG. 41 is a cross sectional view showing the light source.

FIG. 41 is a cross sectional view showing the light source.

As shown in FIG. 41, the light source 2003 has a flip-chip-type LED element 2032 formed of a GaN-based semiconductor material, an element mounting substrate 2033 for mounting the LED element 2032, and a glass sealing portion 2034 as an inorganic sealing portion which seals the LED element 2032 and is adhered to the element mounting substrate 2033. In addition, a circuit pattern 2035 for electrically connecting the LED element 2032 to the mounting substrate 2004 is formed on the element mounting substrate 2033. The circuit pattern 2035 has a front surface pattern formed on the front surface of the element mounting substrate 2033, a rear surface pattern formed on the rear surface of the element mounting substrate 2033, and a via pattern for connecting the front surface pattern to the rear surface pattern.

The element mounting substrate 2033 is formed of a polycrystalline sintered material of alumina ($Al_2O_3$), and is formed 250 µm thick in 1000 µm square. Meanwhile, the LED element 2032 is formed 100 µm thick in 346 µm square. In other words, a distance from a side edge of the LED element 2032 to a side surface 2034b of the glass sealing portion 2034 is 327 µm and a distance from an upper edge of the LED element 2032 to an upper surface 2034a of the glass sealing portion 2034 is 500 µm.

The glass sealing portion 2034 covers the LED element 2032 as well as the element mounting substrate 2033 on the side mounting the LED element 2032, and has a thickness of 0.6 mm. The glass sealing portion 2034 has the upper surface 2034a parallel to the element mounting substrate 2033 and the side surface 2034b extending downwardly from an outer edge of the upper surface 2034a and being vertical to the element mounting substrate 2033. The glass sealing portion 2034 can be formed of, e.g., $ZnO$—$B_2O_3$—$SiO_2$-based glass and the refractive index in this case is 1.7. In addition, this glass is thermal fusion glass fused to the element mounting substrate 2033 by heating and is different from glass formed by a sol-gel reaction. However, the composition and refractive index of the glass are not limited thereto.

Meanwhile, the glass sealing portion 2034 includes a phosphor 2039 which converts a wavelength of the light emitted from the LED element 2032. As the phosphor 2039, it is possible to use, e.g., YAG (Yttrium Aluminum Garnet) phosphor and silicate phosphor, etc., and white light is obtained by a blue LED element 2032 and a yellow phosphor 2039 in the present embodiment. Alternatively, the white light may be obtained by combining an LED element emitting blue light with a green phosphor or a red phosphor.

Meanwhile, a 0.1 mm thick reflective layer 2038 is formed on the upper surface 2034a of the glass sealing portion 2034. The reflective layer 2038 only needs to reflect at least a portion of the light emitted from the light source 2003, and may be either completely non-transmissive or semi-transmissive. In the present embodiment, the reflective layer 2038 is formed of an inorganic material which is the same material as the element mounting substrate 2033. In detail, the reflective layer 2038 is formed of a polycrystalline sintered material of alumina ($Al_2O_3$). That is, the reflective layer 2038 is semi-transmissive, by which light is partially reflected and partially transmitted.

In the light source 2003, blue light is emitted from the LED element 2032 when voltage is applied thereto. The blue light emitted from the LED element 2032 is partially converted into yellow by the phosphor 2039, and is subsequently outwardly emitted. An optical axis of the light source 2003 is perpendicular to the element mounting substrate 2033 and passes through the center of the upper surface 2034a. This light source 2003 has light distribution characteristics in which the light intensity is maximized not on the optical axis but in a direction inclined at about 30°-45° to the optical axis even if the reflective layer 2038 is not formed.

In addition to this, since the reflective layer 2038 is formed on the upper surface 2034a of the glass sealing portion 2034, a portion of the light incident on the upper surface 2034a is reflected toward the inside of the glass sealing portion 2034. Meanwhile, a portion of the light is transmitted through the reflective layer 2038 and is outwardly emitted from the upper surface of the reflective layer 2038 since the reflective layer 2038 is semi-transmissive. As a result, the amount of light emitted upwardly from the light source 2003 is reduced and the amount of horizontally emitted light increases. The light source 2003 in the present embodiment has light distribution characteristics in which the light intensity is maximized in a direction inclined at about 45°-90° to the optical axis. By providing the reflective layer 2038 as described above, it is possible to horizontally spread the light distribution characteristics and to decrease the amount of light emitted from the upper portion. This light source 2003 is manufactured through the following processes.

Firstly, oxide powder as a glass component and phosphor powder are heated to 1200° C. and are stirred in a molten state. Then, after the glass is solidified, a pre-sealing glass 2034c is sliced so as to correspond to a thickness of the glass sealing portion 2034 and is processed into a plate shape.

Meanwhile, a circuit pattern is formed on the plate-like element mounting substrate 2033. For example, metal paste is screen printed, the element mounting substrate 2033 is heat-treated at a predetermined temperature (e.g., 1000° C. or more) to bake the metal thereon and other metal is plated on the aforementioned metal, thereby forming the circuit pattern 2035. Subsequently, plural LED elements 2032 are mounted by flip-chip connection on the element mounting substrate 2033 at equal intervals longitudinally and laterally. The circuit pattern of the element mounting substrate 2033 may be formed by heat treatment of the metal paste only or can be formed by other methods such as metal sputtering followed by metal plating.

Figure 42:
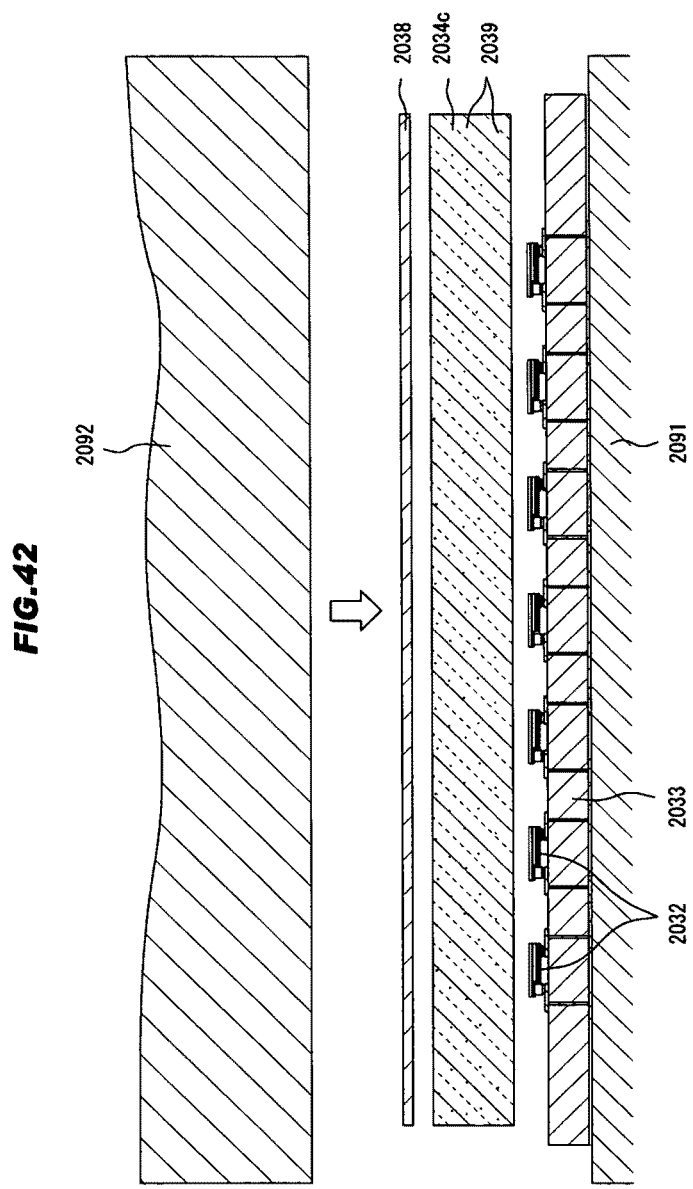
FIG. 42 is an explanatory view showing manufacturing process of the light source.

Then, as shown in FIG. 42, the element mounting substrate 2033 having the LED elements 2032 each mounted thereon is set on a lower die 2091 and an upper die 2092 is arranged so as to face the mounting surface of the element mounting substrate 2033. Subsequently, the pre-sealing glass 2034c is placed between the element mounting substrate 2033 and the upper die 2092 so as to cover the mounting region of each of the LED element 2032 and an alumina plate material as the reflective layer 2038 is placed on the pre-sealing glass 2034c.

Figure 43:
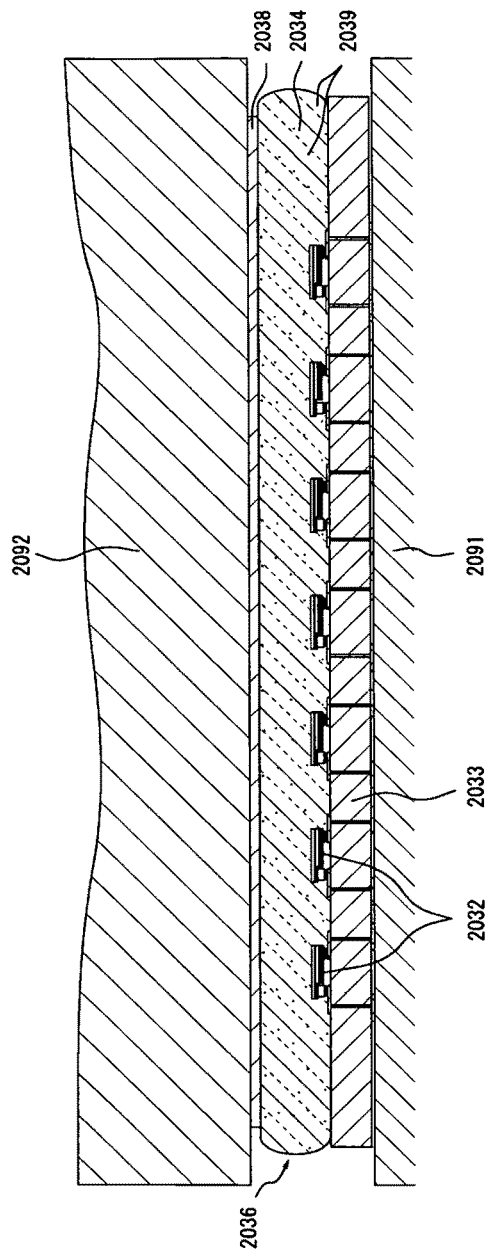
FIG. 43 is an explanatory view showing manufacturing process of the light source.

After this, as shown in FIG. 43, the pressure is applied to the lower die 2091 and the upper die 2092 and a hot pressing process is performed in a nitrogen atmosphere on the glass material which is softened by heating. The pre-sealing glass 2034c can be softened by heat and bonded to the element mounting substrate 2033 as well as to the reflective layer 2038 by the hot pressing process. As described above, a sealing process for making an intermediary body 2036 by collectively sealing plural LED elements 2032 with a glass material on the element mounting substrate 2033 formed of an inorganic material and mounting the LED elements 2032 and a reflective layer forming process for forming the reflective layer 2038 on an upper surface of the glass material of the intermediary body 2036 are simultaneously performed. In this regard, it is not necessary to simultaneously perform the sealing process and the reflective layer forming process, and for example, when the material of the element mounting substrate 2033 is different from that of the reflective layer 2038 or a state of bonding to glass is different, etc., the intermediary body 2036 can be formed in advance under a first condition, followed by formation of the reflective layer 2038 under a second hot pressing condition. The processing conditions at this time can be optionally changed depending on temperature and pressure, etc., of the glass, and for example, sol-gel glass including an oxide, etc., to be a reflective material dispersed therein is used, the first condition is glass temperature of 150° C. without pressure and the second hot pressing condition is glass temperature of 600° C. and glass pressure of 25 kgf/cm$^2$.

The intermediary body 2036 in which plural light-emitting devices 2001 are coupled in longitudinal and lateral directions and the reflective layer 2038 on the intermediary body 2036 are formed by the above-mentioned processes. After this, the element mounting substrate 2033 integrated with the glass sealing portion 2034 is placed on a dicing apparatus, and dicing is performed by a dicing blade so as to divide the glass sealing portion 2034 and the element mounting substrate 2033 per each LED element 2032. In other words, a dividing process, in which the intermediary body 2036 having the reflective layer 2038 formed thereon is divided in a thickness direction of the element mounting substrate 2033 to expose the side surface 2034b of the glass material while the upper surface 2034a of the glass material remains to be covered, is performed and the light source 2003 is completed.

In the light-emitting device 2001 configured as mentioned above, since the light distribution characteristics of the light source 2003 is horizontally large and the amount of the light emitted from the upper portion of the light source 2003 is small, unevenness in brightness of the light emitted from the diffuser plate 2005 does not occur even though a distance between the diffuser plate 2005 and the light source 2003 is reduced, and it is thereby possible to realize uniform surface emission.

In addition, since the intermediary body 2036 is divided by dicing after the reflective layer 2038 is formed on the upper surface of the intermediary body 2036, the reflective layer 2038 of each of the light sources 2003 can be formed together and productivity of the light source 2003 is not lost. Still further, since the reflective layer 2038 is bonded to the glass sealing portion 2034 by hot pressing process, the reflective layer 2038 can have relatively high bond strength. Furthermore, it is possible to adjust the light distribution characteristics as well as the brightness of the upper portion of the light source 2003 by changing a material or thickness, etc., of the reflective layer 2038, hence, it is easy to adjust the light distribution characteristics and the brightness.

Seventh Embodiment

FIGS. 44 and 45 show the seventh embodiment of the invention, wherein FIG. 44A is a plan view of a light-emitting device and FIG. 44B is a cross sectional view thereof.

As shown in FIGS. 44A and 44B, a light-emitting device 2101 is provided with a light guide plate 2102, plural through-holes 2121 formed in the light guide plate 2102, a light source 2003 housed in the through-hole 2121 and a mounting substrate 2104 electrically connected to the light source 2003. The light source 2003 is the same as the sixth embodiment and is not described in detail here. The light guide plate 2102 is formed of a material transparent to light emitted from the light source 2003 and the light emitted from the light source 2003 in the through-hole 2121 is incident on the light guide plate 2102.

In the present embodiment, the light guide plate 2102 is formed in a flat-plate shape having an entirely constant thickness. A material of the light guide plate 2102 is optional as long as it is transparent to the light from the light source 2003, and it is possible to use, e.g., an acrylic resin. Here, one surface of the light guide plate 2102 is described as an upper surface 2122 and another surface thereof is described as a lower surface 2123 hereinafter. A scattering surface is formed on the lower surface 2123 by white paint, surface roughening or prism formation.

In the through-hole 1021 as a hole portion, an area of an inner surface 2124 on which light is incident from the light source 2003 is parallel to a thickness direction of the light guide plate 2101. In the present embodiment, the through-hole 2121 is formed in a square shape of which corners are cut in a plan view, and has the same cross section from top to bottom. In detail, the corners of the through-hole 2121 are curved at a predetermined radius of curvature. Light is emitted upwardly and laterally from the light source 2003, and the light from the light source 2003 is incident on the whole area of the inner surface 2124 of the through-hole 2121, as described above. In the present embodiment, plural through-holes 2121 are regularly formed in the light guide plate 2102 in a plan view. In detail, the through-holes 2121 are arranged in a lattice point pattern on the entire surface of the planar light-emitting device 2101 at equal intervals longitudinally and laterally.

The light source 2003 of 1.0 mm square in a plan view is mounted at the center of the through-hole 2121 of 1.5 mm square in a plan view. Here, the corners of the through-hole 2121 are rounded so that a radius of curvature is 0.25. The light source 2003 is housed in the through-hole 2121 so that the element mounting substrate 2033 is located on the lower surface 2123 side of the light guide plate 2102 and that the optical axis thereof is parallel to the thickness direction of the light guide plate 2102.

FIG. 45A is a partial cross sectional view showing a light-emitting device.

As shown in FIG. 45A, the mounting substrate 2104 is made of aluminum as a base and is provided along the lower surface 2123 of the light guide plate 2102. In the present embodiment, the mounting substrate 2104 is provided so as to block a lower side of each through-hole 2121. The mounting substrate 2104 has a substrate main body 2141 formed of aluminum, an insulation layer 2142 provided on the substrate main body 2141, a circuit pattern 2143 provided on the insulation layer 2142 and a white resist layer 2144 provided on the circuit pattern 2143.

This provides that heat generated by the light source 2003 is diffused into the entire substrate via the mounting substrate 2104, which prevents localization of heat and allows enhancement of heat dissipation to the outside. And in this case, the mounting substrate 2104 formed along the light guide plate 2102 can have a heat dissipation function while avoiding influence on the shape such as thickening, etc., which damages a design of the planar light-emitting device 2101. Meanwhile, as is the prior art, light sources are localized if plural rows of cylindrical bore shaped or concave light incident portions are provided on a rear surface of the light guide plate in the vicinity of at least one side surface so as to be parallel thereto, and a problem arises in that the light guide plate is bent due to localization of heat when a sufficient heat dissipation countermeasure is not taken. In contrast, in the light-emitting device 2101 of the present embodiment, it is possible to suppress bending of the light guide plate 2102 caused by heat since the light sources 2003 are arranged in a dispersed manner, heat of each light source 2003 is diffused into the planar mounting substrate 2104 and it is possible to release the heat to the outside from a large area.

Meanwhile, the light source 2003 having a height of 0.85 mm is mounted on the mounting substrate 2104 via a solder 2031. Thus, the light source 2003 is arranged at a height of 0.85 mm from the bottom edge of the through-hole 2121 which has a vertical length of 3 mm. In other words, the edge of the light source 2003 on the element mounting substrate 2033 side (a back surface of the element mounting substrate 2033 in the present embodiment) and the lower surface 2123 of the light guide plate 2102 are located at the same height in the thickness direction of the light guide plate 2102. As a result, the surface of the glass sealing portion 2034 as a light-emitting face of the light source 2003 is located higher than the lower surface 2123 of the light guide plate 2102 by the thickness of the solder 2031 and the element mounting substrate 2033, hence, much of the light is directly incident on the inner surface 2124 of the through-hole 2121 even in the case of scattered radiation from the glass sealing portion 2034 of the light source 2003 including the phosphor 2039.

Meanwhile, all light incident into the light guide plate 2102 from the inner surface 2124 among the light traveling in the thickness direction of the light guide plate 2102 becomes propagation light in the light guide plate 2102 by satisfying the formula, $$90°-\sin^{-1}[\{\sin(90°-\alpha_2)\}/n_2]+\alpha_2 \geq \sin^{-1}(1/n_2) \quad (3)$$

where $\alpha_2$ is an angle of the inner surface 2124 of the through-hole 2121 with respect to the lower surface 2123 of the light guide plate 2102 and $n_2$ is the refractive index of the light guide plate 2102. In the present embodiment, the condition of the above-mentioned formula (3) is satisfied since $\alpha_2$ is 90° and $n_2$ is 1.5.

Additionally, all light incident into the light guide plate 2102 from the inner surface 2124 among the light traveling along the inner surface 2124 of the light guide plate 2102 becomes propagation light in the light guide plate 2102 by satisfying the formula, $$\alpha_2 \leq 90°-2\times\sin^{-1}[\sin\{(90°-\alpha_2)/n_2\}] \quad (4).$$

In the present embodiment, the condition of the above-mentioned formula (4) is satisfied since $\alpha_2$ is 90° and $n_2$ is 1.5.

In addition, a solid angle $\beta_1$ of the inner surface 2124 of the through-hole 2121 with respect to the center of the upper surface 2034a of the light source 2003 is 90% (5.65 steradians) or more of $2\pi$ steradians in the upper hemisphere of the inner surface 2124 of the through-hole 2121. A ratio of the solid angle of the inner surface 2124 of the through-hole 2121 with respect to the center of the side surface 2034b (a ratio to $\pi$ steradian in the upper side of the hemisphere of the side surface) is larger than that of the upper surface 2034a, hence, a ratio of the solid angle of the whole light source 2003 is at least 90% or more. Meanwhile, a direction to maximize the light intensity of the light source 2003 is about 45° and the inner surface 2124 is present in this direction.

In the light-emitting device 2101 configured as mentioned above, since the angle $\alpha_2$ of the inner surface 2124 of the through-hole 2121 with respect to the lower surface 2123 of the light guide plate 2102 and the refractive index $n_2$ of the light guide plate 2102 are determined so as to satisfy the above-mentioned formulas (3) and (4), most of the light incident from the inner surface 2124 of the through-hole 2121 becomes propagation light. As a result, it is possible to obtain an effect contrary to the common technical knowledge, in which the light can be precisely incident on the light guide plate 2102 and becomes the propagation light thereof without using, in the light source 2003 or the light guide plate 2102, a particular optical controller for controlling the light emitted upwardly from the light source 2003 to orient in an in-plane direction of the light guide plate 2102 even though the optical axis of the light source 2003 is oriented in the thickness direction of the light guide plate 2102. Therefore, the number of components can be reduced by eliminating the optical controller and it is thereby possible to simply and easily manufacture the light-emitting device 2101. In addition, since at least 90% or more of the light emitted from the light source 2003 is incident on the inner surface 2124 of the light guide plate 2102, the light emitted from the light source 2003 can be used without loss. Note that, the propagation light incident on the through-hole 2121 from the inside of the light guide plate 2102 is refracted at an angle to further spread in a broad area, and is incident into the light guide plate 2102 from the inner surface 2124 again.

As described above, white light can be emitted from the entire light guide plate 2102 by a very simple structure in which plural through-holes 2121 are regularly arranged in the light guide plate 2102 in two predetermined directions and the light source 2003 is placed in each through-hole 2121. At this time, uniform emission from the light guide plate 2102 can be realized by uniformly arranging the light sources 2003 on the entire light guide plate 2102. Therefore, it is possible to thin and downsize the light-emitting device 2101 while reducing the manufacturing cost.

In addition, since the through-hole 2121 is formed in a square shape having curved corners in a plan view and the light source 2003 also in a square shape is arranged therein, the amount of the incident light into the through-hole 2121 can be increased while downsizing the through-hole 2121 as compared to a circular through-hole. On the other hand, the present embodiment uses refraction at the time of incidence on the light guide plate 2102 but refracting light is emitted only in a direction of less than 45° with respect to a perpendicular of each incidence plane, thus, a direction in which light is not emitted emerges if the shape is a simple square. In contrast, the direction in which light is not emitted can be prevented from emerging by forming a square having curved corners. The direction in which light is not emitted may be prevented from emerging by chamfering the corners instead of forming a curve, however, it is possible to have smoother emission intensity distribution when a curve is formed.

Additionally, since the light source 2003 having wide light distribution characteristics is housed in the light guide plate 2102 as described above, variation in the amount of light or in color, etc., of each of the light sources 2003 can be averaged. In addition, since the amount of the light emitted upwardly from the light source 2003 is reduced, it is possible to prevent glare of the direct light by reducing the light outwardly emitted directly from the through-hole 2121. Furthermore, since the amount of horizontally emitted light is increased, combined effectiveness of light to the light guide plate 2102 is good.

It should be noted that, although the ratio of the solid angle of the inner surface 2124 of the through-hole 2121 with respect to the center of the upper surface 2034a of the light source 2003 is not necessarily 90% or more of $2\pi$ steradians in the upper hemisphere, 70% or more is desirable for optical efficiency. Furthermore, it is desirable that the inner surface 2124 of the through-hole 2121 is present in a direction in which the light intensity of the light source 2003 is maximized.

Here, an angle $\alpha_2$ of an inner surface of a through-hole with respect to another surface of a light guide plate will be described in detail in reference to FIGS. 45A and 45B.

When the light guide plate 2102 is formed by injection molding, a slight taper (inclination) may be preferably formed in the through-hole 2121, as shown in FIG. 45A. Here, FIG. 45B shows how many degrees the inner surface 2124 should be smaller than 90° to satisfy the propagation condition of the above-mentioned formulas (3) and (4) for each refractive index $n_2$ of the light guide plate 2102. As shown in FIG. 45B, 2.8° or less satisfies both of the formulas (3) and (4) at $n_2$ of 1.45 or less. At $n_2$ of 1.50 or less, the propagation condition of the formula (3) is satisfied by 6.7° or less and that of the formula (4) is satisfied by 6.4° or less. At $n_2$ of 1.55 or less, the propagation condition of the formula (3) is satisfied by 10.4° or less and that of the formula (4) is satisfied by 9.6° or less. In addition, at $n_2$ of 1.60 or less, the propagation condition of the formula (3) is satisfied by 13.9° or less and that of the formula (4) is satisfied by 12.6° or less. Furthermore, at $n_2$ of 1.65 or less, the propagation condition of the formula (3) is satisfied by 17.3° or less and that of the formula (4) is satisfied by 15.4° or less. In this regard, however, it is desirable that the inner surface 2124 is basically a vertical surface but an inclined angle can be less than 5°, taking into consideration that surface flatness of the light guide plate 2102 and the refractive index therein are not exactly constant.

In the seventh embodiment, it is not limited to the light sources 2003 arranged in a lattice point pattern on the planar light-emitting device 2101, and the light sources 2003 may be arranged at the middle either densely or sparsely. The light-emitting device 2101 on which the light sources 2003 are entirely arranged including the middle portion can have characteristics such that the light source is particularly compact, the light is propagated in a 360-degree direction on the surface of the light guide plate 2102 by using refraction of the light guide plate and the light source is hard to see. The characteristics, in which the light source is hard to see even if the light sources are arranged only at a periphery of the light guide plate, are also possible.

Figure 46:
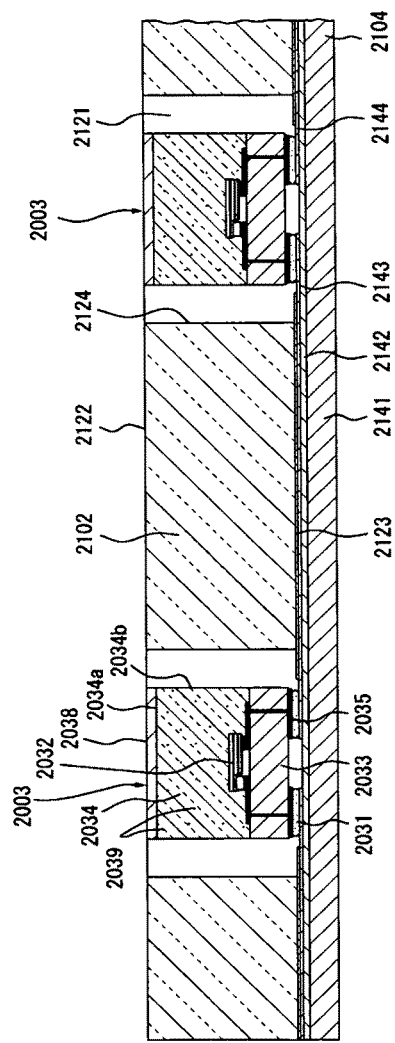
FIG. 46 is a partial cross sectional view showing a light-emitting device in a modification.

Alternatively, the upper surface 2034a of the light source 2003 may be at the same level as the upper surface 2122 of the light guide plate 2102 as, for example, shown in FIG. 46. In this case, the light guide plate 2102 can be thinned and it is possible to add an accent to the design of the light source 2003 by increasing the amount of the light which outwardly emitted directly from a through-hole 2121.

Figure 47:
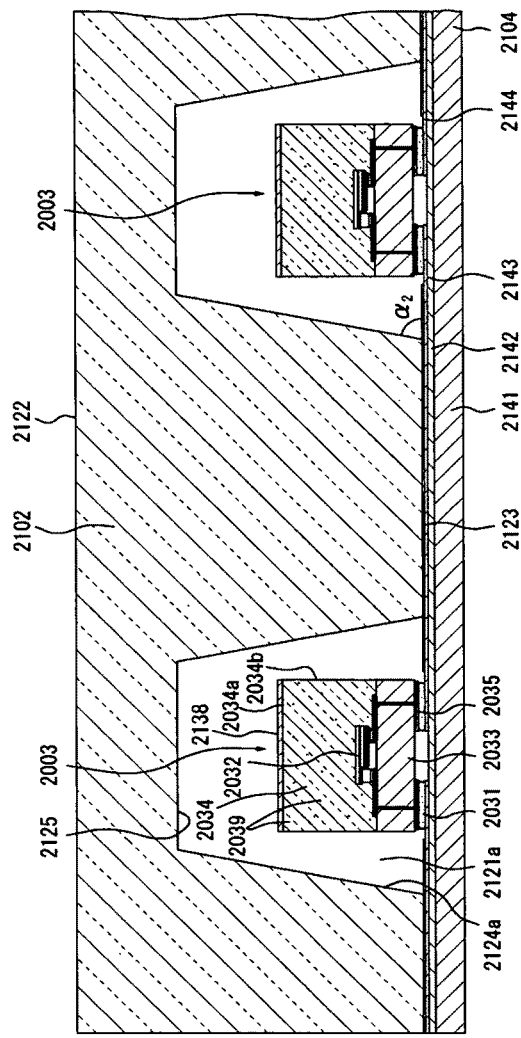
FIG. 47 is a partial cross sectional view showing a light-emitting device in a modification.

Alternatively, for example, a hole portion 2121a may be formed from the lower surface 2123 to the middle portion in a thickness direction without forming the through-hole 2121 which penetrates the light guide plate 2102 as shown in FIG. 47. In FIG. 47, a closing surface 2125 of the hole portion 2121a located above a light source 2003 is parallel to the upper surface 2122 and the lower surface 2123 of the light guide plate 2102, and is formed flat. Also in this case, the angle $\alpha_2$ is determined so as to satisfy the above-mentioned formulas (3) and (4).

Figure 48:
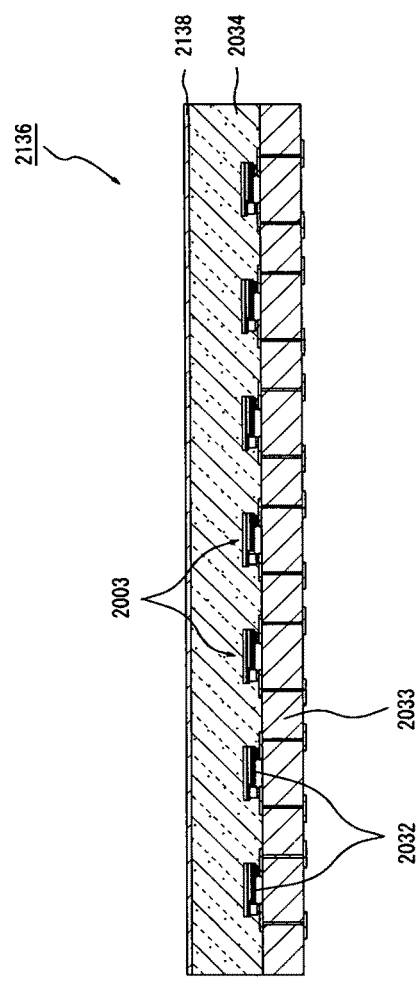
FIG. 48 is a cross sectional view showing an intermediary body in a modification.

Meanwhile, a reflective layer 2138 of the light source 2003 in FIG. 47 is formed of a metal material. It is possible to use, e.g., Ag or Al, etc., as the metal of the reflective layer 2138. The reflective layer 2138 can be formed on the upper surface 2034a of the glass sealing portion 2034 by vapor deposition or sputtering. For forming the light source 2003, plural LED elements 2032 are collectively sealed on the element mounting substrate 2033 with the glass sealing portion 2034 by hot pressing process, the reflective layer 2138 is subsequently formed by vapor deposition or sputtering, etc., as shown in FIG. 48 and an intermediary body 2136 is cut by dicing.

Figure 49:
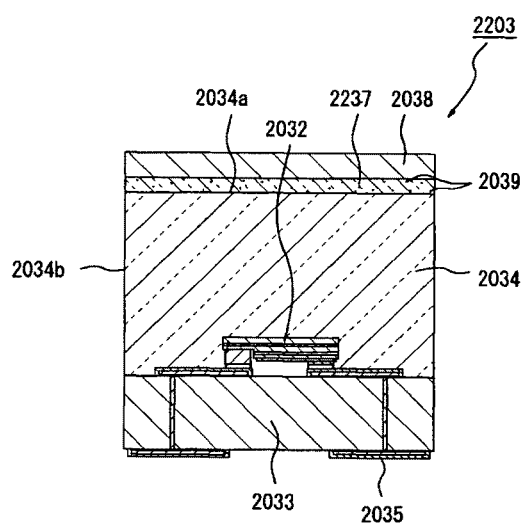
FIG. 49 is a cross sectional view showing a light source in a modification.

In addition, although the glass sealing portion 2034 including the phosphor 2039 dispersed therein has been described in the above-mentioned embodiment, for example, a phosphor layer 2237 formed of glass having phosphor 2039 dispersed therein may be formed between the glass sealing portion 2034 and the reflective layer 2038 as shown in FIG. 49. In a light source 2203, although the difference in chromaticity occurs between the light emitted upwardly and the light emitted horizontally, there is no problem since the light is mixed in the light guide plate 2102. In addition, in the light source 2203, it is possible to integrally bond the element mounting substrate 2033, the glass sealing portion 2034, a phosphor layer 2237 and the reflective layer 2038 by hot pressing process.

Figure 50:
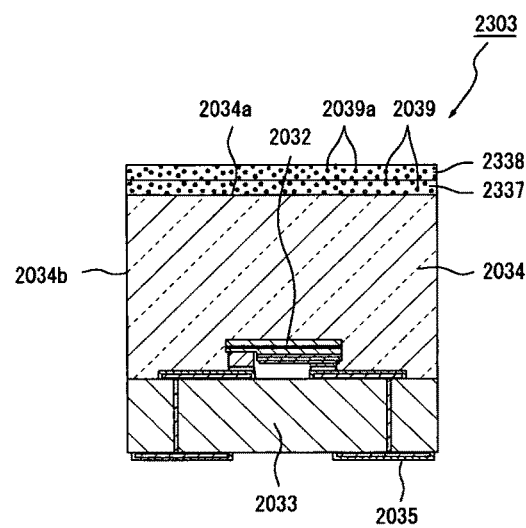
FIG. 50 is a cross sectional view showing a light source in a modification.

Alternatively, for example, a reflective layer 2338 may be formed by dispersing diffusion particles 2039a into a ceramic base material, as shown in FIG. 50. A material having a refractive index different from that of the base material of the reflective layer 2338 is selected for the diffusion particle 2039a. For base materials of the reflective layer 2338 and the diffusion particle 2039a, different materials are selected from materials of, e.g., ZrO, $Al_2O_3$ and $SiO_2$, etc. Furthermore, a phosphor layer 2337 of a light source 2303 is formed by dispersing the phosphor 2039 into a ceramic base material.

In addition, although the light sources 2003, 2103, 2203 and 2303 each having one LED element 2032 have been described in each of the above-mentioned embodiments, the light source may have, of course, plural light-emitting elements. For example, in the light source, plural LED elements arranged in longitudinal and lateral directions may be mounted on an element mounting substrate in a square shape. Alternatively, in the light source, for example, plural LED elements aligned in a row may be mounted on an element mounting substrate in a rectangular shape.

In addition, although a light-emitting device using an LED element as a light-emitting element has been described in the above-mentioned embodiment, the light-emitting element is not limited to the LED element and other specific detailed structure, etc., can be, of course, appropriately changed.

Eighth Embodiment

FIGS. 51 to 56 show the eighth embodiment of the invention. FIG. 51A is a plan view of a light-emitting device and FIG. 51B is a cross sectional view thereof.

Figures 51A, 51B:
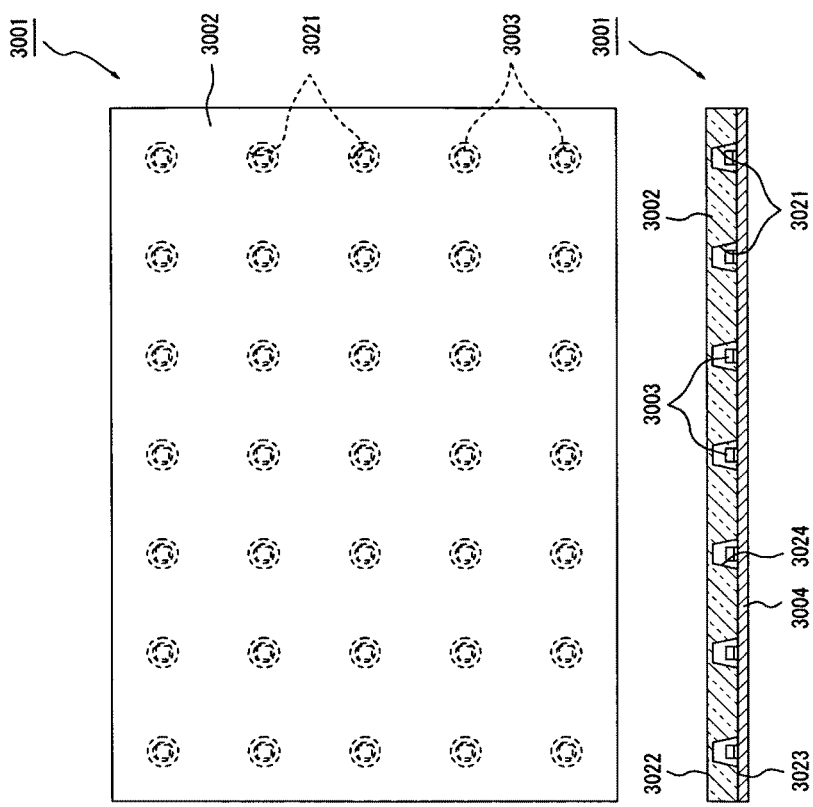

As shown in FIG. 51A, a light-emitting device 3001 is provided with a light guide plate 3002, plural hole portions 3021 formed in the light guide plate 3002, a light source 3003 housed in the hole portion 3021 and a mounting substrate 3004 electrically connected to the light source 3003. The light guide plate 3002 is formed of a material transparent to light emitted from the light source 3003 and the light emitted from the light source 3003 in the hole portion 3021 is incident on the light guide plate 3002. In the present embodiment, the light guide plate 3002 is formed in a flat-plate shape having an entirely constant thickness. A material of the light guide plate 3002 is optional as long as it is transparent to the light from the light source 3003, and it is possible to use, e.g., an acrylic resin. Here, one surface of the light guide plate 3002 is described as a lower surface 3023 and another surface thereof is described as an upper surface 3022 hereinafter. A scattering surface is formed on the lower surface 3023 by white paint, surface roughening or prism formation.

In the hole portion 3021, an incident surface of the light guide plate 3002 which is an area of an inner surface 3024 on which light is incident from the light source 3003 is substantially parallel to a thickness direction even though an angle $\alpha_3$ of the incident surface with respect to the lower surface 3023 of the light guide plate 3002 (see FIG. 52) is less than 90° and the inner surface 3024 is inclined with respect to the lower surface 3023. In the present embodiment, the hole portion 3021 is formed in a circular shape in a plan view and is slightly enlarged downward. Light is emitted upwardly and laterally from the light source 3003, and the light from the light source 3003 is incident on the whole area of the inner surface 3024 of the hole portion 3021, as described later. In the present embodiment, plural hole portions 3021 are regularly formed in the light guide plate 3002 in a plan view. In detail, the hole portions 3021 are arranged in a lattice point pattern on the entire surface of the planar light-emitting device 3001 at equal intervals longitudinally and laterally.

Figure 52:
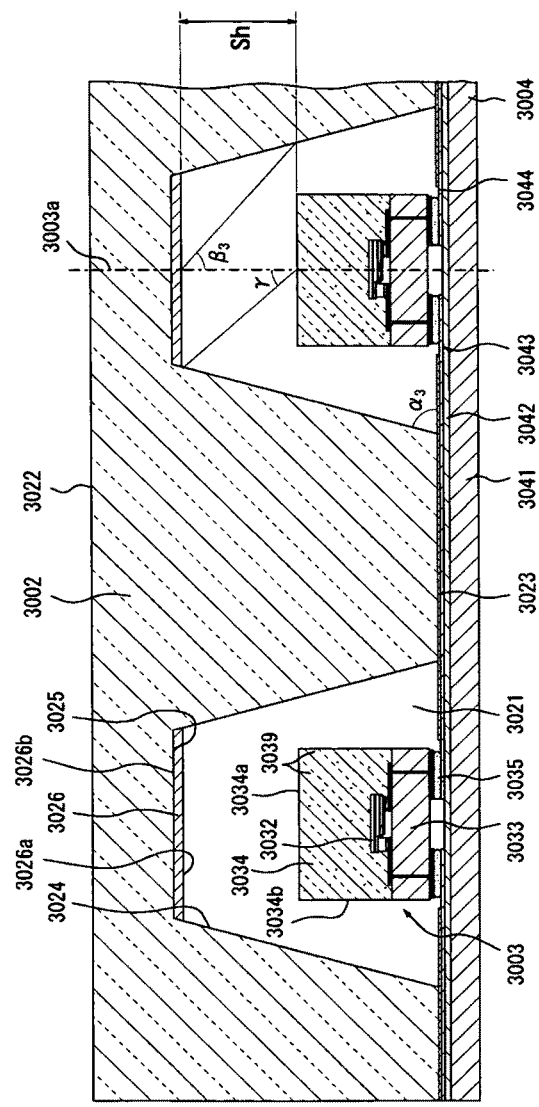
FIG. 52 is a partial cross sectional view showing the light-emitting device.

FIG. 52 is a partial cross sectional view showing the light-emitting device.

As shown in FIG. 52, the hole portion 3021 is formed toward the upper surface 3022 from the lower surface 3023 to the middle portion of the light guide plate 3002 in a thickness direction. A closing surface 3025 of the hole portion 3021 located above the light source 3003 is parallel to the upper surface 3022 and the lower surface 3023 of the light guide plate 3002, and is formed flat. A white reflective layer 3026 for reflecting the light emitted from the light source 3003 is formed on the closing surface 3025. A surface of the white reflective layer 3026 on the light source 3003 side serves as a first reflecting surface 3026a which is in a planar shape and reflects light in the hole portion 3021. Meanwhile, a surface of the white reflective layer 3026 on the upper surface 3022 side serves as a second reflecting surface 3026b for reflecting the light which propagates in the light guide plate 3002.

In the present embodiment, a distance Sh from the first reflecting surface 3026a to the light source 3003 is determined so that an angle $\beta_3$, which is defined between an optical axis 3003a and a line segment connecting an intersection of the optical axis 3003a of the light source 3003 with the first reflecting surface 3026a to a height position of an upper edge of the light source 3003 within the inner surface 3024, is 60° or less and that more than half of directions of light diffusely reflected by first reflecting surface 3026a within the solid angle is a direction reaching the inner surface 3024. In addition, the distance Sh is determined so that an angle $\gamma$, which is defined between the optical axis 3003a and a line segment connecting an intersection of the optical axis 3003a with the upper surface of the light source 3003 to a height position of the first reflecting surface 3026a within the inner surface 3024, is also 60° or less.

As shown in FIG. 52, the light source 3003 has a flip-chip-type LED element 3032 formed of a GaN-based semiconductor material, an element mounting substrate 3033 for mounting the LED element 3032, and a glass sealing portion 3034 as an inorganic sealing portion which seals the LED element 3032 and is adhered to the element mounting substrate 3033. In addition, a circuit pattern 3035 for electrically connecting the LED element 3032 to the mounting substrate 3004 is formed on the element mounting substrate 3033. The circuit pattern 3035 has a front surface pattern formed on the front surface of the element mounting substrate 3033, a rear surface pattern formed on the rear surface of the element mounting substrate 3033, and a via pattern for connecting the front surface pattern to the rear surface pattern. The element mounting substrate 3033 is formed of a polycrystalline sintered material of alumina ($Al_2O_3$), and is formed 250 μm thick in 1000 μm square. Meanwhile, the LED element 3032 is formed 100 μm thick in 346 μm square. In other words, a distance from a side edge of the LED element 3032 to a side surface 3034b of the glass sealing portion 3034 is 327 μm and a distance from an upper edge of the LED element 3032 to an upper surface 3034a of the glass sealing portion 3034 is 500 μm.

Figure 53A:
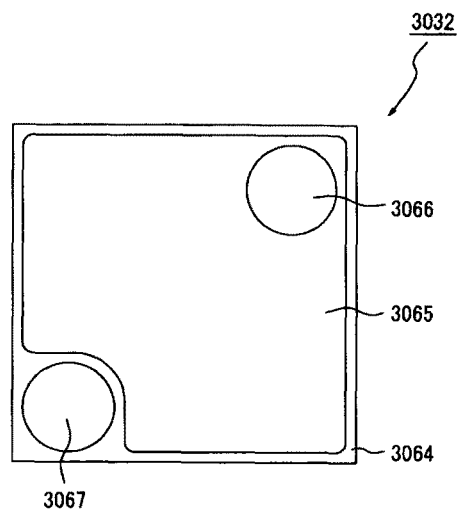
Figure 53B:
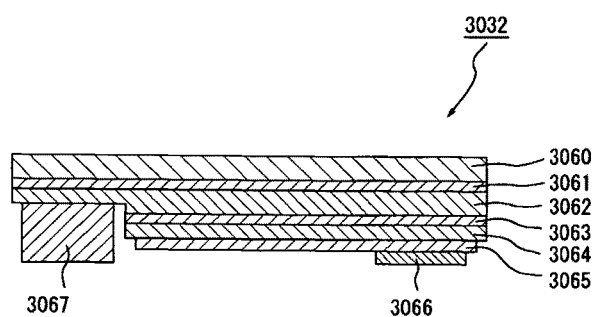

FIG. 53 show an LED element, wherein FIG. 53A is a plan view and FIG. 53B is a cross sectional pattern diagram.

As shown in FIG. 53A, a buffer layer 3061, an n-type layer 3062, a MQW layer 3063 and a p-type layer 3064 are formed in this order in the LED element 3032 as a light-emitting element by epitaxially growing a Group III nitride-based semiconductor on a surface of a supporting substrate 3060 which is formed of sapphire ($Al_2O_3$). The LED element 3032 is epitaxially grown at 700° C. or more, has a heat resistance temperature of 600° C. or more, and is stable at the processing temperature during the sealing process using the below-described low-melting point glass. In addition, the LED element 3032 has a p-side electrode 3065 provided on a surface of the p-type layer 3064, a p-side pad electrode 3066 formed on the p-side electrode 3065 and an n-side electrode 3067 formed on the n-type layer 3062 which is exposed by partially etching from the p-type layer 3064 to the n-type layer 3062.

The p-side electrode 3065 is formed of, e.g., transparent conductive oxide such as ITO (Indium Tin Oxide), and functions as a light reflection layer for reflecting the light emitted from the MQW layer 3063 as a light emitting layer toward a direction of the supporting substrate 3060. Meanwhile, the n-side electrode 3067 is made of a metal such as, e.g., Ni/Au or Al, etc., and is formed at one corner of the LED element 3032 in a plan view. In the present embodiment, the p-side electrode 3065 is formed on the substantially entire LED element 3032 in a plan view except a formation region of the n-side electrode 3067, as shown in FIG. 53B. Meanwhile, the p-side pad electrode 3066 is made of, e.g., Ni/Au and is formed at a corner of the LED element 3032 diagonal to the n-side electrode 3067 in a plan view. The n-side electrode 3067 and the p-side pad electrode 3066 are formed in a circular shape in a plan view.

The glass sealing portion 3034 covers the LED element 3032 as well as the element mounting substrate 3033 on the side mounting the LED element 3032, and has a thickness of 0.6 mm. The glass sealing portion 3034 has the upper surface 3034a parallel to the element mounting substrate 3033 and the side surface 3034b extending downwardly from an outer edge of the upper surface 3034a and being vertical to the element mounting substrate 3033. The glass sealing portion 3034 can be formed of, e.g., ZnO—$B_2O_3$—$SiO_2$-based glass and the refractive index in this case is 1.7. In addition, this glass is thermal fusion glass fused to the element mounting substrate 3033 by heating and is different from glass formed by a sol-gel reaction. However, the composition and refractive index of the glass are not limited thereto.

Meanwhile, the glass sealing portion 3034 includes a phosphor 3039 which converts a wavelength of the light emitted from the LED element 3032. As the phosphor 3039, it is possible to use, e.g., YAG (Yttrium Aluminum Garnet) phosphor and silicate phosphor, etc., and white light is obtained by a blue LED element 3032 and a yellow phosphor 3039 in the present embodiment. Alternatively, the white light may be obtained by combining an LED element emitting blue light with a green phosphor or a red phosphor. In addition, the phosphor 3039 is not necessarily included in the glass sealing portion 3034, and the phosphor 3039 may be applied to the surface of the glass sealing portion 3034 or may not be used.

In the light source 3003, blue light is emitted from the LED element 3032 when voltage is applied thereto. The blue light emitted from the LED element 3032 is partially converted into yellow by the phosphor 3039, and is subsequently outwardly emitted through the upper surface 3034a or the side surface 3034b of the glass sealing portion 3034. Here, since the distance from the side edge of the LED element 3032 to the side surface 3034b of the glass sealing portion 3034 and the distance from the upper edge of the LED element 3032 to the upper surface 3034a of the glass sealing portion 3034 are different, the light emitted from the upper surface 3034a and the light emitted from the side surface 3034b are different in chromaticity. The optical axis 3003a of the light source 3003 is perpendicular to the element mounting substrate 3033 and passes through the center of the upper surface 3034a. The light source 3003 has light distribution characteristics in which the light intensity is maximized not on the optical axis but in a direction inclined at about 30°-45° to the optical axis. The light source 3003 is manufactured through the following processes.

Firstly, oxide powder as a glass component and phosphor powder are heated to 1200° C. and are stirred in a molten state. Then, after the glass is solidified, a pre-sealing glass 3034c is sliced so as to correspond to a thickness of the glass sealing portion 3034 and is processed into a plate shape.

Meanwhile, a circuit pattern is formed on the plate-like element mounting substrate 3033. For example, metal paste is screen printed, the element mounting substrate 3033 is heat-treated at a predetermined temperature (e.g., 1000° C. or more) to bake the metal thereon and other metal is plated on the aforementioned metal, thereby forming the circuit pattern 3035. Subsequently, plural LED elements 3032 are mounted by flip-chip connection on the element mounting substrate 3033 at equal intervals longitudinally and laterally. The circuit pattern of the element mounting substrate 3033 may be formed by heat treatment of the metal paste only or can be formed by other methods such as metal sputtering followed by metal plating.

Figure 55:
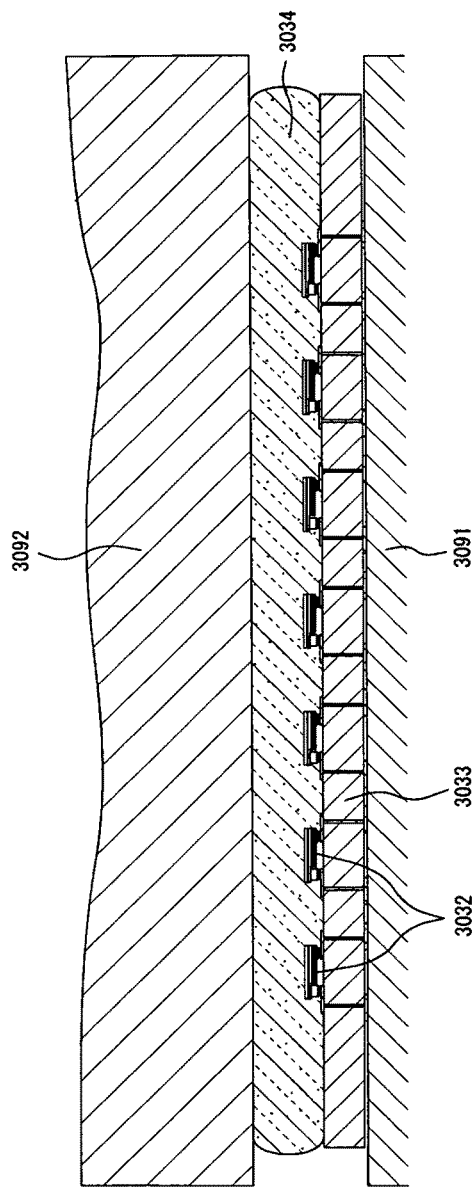
FIG. 55 is an explanatory view showing manufacturing process of the light source.

Then, as shown in FIG. 54, the element mounting substrate 3033 having the LED elements 3032 each mounted thereon is set on a lower die 3091, an upper die 3092 is arranged so as to face the mounting surface of the element mounting substrate 3033, and the pre-sealing glass 3034c is placed between the element mounting substrate 3033 and the upper die 3092 so as to cover the mounting region of each of the LED elements 3032. Subsequently, as shown in FIG. 55, the pressure is applied to the lower die 3091 and the upper die 3092 and a hot pressing process is performed in a nitrogen atmosphere on the glass material which is softened by heating. The processing conditions at this time can be optionally changed depending on temperature and pressure, etc., of the glass, for example, glass temperature of 600° C. and glass pressure of 25 kgf/cm².

Figure 56:
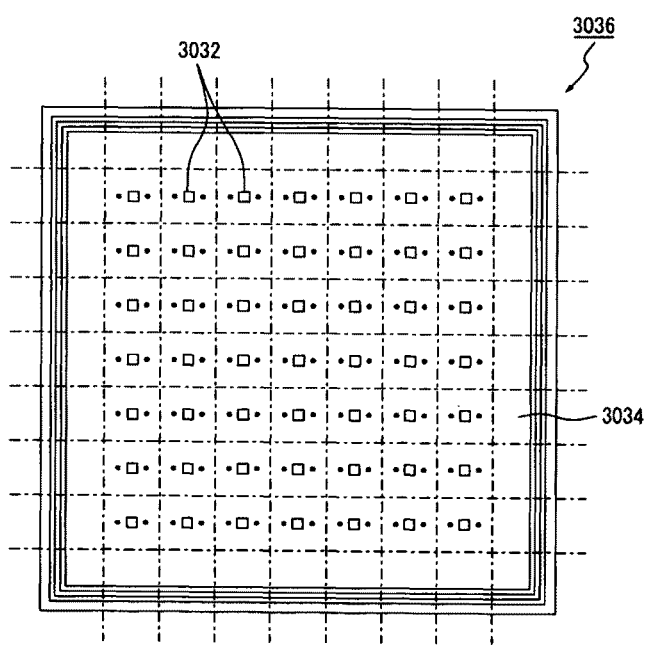
FIG. 56 is a plan view showing an intermediary body to which the light source is coupled.

An intermediary body 3036 shown in FIG. 56 in which plural light-emitting devices 3001 are coupled in longitudinal and lateral directions is made by the above-mentioned processes. After this, the element mounting substrate 3033 integrated with the glass sealing portion 3034 is placed on a dicing apparatus, dicing is performed by a dicing blade so as to divide the glass sealing portion 3034 and the element mounting substrate 3033 per each LED element 3032, thereby completing the light source 3003.

As shown in FIG. 52, the mounting substrate 3004 is made of aluminum as a base and is provided entirely along the lower surface 3023 of the light guide plate 3002. In the present embodiment, the mounting substrate 3004 is provided so as to block each of the hole portions 3021. The mounting substrate 3004 has a substrate main body 3041 formed of aluminum, an insulation layer 3042 provided on the substrate main body 3041, a circuit pattern 3043 provided on the insulation layer 3042 and a white resist layer 3044 provided on the circuit pattern 3043.

This provides that heat generated by the light source 3003 is diffused into the entire substrate via the mounting substrate 3004, which prevents localization of heat and allows enhancement of heat dissipation to the outside. And in this case, the mounting substrate 3004 formed along the light guide plate 3002 can have a heat dissipation function while avoiding influence on the shape such as thickening, etc., which damages a design of the planar light-emitting device 3001. Meanwhile, as described in WO 2004/82036, light sources are localized if plural rows of cylindrical bore shaped or concave light incident portions are provided on a rear surface of the light guide plate in the vicinity of at least one side surface so as to be parallel thereto, and a problem arises in that the light guide plate is bent due to localization of heat when a sufficient heat dissipation countermeasure is not taken. In contrast, in the light-emitting device 3001 of the present embodiment, it is possible to suppress bending of the light guide plate 3002 caused by heat since the light sources 3003 are arranged in a dispersed manner, heat of each light source 3003 is diffused into the planar mounting substrate 3004 and it is possible to release the heat to the outside from a large area.

Meanwhile, the light source 3003 having a height of 0.85 mm is mounted on the mounting substrate 3004 via a solder 3031. Thus, the light source 3003 is arranged at a height of 0.85 mm from the bottom edge of the hole portion 3021 which has a vertical length of 3 mm. In other words, the edge of the light source 3003 on the element mounting substrate 3033 side (a back surface of the element mounting substrate 3033 in the present embodiment) and the lower surface 3023 of the light guide plate 3002 are located at the same height in a thickness direction of the light guide plate 3002. As a result, the surface of the glass sealing portion 3034 as a light-emitting face of the light source 3003 is located higher than the lower surface 3023 of the light guide plate 3002 by the thickness of the solder 3031 and the element mounting substrate 3033, hence, much of the light is directly incident on the inner surface 3024 of the hole 3021 even in the case of scattered radiation from the glass sealing portion 3034 of the light source 3003 including the phosphor 3039.

Meanwhile, all light incident into the light guide plate 3002 from the inner surface 3024 among the light traveling in the thickness direction of the light guide plate 3002 becomes propagation light in the light guide plate 3002 by satisfying the formula, $$90°-\sin^{-1}[\{\sin(90°-\alpha_3)\}/n_3]+\alpha_3 \geq \sin^{-1}(1/n_3) \qquad (5)$$

where $\alpha_3$ is an angle of the inner surface 3024 of the hole portion 3021 with respect to the lower surface 3023 of the light guide plate 3002 and $n_3$ is the refractive index of the light guide plate 3002. In the present embodiment, the condition of the above-mentioned formula (5) is satisfied since $\alpha_3$ is 90° and $n_3$ is 1.5.

Within the incident angle from the light source 3003 or the first reflecting surface 3026a to the inner surface 3024 as an incident surface of the light guide plate 3002, much of the light at an angle of 60° or more with respect to a vertical direction of the inner surface 3024 is included. Much of the light from the side surface 3034b of the light source 3003 specifically close to the inner surface 3024 is light at a relatively large angle. Then, light incident at an angle of $(90°-\alpha_3)$ or less can be propagation light when the formula (5) is satisfied.

Additionally, all light incident into the light guide plate 3002 from the inner surface 3024 among the light traveling along the inner surface 3024 of the light guide plate 3002 becomes propagation light in the light guide plate 3002 by satisfying the formula, $$\alpha_3 \leq 90° - 2 \times \sin^{-1}[\sin\{(90° - \alpha_3)/n_3\}] \qquad (6).$$

In the present embodiment, the condition of the above-mentioned formula (6) is satisfied since $\alpha_3$ is 90° and $n_3$ is 1.5.

Light at substantially 90° to the vertical direction of the inner surface 3024 is also present among the light not only from the light source 3003 or the first reflecting surface 3026a but also from the white resist layer 3044 of the mounting substrate 3004, etc. This light also can be propagation light when the formula (6) is satisfied.

In addition, a solid angle of the inner surface 3024 of the hole portion 3021 with respect to the center of the upper surface 3034a of the light source 3003 is about 50% ($\pi$ steradians) of $2\pi$ steradians in the upper hemisphere of the inner surface 3024 of the hole portion 3021. A ratio of the solid angle of the inner surface 3024 of the hole portion 3021 with respect to the center of the side surface 3034b (a ratio to $\pi$ steradian in the upper side of the hemisphere of the side surface) is larger than that of the upper surface 3034a, hence, a ratio of the solid angle of the whole light source 3003 is at least 50% or more. Meanwhile, a solid angle of the first reflecting surface 3026a with respect to the center of the upper surface 3034a of the light source 3003 is about 50% ($\pi$ steradians) of $2\pi$ steradians in the upper hemisphere. In addition, a solid angle of the inner surface 3024 of the hole portion 3021 with respect to the center of the first reflecting surface 3026a is about 50% ($\pi$ steradians) of $2\pi$ steradians in the lower hemisphere.

In the light-emitting device 3001 configured as mentioned above, since the an angle $\alpha_3$ of the inner surface 3024 of the hole portion 3021 with respect to the lower surface 3023 of the light guide plate 3002 and the refractive index $n_3$ of the light guide plate 3002 are determined so as to satisfy the above-mentioned formulas (5) and (6), most of the light incident from the inner surface 3024 of the hole portion 3021 becomes propagation light. As a result, it is possible to obtain an effect contrary to the common technical knowledge, in which the light can be precisely incident on the light guide plate 3002 and become the propagation light thereof without using, in the light source 3003 or the light guide plate 3002, a particular optical controller for controlling the light emitted upwardly from the light source 3003 to orient in an in-plane direction of the light guide plate 3002 even though the optical axis 3003a of the light source 3003 is oriented in the thickness direction of the light guide plate 3002. Therefore, the number of components can be reduced by eliminating the optical controller and it is thereby possible to simply and easily manufacture the light-emitting device 3001. In addition, since at least about 75% or more of the light emitted from the light source 3003 is incident on the inner surface 3024 of the light guide plate 3002, the light emitted from the light source 3003 can be used without loss.

As described above, most of the light emitted from the light source 3003 is directly incident into the light guide plate 3002 from the inner surface 3024. In addition to this, since the hole portion 3021 is blocked by the first reflecting surface 3026a of the white reflective layer 3026, the light incident on the first reflecting surface 3026a from the light source 3003 can be indirectly incident on the inner surface 3024 by diffuse reflection, hence, the efficiency of light extraction from the light source 3003 is good.

Furthermore, among the light propagating in the light guide plate 3002, the light which reaches the second reflecting surface 3026b of the white reflective layer 3026 is diffusely reflected by the second reflecting surface 3026b. Thus, decrease in the amount of light outwardly emitted does not occur only at the upper portion of the hole portion 3021 of the light guide plate 3002, and brightness of the front side of the hole portion 3021 does not significantly increase since the direct light from the light source 3003 is outwardly emitted from the hole portion 3021. Therefore, in combination with the shape of the hole portion 3021 which is relatively small and is basically hard to see, uniform surface emission can be realized despite the hole portion 3021 is formed.

As described above, it is compact in size, the amount of used members is less required, and division is carried out after collective sealing of plural LED elements 3032, which results in good productivity. Here, the light source 3003 in a rectangular parallelepiped shape in which the LED element 3032 is surrounded by plural planar side surfaces 3034b along the optical axis 3003a is used, the incident surface of the light guide plate 3002 surrounds the light source 3003 around the optical axis 3003a, and a side of the surrounding incident surface opposite to a mounting side of light source 3003 is optically blocked by the first reflecting surface 3026a. In addition, white light can be emitted from the entire light guide plate 3002 by a very simple structure in which plural hole portions 3021 of this configuration are regularly arranged in the light guide plate 3002 in two predetermined directions and the light source 3003 is placed in each hole portion 3021. At this time, uniform emission from the light guide plate 3002 can be realized by uniformly arranging the light sources 3003 on the entire light guide plate 3002. Therefore, it is possible to thin and downsize the light-emitting device 3001 while reducing the manufacturing cost. Furthermore, it is possible to use more light sources 3003 as compared to the case where the light sources 3003 are arranged only at the end portion of the light guide plate 3002, the problem of heat localization does not occur, and the planar light-emitting device 3001 can be configured to have higher brightness if needed.

It should be noted that, although the ratio of the solid angle of the inner surface 3024 of the hole portion 3021 with respect to the center of the upper surface 3034a of the light source 3003 is not necessarily 50% or more of $2\pi$ steradians in the upper hemisphere, 70% or more is desirable so that the inner surface 3024 of the hole portion 3021 is present in a direction in which the light intensity of the light source 3003 is maximized when it is designed to prioritize optical efficiency. On the other hand, when emphasizing the thinness of the light-emitting device 3001 or when a phosphor excited by the light from the light source 3003 is provided in the white reflective layer 3026 and an excitation rate of the phosphor is relatively increased, the light source 3003 may be close to the white reflective layer 3026.

Meanwhile, when using a phosphor of which efficiency degradation due to temperature increase is relatively large, for example, such that the luminous efficiency is reduced 5% or more by increasing from 25° C. to 28° C., the temperature increase in the phosphor can be suppressed by providing the phosphor not on the light source 3003 side but on the light guide plate 3002 side which is distant from the light source 3003, thereby improving the luminous efficiency. Color unevenness does not occur even in such a case since the light is mixed in the light guide plate 3002.

Figure 57:
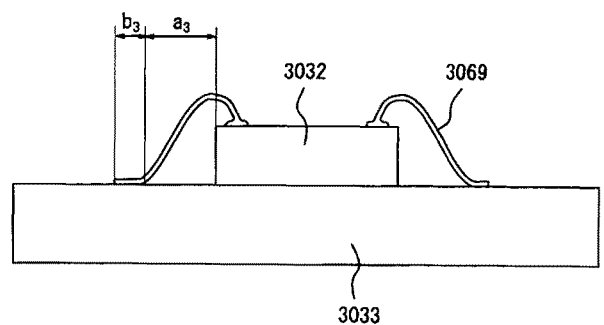
FIG. 57 is an explanatory view showing the case where an LED element of the light source is connected by e.g., wire bonding.

In addition, according to the present embodiment, since an optical surface for controlling an emission direction of LED element 3032 of the light source 3003 to be a lateral direction is omitted and the LED element 3032 is mounted by flip-chip connection, it is possible to reduce a plan view size of the light source 3003, thereby reducing the diameter of the hole portion 3021. For example, as shown in FIG. 57, when the LED element 3032 is mounted by wire bonding connection, a first distance $a_3$ for a wire loop and a second distance $b_3$ for connecting the element mounting substrate 3033 to a wire 3069 are additionally required to be provided around the LED element 3032. Since the first distance $a_3$ is, e.g., 0.3-0.5 mm and the second distance $b_3$ is, e.g., 0.2-0.5 mm, the element mounting substrate 3033 needs to be 3 times or more the LED element 3032, which is larger than 1.0 mm square of the above-mentioned embodiment, when the wire bonding is employed. Furthermore, the element mounting substrate 3033 needs to be 10 times or more the LED element 3032 when an optical surface for controlling an emission direction to be a lateral direction is provided.

In the case that a diameter of the hole portion 3021 is, e.g., 0.5 mm longer than a diagonal length of the element mounting substrate 3033, the hole portion 3021 can be a circle having a diameter of 1.9 mm and a dimension of 2.8 mm$^2$ when the element mounting substrate 3033 is 1.0 mm square in size, however, it is necessary to enlarge the hole portion 3021 so as to have a diameter of 4.0 mm and a dimension of 12.6 mm$^2$ for the 2.5 mm square element mounting substrate 3033. The diagonal length can be shortened 1.5 mm by eliminating wire bonding and using flip-chip connection, and it is desirable that the hole portion 3021 has a dimension less than that of a circle having a diameter 1.5 mm greater than the shortened diagonal length so as to be hard to see. Then, if the light-emitting device 3001 in this size is manufactured, the light source 3003 and the hole portion 3021 are easy to see even though the same LED element 3032 is mounted. In addition, if the light source 3003 is the same in height but is reduced in plan view size, light distribution in a horizontal direction relatively increases. In a case that a phosphor is dispersed in a sealing material, a difference in chromaticity between light in an upper direction and that in a horizontal direction is likely to be remarkable when a planar direction size of the sealing material is smaller than height thereof, however, the light can be mixed in the light guide plate 3002 even if the difference in chromaticity occurs.

In addition, the present embodiment does not require optical processes of the upper surface 3034a and the side surface 3034b of the light source 3003, hence, the light source 3003 is simply and easily manufactured. For this light-emitting device 3001, the light source 3003 having light distribution in which the maximum light intensity does not exist on the optical axis is more preferable, and it is very advantageous for practical use since a cubic light source 3003 is not processed and it is only necessary to form a simple hole portion 3021.

Although the light source 3003 in which the LED element 3032 is sealed with glass has been described in the above-mentioned embodiment, the sealing material can be changed as long as the LED element 3032 is flip-chip connected to the element mounting substrate 3033 and the light source 3003 does not have a frame portion of the sealing material in a plan view.

Meanwhile, it is not limited to the aluminum-based mounting substrate 3004, and another metal such as magnesium or copper may be used as a base. In addition, it is not limited to the mounting substrate having an insulation layer provided on the above-mentioned metal and a circuit pattern formed thereon, and a flexible substrate having a circuit pattern formed on polyimide or liquid crystal polymer may be provided on a metal plate.

The reflecting surface for preventing light leakage from the light guide plate 3002 to the surface mounting the light source 3003 is not limited to the surface formed on the mounting substrate 3004 as is the white resist layer 3044 of the mounting substrate 3004, and may be another white reflective sheet. However, it is necessary to provide an air layer between the light guide plate 3002 and the aforementioned reflecting surface in order not to disturb total reflection propagation of the light guide plate 3002.

Figure 58:
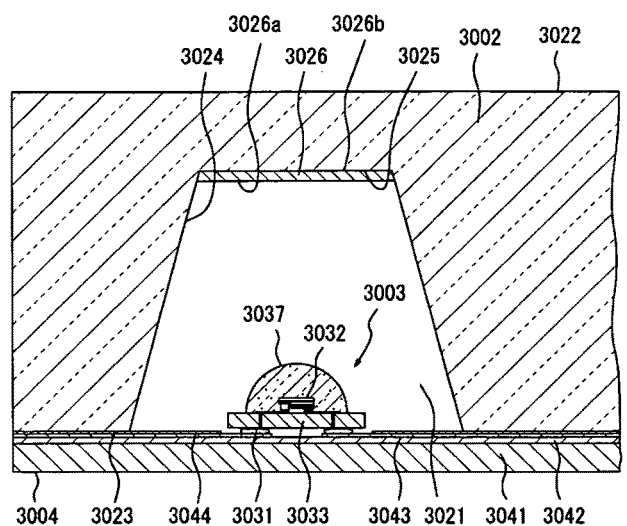
FIG. 58 is a partial cross sectional view showing a light-emitting device in a modification.

A thermal fusion glass sealed LED is easy to form in a height direction and has a thermal expansion coefficient equivalent to that of the element mounting substrate, and a bonded area between the sealing material and the element mounting substrate can be reduced due to a strong bonding force of the both members. In addition, since it is formed in a rectangular parallelepiped shape including a side emitting surface, it is possible to increase horizontal light distribution by determining the total area of the side surface to be double or more (i.e., an aspect ratio of hemisphere), preferably 4 times or more (i.e., the side surface area equal to the upper surface area), of that of the upper surface, hence, it is desirable. The light extraction efficiency from the glass to the outside may be improved by forming a convex upper portion. The LED element 3032 may be sealed with a resin sealing portion 3037 such as, e.g., a silicon resin or an epoxy resin, etc., as shown in FIG. 58. In the light source 3003 of FIG. 58, the resin sealing portion 3037 is formed in a hemispherical shape on the element mounting substrate 3033.

Figure 59:
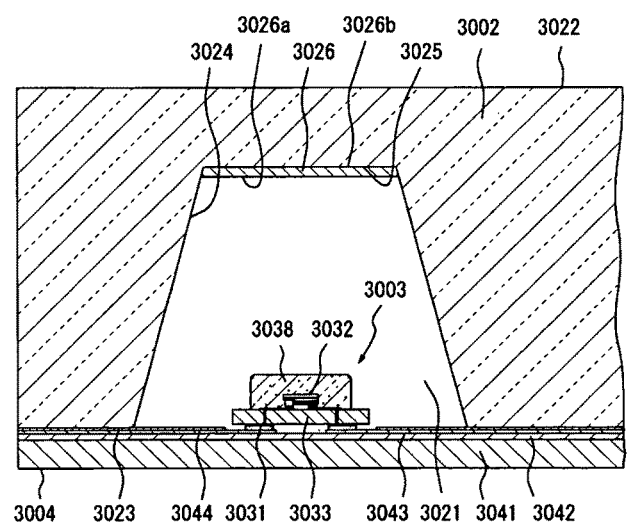
FIG. 59 is a partial cross sectional view showing a light-emitting device in a modification.

Alternatively, the LED element 3032 may be sealed with, e.g., an inorganic paste 3038 with a predetermined thickness as shown in FIG. 59. The inorganic paste 3038 can be formed of, e.g., a SiO$_2$—, Al$_2$O$_3$— or TiO$_2$-based material, etc.

Figure 60:
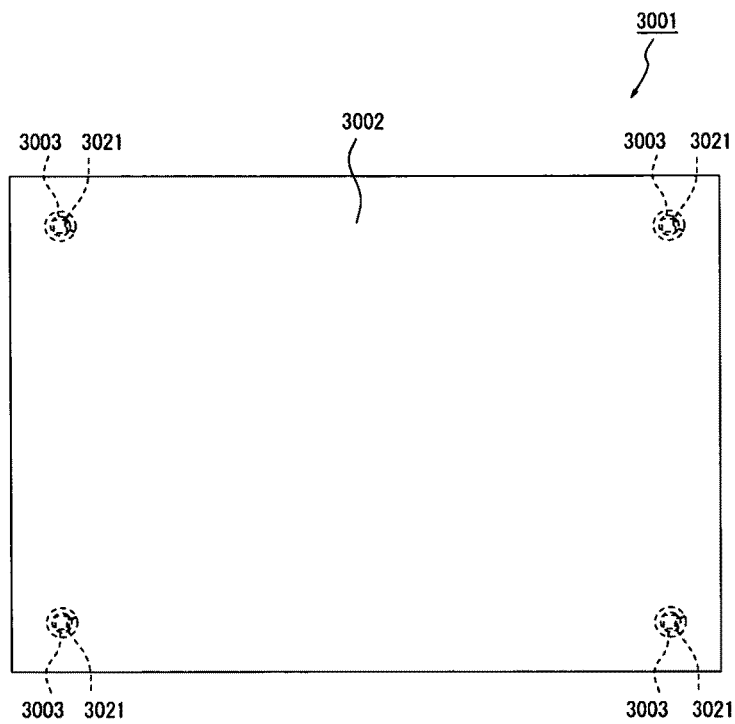
FIG. 60 is a plan view showing a light-emitting device in a modification.
Figure 61:
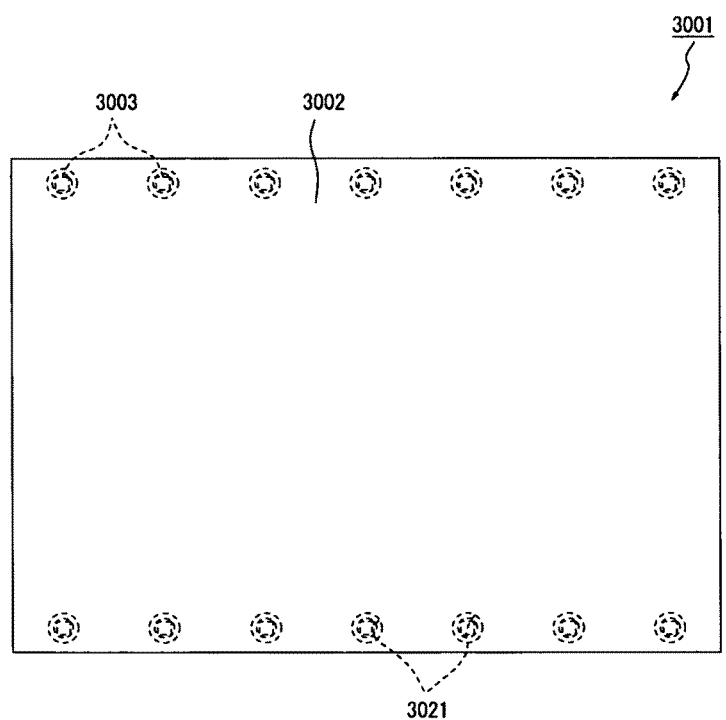
FIG. 61 is a plan view showing a light-emitting device in a modification.
Figure 62:
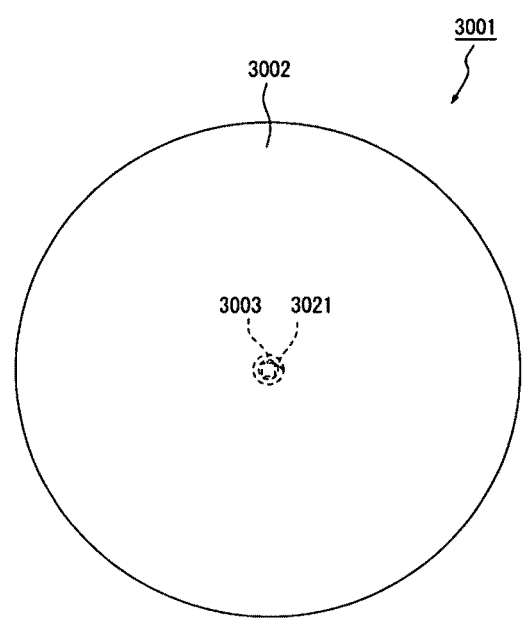
FIG. 62 is a plan view showing a light-emitting device in a modification.

In addition, it is not limited to the light sources 3003 arranged in a lattice point pattern on the planar light-emitting device 3001, and the light sources 3003 may be arranged at the middle either densely or sparsely. For example, the light sources 3003 may be arranged at four corners of the rectangular light guide plate 3002 as shown in FIG. 60. Alternatively, the light sources 3003 may be arranged, e.g., in lines at outer edges of the rectangular light guide plate 3002 as shown in FIG. 61. In FIG. 61, the light sources 3003 are arranged at a pair of long sides of the light guide plate 3002 on the outer edge side. Furthermore, for example, a light source 3003 may be arranged at the center of light guide plate 3002 as shown in FIG. 62. The light guide plate 3002 is formed in a circular shape in FIG. 62. As described above, it is possible to appropriately change the shape of the light guide plate 3002 and the layout of the light sources 3003.

Here, an angle $\alpha_3$ of an inner surface of a hole portion with respect to one surface of a light guide plate will be described in detail in reference to FIG. 63.

When the light guide plate 3002 is formed by injection molding, a taper (inclination) may be preferably formed in the hole portion 3021, as shown in FIG. 52. Here, FIG. 63 shows how many degrees the inner surface 3024 should be smaller than 90° to satisfy the propagation condition of the above-mentioned formulas (5) and (6) for each refractive index $n_3$ of the light guide plate 3002. As shown in FIG. 63, 2.8° or less satisfies both of the formulas (5) and (6) at $n_3$ of 1.45 or less. At $n_3$ of 1.50 or less, the propagation condition of the formula (5) is satisfied by 6.7° or less and that of the formula (6) is satisfied by 6.4° or less. At $n_3$ of 1.55 or less, the propagation condition of the formula (5) is satisfied by 10.4° or less and that of the formula (6) is satisfied by 9.6° or less. In addition, at $n_3$ of 1.60 or less, the propagation condition of the formula (5) is satisfied by 13.9° or less and that of the formula (6) is satisfied by 12.6° or less. Furthermore, at $n_3$ of 1.65 or less, the propagation condition of the formula (5) is satisfied by 17.3° or less and that of the formula (6) is satisfied by 15.4° or less. In this regard, however, it is desirable that the inner surface 3024 is basically a vertical surface but an inclined angle can be less than 5°, taking into consideration that surface flatness of the light guide plate 3002 and the refractive index therein are not exactly constant.

It should be noted that the propagation condition is the same for a tapered shape enlarging in a downward direction and for that enlarging in an upward direction. However, the tapered shape enlarging in a downward direction is desirable to decrease the size of the reflecting surface.

Ninth Embodiment

Figure 64:
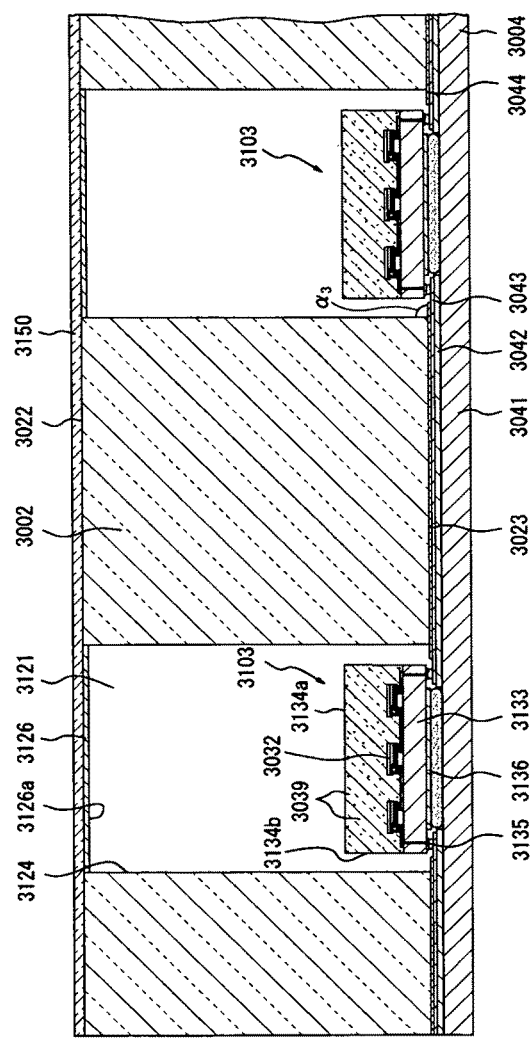
FIG. 64 is a partial cross sectional view showing a light-emitting device in a ninth embodiment of the invention.
Figure 65:
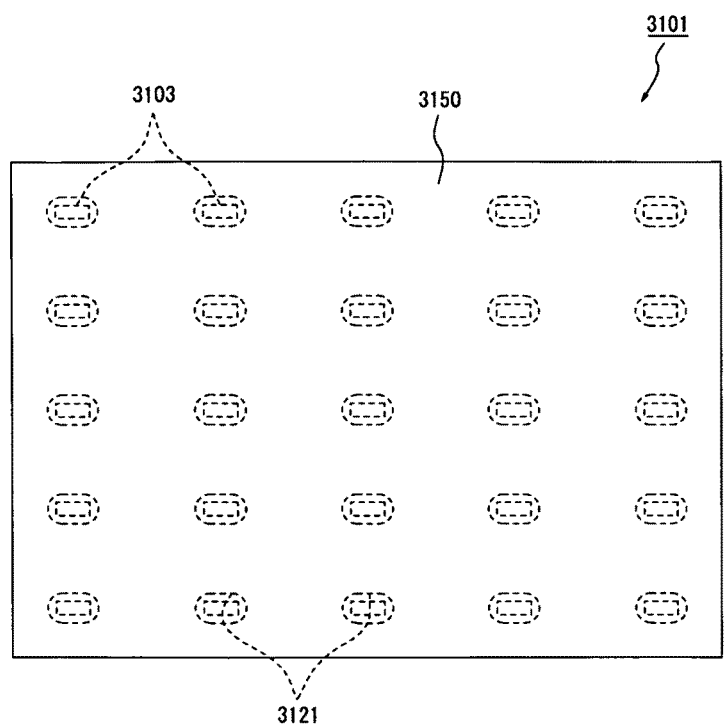
FIG. 65 is a plan view showing the light-emitting device.

FIGS. 64 and 65 show the ninth embodiment of the invention and FIG. 64 is a partial cross sectional view showing the light-emitting device. While the light source 3003 having one LED element 3032 is shown in the eighth embodiment, a light source has plural light-emitting elements in the ninth embodiment.

As shown in FIG. 64, in a light-emitting device 3101, a hole portion 3121 penetrates the light guide plate 3002 and the upper surface 3022 of the light guide plate 3002 is entirely covered by a transparent sheet 3150. A semi-transmissive coating portion 3126 is formed on the transparent sheet 3150 at a portion corresponding to each hole portion 3121. In other words, the hole portion 3121 is blocked by a planar reflective layer 3126a which is a surface of the semi-transmissive coating portion 3126 on the light source 3003 side. The semi-transmissive coating portion 3126 can be formed by vapor deposition of metal, etc., such as, e.g., aluminum or silver.

The hole portion 3121 is formed so that an inner surface 3124 is parallel to a thickness direction of the light guide plate 3002. In other words, the angle $\alpha_3$ of the inner surface 3124 with respect to the lower surface 3023 of the light guide plate 3002 is 90°. In the light-emitting device 3101, $\alpha_3$ is also determined so as to satisfy the above-mentioned formulas (5) and (6).

The light-emitting device 3101 has a light source 3103 in which plural LED elements 3032 are mounted in a row on a rectangular element mounting substrate 3133. A heat radiation pattern 3136 is provided at the middle of the element mounting substrate 3133 of the light source 3103 on a back side, and a circuit pattern 3135 is arranged around the heat radiation pattern 3136 on the back side. In addition, the light source 3103 also includes a glass sealing portion 3134 which has an upper surface 3134a parallel to the element mounting substrate 3133 and a side surface 3134b extending downwardly from an outer edge of the upper surface 3134a and being vertical to the element mounting substrate 3133.

The light source 3103 provided with the heat radiation pattern 3136 is mounted on the metal-based mounting substrate 3004. By omitting the insulation layer 3042 at a position corresponding to the heat radiation pattern 3136 and metallically bonding the heat radiation pattern 3136 to the metallic substrate main body 3041 directly or via a eutectic material, etc., thermal resistance at the bonded portion is reduced to easily transmit heat to the entire mounting substrate 3004, and it is thereby possible to significantly improve heat dissipation efficiency.

FIG. 65 is a plan view showing the light-emitting device.

As shown in FIG. 65, the through hole 3121 is formed in a long-hole shape so as to correspond to the long light source 3103. In the present embodiment, the through hole 3121 is composed of semicircular portions at both edges and linear portions therebetween, and the light source 3103 is arranged at the center of the through hole 3121. As a result, the size of the hole portion 3121 can be significantly reduced as compared to a circular hole.

In addition, in the light-emitting device 3101, since the angle $\alpha_3$ of the inner surface 3024 of the hole portion 3121 with respect to the lower surface 3023 of the light guide plate 3102 and the refractive index $n_3$ of the light guide plate 3102 are determined so as to satisfy the above-mentioned formulas (5) and (6), most of the light incident from the inner surface 3024 of the hole portion 3121 becomes propagation light. Therefore, the number of components can be reduced by eliminating the optical controller and it is thereby possible to simply and easily manufacture the light-emitting device 3101.

In addition to this, since the hole portion 3121 is blocked by the reflecting surface 3126a of the semi-transmissive coating portion 3126, a portion of the light incident on the reflecting surface 3126a from the light source 3103 can be indirectly incident on the inner surface 3024 by diffuse reflection, hence, the efficiency of light extraction from the light source 3103 is good. Furthermore, a portion of the light is transmitted through the semi-transmissive coating portion 3126, and a portion of the light propagated in the transparent sheet 3150 is outwardly emitted by diffuse reflection at the reflecting surface 3126a of the semi-transmissive coating portion 3126. Thus, decrease in the amount of light outwardly emitted does not occur only at the upper portion of the hole portion 3121 of the light guide plate 3102, while brightness of the front side does not significantly increase unlike the case without the semi-transmissive coating portion 3126. As a result, despite the hole portion 3121 is formed, uniform surface emission can be realized even if there is a slight difference in brightness.

Figure 66:
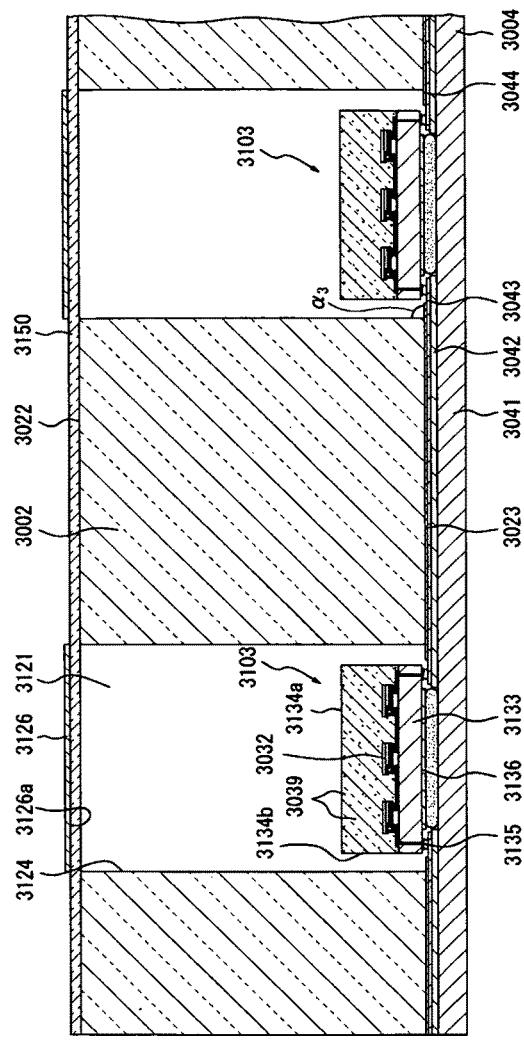
FIG. 66 is a partial cross sectional view showing a light-emitting device in a modification.
Figure 67:
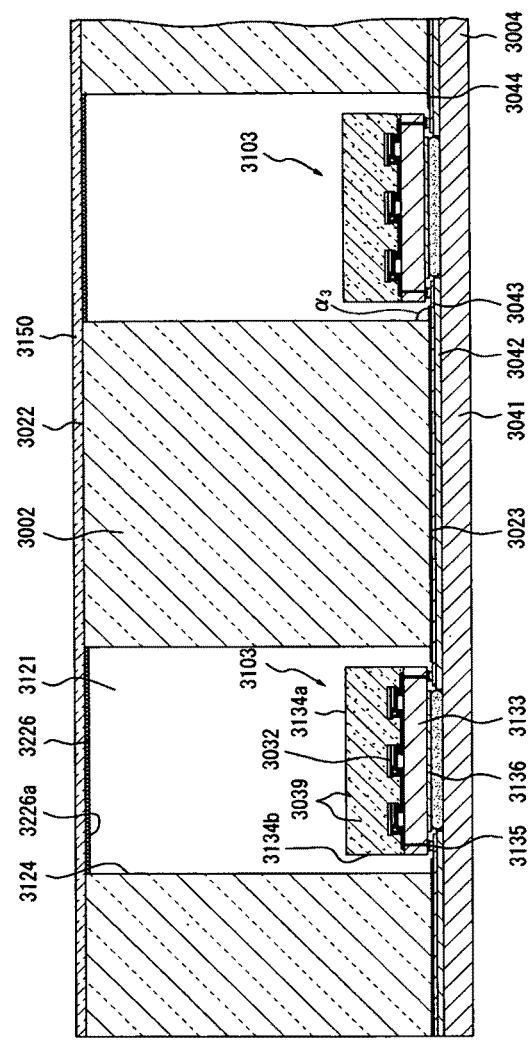
FIG. 67 is a partial cross sectional view showing a light-emitting device in a modification.
Figure 68:
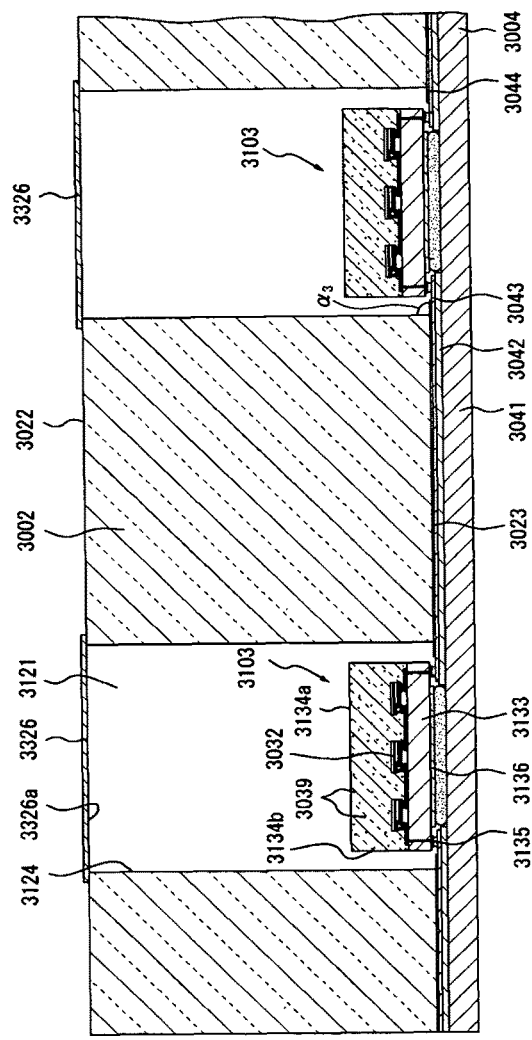
FIG. 68 is a partial cross sectional view showing a light-emitting device in a modification.

Although the semi-transmissive coating portion 3126 formed on the transparent sheet 3150 on the light source 3103 side has been described in the ninth embodiment, the semi-transmissive coating portion 3126 may be formed on, e.g., a side opposite to the light source 3103 as shown in FIG. 66. In this case, the reflecting surface 3126a of the semi-transmissive coating portion 3126 is distant from the hole portion 3121 by the thickness of the transparent sheet 3150 to be exact, however, the upper edge of the hole portion 3121 is virtually optically blocked. Alternatively, for example, a white particle layer 3226 may be formed on the transparent sheet 3150 as shown in FIG. 67, instead of forming the semi-transmissive coating portion 3126. The transparent sheet 3150 as a light transmitting member is adhesive and white particles in a layer form are adhered to the transparent sheet 3150 by an adhesive force. A reflecting surface 3226a of the white particle layer 3226 is formed plane in a macroscopic view even though unevenness due to the particle is formed thereon. In addition, for example, a reflective sticker 3326 as a light transmitting member may be adhered to the upper surface 3022 side so as to block the hole portion 3121 as shown in FIG. 68. In this case, a surface of the reflective sticker 3326 on the hole portion 3121 side serve as a reflecting surface 3326a. In addition, the reflecting surface which is not semi-transmissive but non-transmissive may be, of course, used in a case where the reflecting surface is relatively small and is used so as to be hard to see, such as in the case where a diffuser plate is placed at a distance in a height direction in a planar light-emitting device, or the case where a thick diffuser plate is used.

Figure 69:
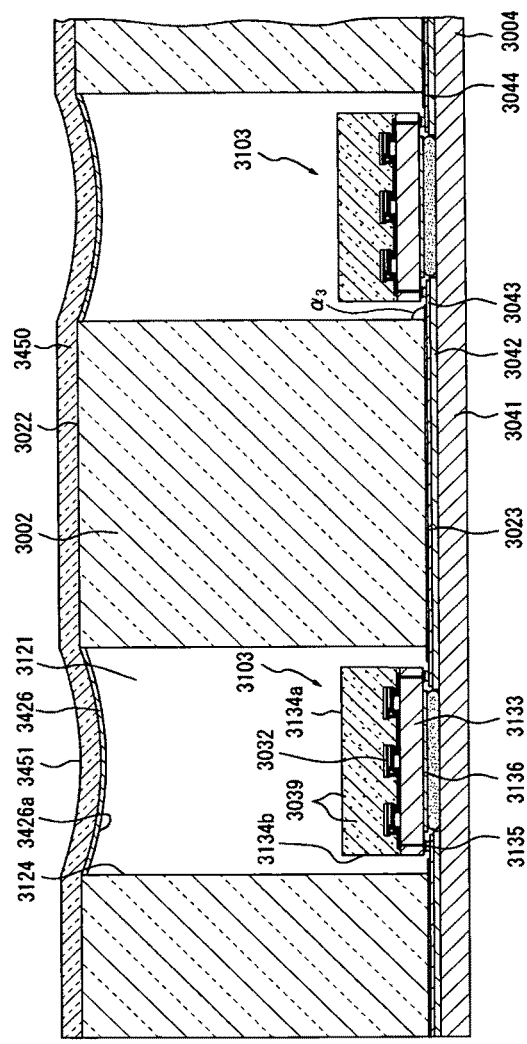
FIG. 69 is a partial cross sectional view showing a light-emitting device in a modification.

In addition, it is possible to provide, e.g., a transparent plate 3450 entirely on the upper surface 3022 of the light guide plate 3002, as shown in FIG. 69. In the transparent plate 3450 as a light transmitting member, a portion in contact with the light guide plate 3002 is formed flat and a downwardly convex curved portion 3451 is formed at a portion blocking the hole portion 3121. A semi-transmissive coating portion 3426 is formed on a lower surface of the curved portion 3451 along a curved shape, and the hole portion 3121 is blocked by a curved reflective layer 3426a which is a surface of the semi-transmissive coating portion 3426 on the light source 3003 side. In this case, since the light emitted from the light source 3003 is reflected at the curved reflective layer 3426a which is convex toward the light source 3003, the amount of the light directed toward the inner surface 3124 of the hole 3121 is larger than the simple planar shape.

Alternatively, for example, when a light-emitting device 3001 of the above-mentioned embodiment is defined as one light-emitting unit, a light-emitting device can be composed of plural light-emitting units. In this case, for example, the light-emitting units are arranged at intervals in a planar shape and an air layer can be formed in each gap between end faces of the light guide plates of the light-emitting units. Then, a white reflecting plate is arranged in the air layer, and it is thereby possible to uniform in-plane brightness of the light guide plate of every light-emitting unit. At this time, longitudinal and lateral distances between the individual light sources are set to be the same for the case of crossing over the air layer and the white reflecting plate and for the case of not crossing over.

By configuring as described above, it is possible to individually control on/off of emission and light intensity of the light-emitting units. In addition, it is possible to suppress an increase in the amount of light near the end face of the light guide plate by providing the white reflecting plate in the air layer without providing a white reflective coating directly on the end face of the light guide plate. In other words, when white paint is applied directly to the end face of the light guide plate, diffuse reflection occurs thereon. As a result, the light is outwardly emitted from the light guide plate, thereby increasing brightness in the vicinity of the end portion of the light guide plate. On the other hand, when the air layer is present between the end face of the light, guide plate and the white reflecting plate, the light which is diffusely reflected by the white reflecting plate is refracted at an angle to become propagation light of the light guide plate when incident thereon again, and it is thereby possible to prevent high brightness in the vicinity of the end face of the light guide plate. In this regard, this is not limited to the case of plural light-emitting units and is the same for a single light-emitting device 3001, etc.

In addition, the white reflecting plate prevents light from reaching the adjacent light-emitting units and is thus effective for independent lighting of each light-emitting unit. Alternatively, the white reflecting plate may be provided only at an end portion of a group composed of plural light-emitting units instead of providing in all gaps between the light-emitting units. In this case, since the light is transmitted to the light guide plate of the adjacent light-emitting unit in the group, the overall brightness of the light-emitting units in the group can be uniform.

Tenth Embodiment

Figure 70A:
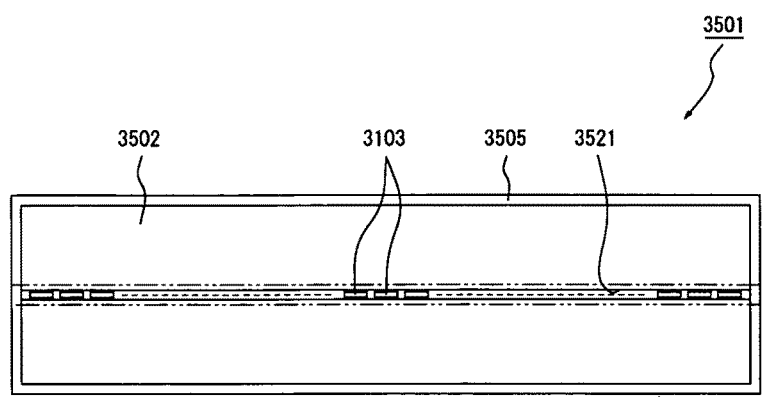
Figure 70B:
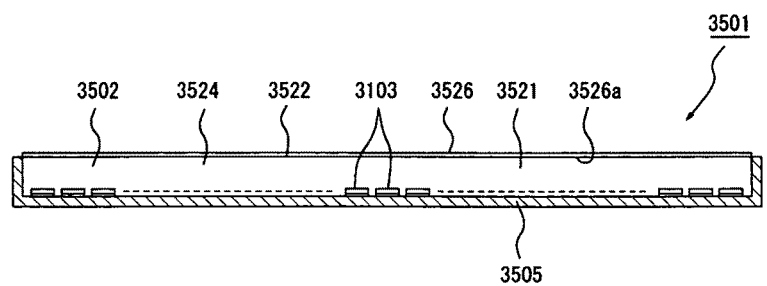
Figure 71:
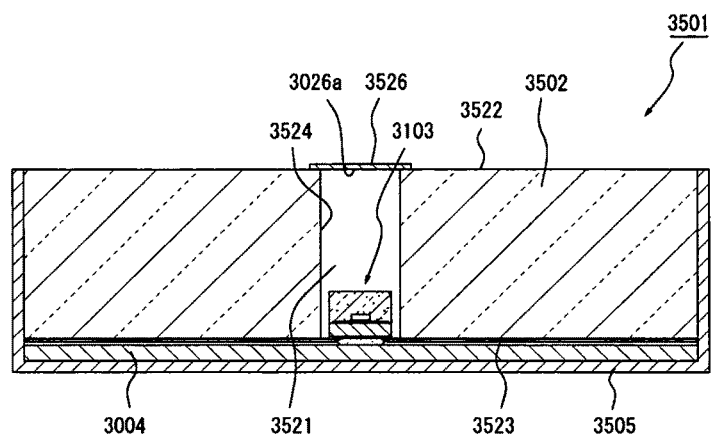
FIG. 71 is a vertical cross sectional view showing the light-emitting device.

FIGS. 70 and 71 show the tenth embodiment of the invention, wherein FIG. 70A is a plan view of a light-emitting device and FIG. 70B is a horizontal cross sectional view thereof. While plural hole portions 3021 and 3121 are formed for each of the light sources 3003 and 3103 in the eighth and ninth embodiments, one hole is shaped by plural light sources in the tenth embodiment.

As shown in FIG. 70A, a light-emitting device 3501 is provided with a plate-like light guide plate 3502, a linear hole portion 3521 formed in the light guide plate 3502, plural light sources 3103 housed in the hole portion 3521 and an outer frame portion 3505 of the light guide plate 3502. Since each light source 3103 is the same as the ninth embodiment, it is not described in detail here. The light sources 3103 are arranged in a row in a longitudinal direction.

As shown in FIG. 70B, the light-emitting device 3501 is provided with a reflective sticker 3526 on the light guide plate 3502 for blocking the hole portion 3521. The illustration of the reflective sticker 3526 is omitted in FIG. 70A for convenience of explanation. A surface of the reflective sticker 3526 on the hole portion 3521 side serves as a reflecting surface 3526a in the present embodiment.

FIG. 71 is a vertical cross sectional view showing the light-emitting device.

As shown in FIG. 71, the hole portion 3521 is formed through the light guide plate 3502 in a thickness direction thereof. In other words, the light guide plate 3502 which is split is provided so as to sandwich the light sources 3103 in the present embodiment. In addition, an inner surface 3524 of the hole portion 3521 is formed vertical to an upper surface 3522 and a lower surface 3523 of the light guide plate 3502 so that the above-mentioned formulas (5) and (6) are satisfied.

Meanwhile, the outer frame portion 3505 is formed so that the light guide plate 3502 is covered on the lower and lateral sides. The mounting substrate 3004 for mounting the light source 3103 is provided between the outer frame portion 3505 and the light guide plate 3502.

In the light-emitting device 3501 configured as mentioned above, since the angle $\alpha_3$ of the inner surface 3524 of the hole portion 3521 with respect to the lower surface 3523 of the light guide plate 3502 and the refractive index $n_3$ of the light guide plate 3502 are determined so as to satisfy the above-mentioned formulas (5) and (6), most of the light incident from the inner surface 3524 of the hole portion 3521 becomes propagation light. Therefore, the number of components can be reduced by eliminating the optical controller and it is thereby possible to simply and easily manufacture the light-emitting device 3501. In addition, since the hole portion 3521 is formed by splitting the light guide plate 3502 while sandwiching the light sources 3103, the light guide plate 3502 does not need to be processed to form the hole portion 3521 and it is thus very easy to manufacture the light guide plate 3502.

In addition to this, since the hole portion 3521 is blocked by the reflecting surface 3526a of the reflective sticker 3526, a portion of the light incident on the reflecting surface 3526a from the light source 3103 can be indirectly incident on the inner surface 3524 by diffuse reflection, hence, the efficiency of light extraction from the light source 3103 is good.

Figure 72A:
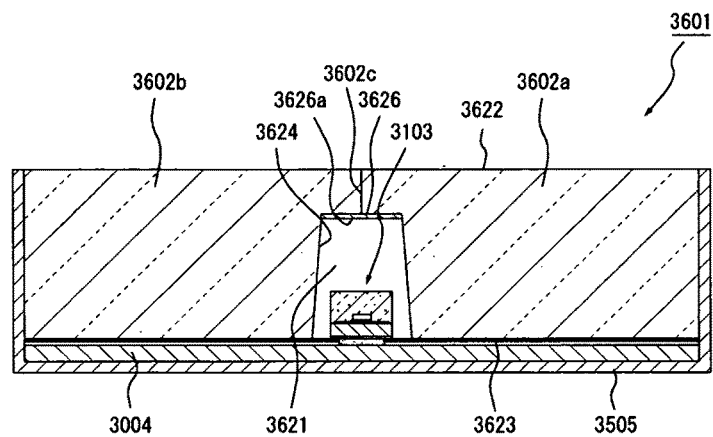
FIGS. 72A and 72B are vertical cross sectional views showing a light-emitting device in a modification, wherein a light guide plate is separately formed in FIG. 72A and a light guide plate is integrally formed in FIG. 72B.
Figure 72B:
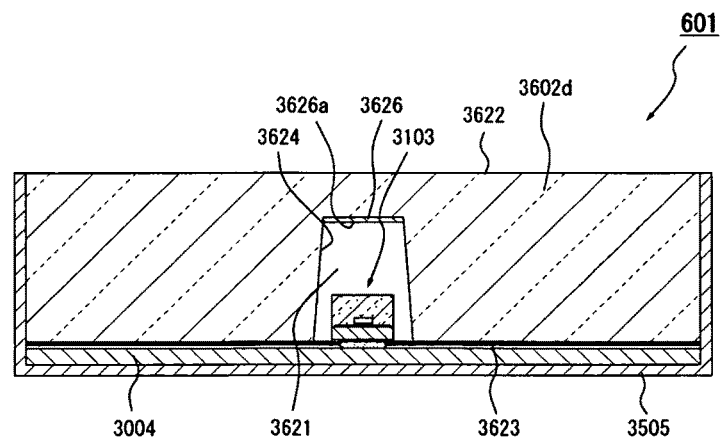

Although the hole portion 3521 vertically formed through the light guide plate 3502 has been described in the tenth embodiment, a hole portion 3621 may be formed from, e.g., a lower surface 3623 side of a light guide plate 3602 to the middle portion in a thickness direction without reaching an upper surface 3622, such as a light-emitting device 3601 shown in FIG. 72. FIG. 72A shows that light guide plates 3602a and 3602b are separately formed and a contact portion 3602c between the light guide plates 3602a and 3602b is provided immediately above the hole portion 3621. A reflective layer 3626 is formed on a flat upper surface of the hole portion 3621 and a surface of the reflective layer 3626 serves as a reflecting surface 3626a. An inner surface 3624 of the hole portion 3621 is inclined with respect to a thickness direction of the light guide plates 3602a and 3602b, which is determined to satisfy the above-mentioned formulas (5) and (6). Obviously, an integrated light guide plate 3602d may be alternatively formed as shown in FIG. 72B.

Figure 73A:
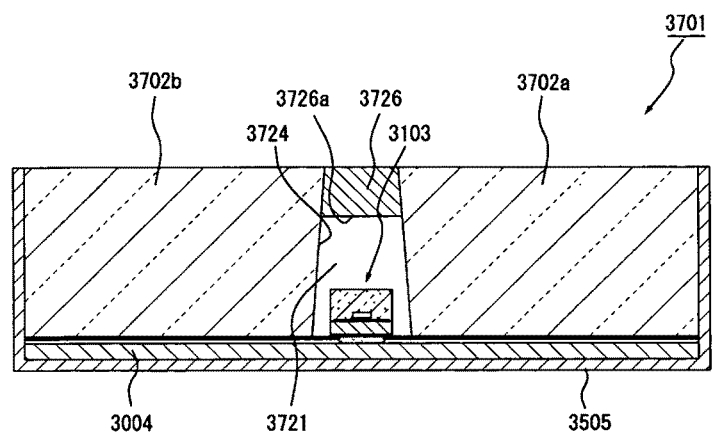
FIGS. 73A and 73B are vertical cross sectional views showing a light-emitting device in a modification, wherein a reflecting surface of a blocking portion is plane in FIG. 73A and is curved in FIG. 73B.
Figure 73B:
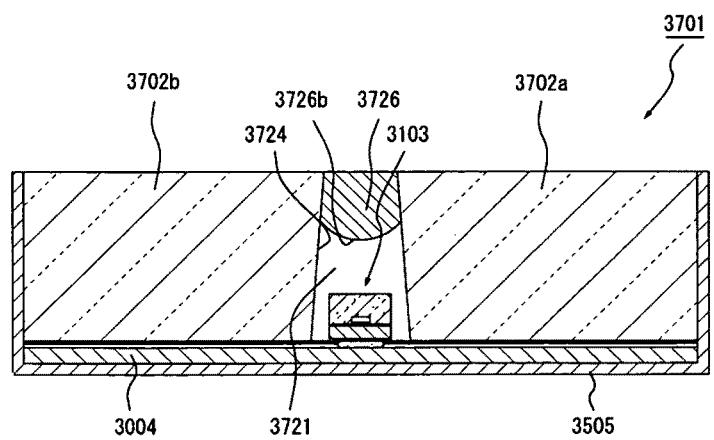

Furthermore, light guide plates 3702a and 3702b formed of a transparent resin may be integrally formed with a blocking portion 3726 for blocking a hole portion 3721 of the light guide plates 3702a and 3702b by two-color molding as shown in FIG. 73. Obviously, the light guide plates 3702a and 3702b may be formed separately from the blocking portion 3726. In a light-emitting device 3701 of FIG. 73, the blocking portion 3726 is formed of a white resin and a surface thereof exposed to the hole portion 3721 serves as a reflecting surface 3726a. The reflecting surface 3726a is flat in FIG. 73A and a reflective layer 3726b is formed in a curved shape which is convex toward the light source 3103 in FIG. 73B.

Figure 74:
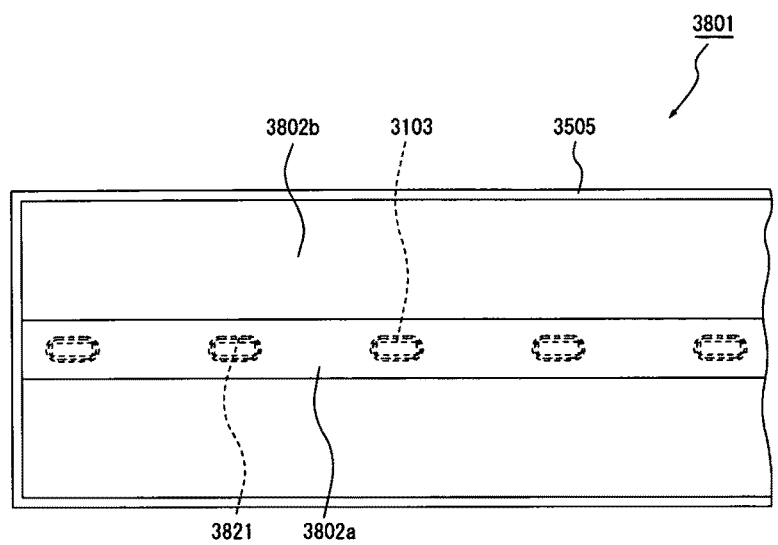
FIG. 74 is a partial plan view showing a light-emitting device in a modification.
Figure 75:
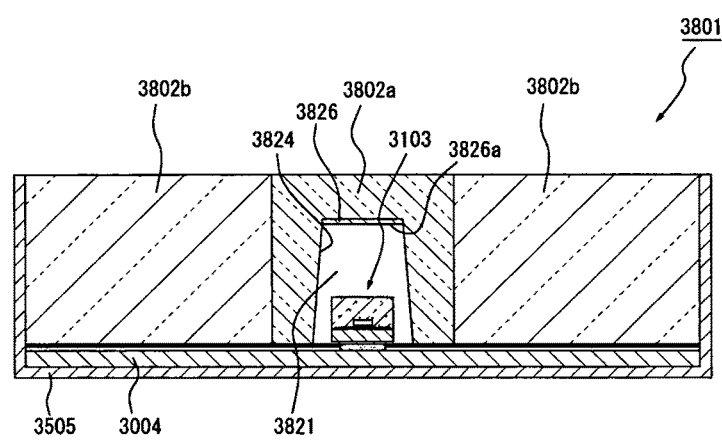
FIG. 75 is a vertical cross sectional view showing a light-emitting device in a modification.

Alternatively, light guide plates 3802a and 3802b which are formed of different materials may be combined as shown in FIGS. 74 and 75. In a light-emitting device 3801 of FIG. 74, the first light guide plate 3802a having a hole portion 3821 formed therein is formed separately from the second light guide plates 3802b which is arranged on the sides of the first light guide plate 3802a. Here, the hole portion 3821 is individually formed for each light source 3103. As shown in FIG. 75, a reflective layer 3826 having a reflecting surface 3826a is formed in the hole portion 3821 immediately above the light source 3103.

In the light-emitting device 3801, the first light guide plate 3802a is formed by injection molding and the second light guide plates 3802b is formed by rolling. As a result, a member around the hole portion 3821 such as the shape of the inner surface 3824 of the hole portion 2821 which relatively requires accuracy is formed by injection molding and a flat plate portion is formed by rolling which is chap and allows mass production, hence, the manufacturing cost of the light guide plates 3802a and 3802b can be reduced.

Meanwhile, the reflecting surface 3826a in the hole portion 3821 immediately above the light source 3003 is desirably in a form which corresponds to only a hole portion as are the eighth and ninth embodiments when optical characteristics are prioritized, however, the formation of the reflecting surface 3826a can be facilitated by forming a continuous shape corresponding to plural hole portions 3821 so as to include spaces between the adjacent hole portions 3821, thereby reducing the manufacturing cost. Deterioration of optical characteristics is very small when the reflecting surface 3826a is provided in the first light guide plate 3802a on a side mounting the light source 3103.

Although the LED element 3032 having the p-side electrode 3065 formed of ITO has been described in each of the above-mentioned embodiments, the p-side electrode 3065 may be made of, e.g., an Ag alloy. In this case, it is possible to reduce light leakage into the element mounting substrate 3033, thereby increasing light extraction efficiency of the light source 3003.

Furthermore, the p-side electrode 3065 of the LED element 3032 can be composed of a contact electrode formed of ITO and a surface reflective layer formed of Al. In this case, it is also possible to reduce light leakage into the element mounting substrate 3033, thereby increasing light extraction efficiency of the light source 3003.

Still further, although the supporting substrate 3060 formed of sapphire has been described, an electrical current may be diffused by using, e.g., a conductive substrate such as SiC or GaN. In addition, it is possible to improve the light extraction efficiency from the LED element 3032 by combining the supporting substrate 3060 having the same refractive index as the MQW layer 3063 with glass having a refractive index of 1.7 or more.

In addition, although any process is not performed on both surfaces of the light guide plate in each of the above-mentioned embodiments, optional processes may be, of course, performed, if necessary, and for example, a reflection process may be performed on at least one surface of the light guide plate.

In addition, although a light-emitting device using an LED element as a light-emitting element has been described in the above-mentioned embodiment, the light-emitting element is not limited to the LED element and other specific detailed structure, etc., can be, of course, appropriately changed.

Eleventh Embodiment

Figures 76A, 76B:
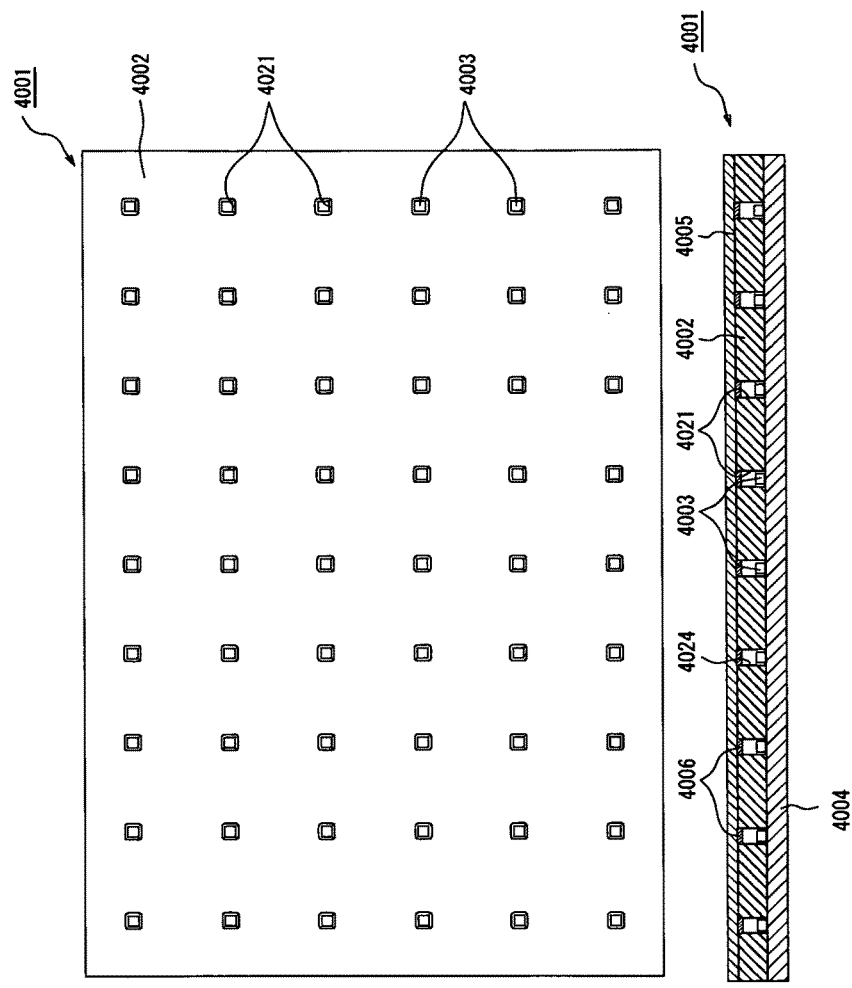

FIG. 76 show the eleventh embodiment of the invention, wherein FIG. 76A is a plan view of a light-emitting device and FIG. 76B is a cross sectional view thereof.

A light-emitting device 4001 in the eleventh embodiment is provided with a light guide plate 4002, plural through-holes 4021 formed in the light guide plate 4002, a light source 4003 housed in the through-hole 4021, a mounting substrate 4004 electrically connected to the light source 4003 and a surface cover plate 4005 formed on the light guide plate 4002. The light guide plate 4002 is formed of a material transparent to light emitted from the light source 4003 and the light emitted from the light source 4003 in the through-hole 4021 is incident on the light guide plate 4002. In the present embodiment, the light guide plate 4002 is formed in a flat-plate shape having an entirely constant thickness. A material of the light guide plate 4002 is optional as long as it is transparent to the light from the light source 4003, and it is possible to use, e.g., an acrylic resin. The mounting substrate 4004 is formed of, e.g., an aluminum-based material.

In the through-hole 4021, an area of an inner surface 4024 on which light is incident from the light source 4003 is parallel to a thickness direction of the light guide plate 4002. In the present embodiment, the through-hole 4021 is formed in a square shape of which corners are cut in a plan view, and has the same cross section from top to bottom. In detail, the corners of the through-hole 4021 are curved at a predetermined radius of curvature. Light is emitted upwardly and laterally from the light source 4003, and the light from the light source 4003 is incident on the whole area of the inner surface 4024 of the through-hole 4021, as described later. In the present embodiment, plural through-holes 4021 are regularly formed in the light guide plate 4002 in a plan view. In detail, the through-holes 4021 are arranged in a lattice point pattern on the entire surface of the planar light-emitting device 4001 at equal intervals longitudinally and laterally.

The surface cover plate 4005 is formed on the light guide plate 4002 so as to block the through-holes 4021. A white reflective layer 4006 is formed on the bottom surface of the surface cover plate 4005 at a portion corresponding to the through-hole 4021. Uniform white light can be outwardly emitted by reflecting the light emitted from the light source 4003 at the white reflective layer 4006. The surface cover plate 4005 having the white reflective layer 4006 can be used in a combination with the respective light-emitting devices of the above-mentioned embodiments.

Twelfth Embodiment

Figures 77A, 77B:
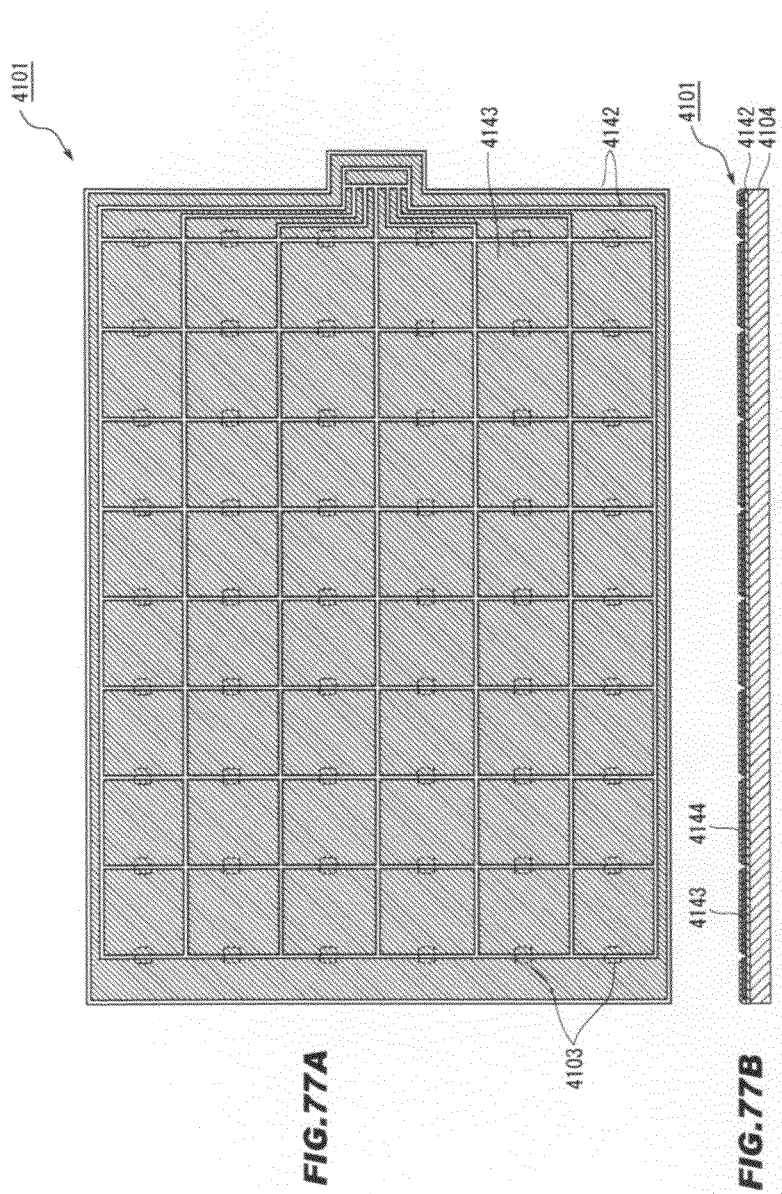

FIG. 77 show the twelfth embodiment of the invention, wherein FIG. 77A is a plan view of a light-emitting device and FIG. 77B is a cross sectional view thereof. The twelfth embodiment shows an example of the type of circuit pattern (circuit patterns 43, 1043, 2143, etc.) used for the respective light-emitting devices of the above-mentioned embodiments.

A light-emitting device 4101 of the twelfth embodiment is provided with a mounting substrate 4104, an insulation layer 4142 formed on the mounting substrate 4104, a circuit pattern 4143 formed on the insulation layer 4142 and a white resist 4144 formed on the circuit pattern 4143. It should be noted that illustrations of a light guide plate and a light source, etc., included in the light-emitting device 4101 are omitted in FIGS. 77A and 77B, and an illustration of the white resist 4144 is omitted in FIG. 77A. Meanwhile, a dot-dash-line 4103 in FIG. 77A indicates the layout position of light sources including an LED element.

The circuit pattern 4143 is formed on the substantially entire surface of the mounting substrate 4104, and is formed by, e.g., forming punches on in a lattice pattern on a 70 μm thick copper foil. The mounting substrate 4104 is, e.g., a 1 mm thick substrate formed of an aluminum-based material. Heat generated by a light source which is connected to the circuit pattern 4143 is diffused by the circuit pattern 4143 and is transmitted to substantially the whole area of the mounting substrate 4104 via the insulation layer 4142. Thus, thermal resistance in the insulation layer 4142 is greatly reduced and it is thereby possible to suppress temperature increase in an LED chip.

Although the embodiments of the invention have been described, the invention according to claims is not to be limited to the above-mentioned embodiments. Further, please note that not all combinations of the features described in the embodiments are not necessary to solve the problem of the invention.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A light-emitting device, comprising:
a light source comprising an element mounting substrate, a light-emitting diode (LED) element mounted thereon by flip-chip connection and a sealing portion for sealing the LED element on the element mounting substrate; and
a light guide plate comprising a housing hole for housing the light source,
wherein the housing hole extends from a first surface side to a second surface side of the light guide plate and an area of an inner surface thereof on which a light is incident from the light source is parallel to a thickness direction of the light guide plate,
wherein the light source is housed in the housing hole so that the element mounting substrate is located on the second surface side of the light guide plate, emits the light toward the first surface side of the light guide plate in the housing hole and an inner surface side of the housing hole, and has an optical axis parallel to the thickness direction of the light guide plate,
wherein a solid angle of the inner surface of the housing hole with respect to a center of an upper surface of the light source is not less than 4.44 steradians, and
wherein a formula, $90°-\sin^{-1}[\{\sin(90°-\alpha)\}/n]+\alpha \geq \sin^{-1}(1/n)$, is satisfied, where $\alpha$ is an angle of an inner surface of the housing hole with respect to the second surface of the light guide plate and n is a refractive index of the light guide plate.

2. The light-emitting device according to claim 1, wherein the housing hole is formed so as to penetrate the light guide plate.

3. The light-emitting device to claim 2, further comprising a mounting substrate provided on the one surface side of the light guide plate to mount the light source.

4. The light-emitting device according to claim 3, wherein the sealing portion comprises a thermal fusion glass.

5. The light-emitting device according to claim 4, wherein a shape of the light source comprises a rectangular parallelepiped shape.

6. The light-emitting device according to claim 4, wherein a phosphor for converting a wavelength of the light emitted from the LED element is dispersed into the sealing portion.

7. The light-emitting device to claim 3, further comprising a reflecting plate provided on the second surface side of the light guide plate and blocking the housing hole.

8. A light-emitting device, comprising:
a light source comprising an element mounting substrate, a light-emitting diode (LED) element mounted thereon by flip-chip connection and a sealing portion for sealing the LED element on the element mounting substrate; and
a light guide plate comprising a through hole for housing the light source,
wherein the through hole extends from a first surface side to a second surface side of the light guide plate and an area of an inner surface thereof on which a light is incident from the light source is substantially parallel to a thickness direction of the light guide plate,
wherein the light source is housed in the through hole so that the element mounting substrate is located on the second surface side of the light guide plate, emits the light toward the first surface side of the light guide plate in the through hole and an inner surface side of the through hole, and has an optical axis parallel to the thickness direction of the light guide plate, and
wherein a formula, $90°-\sin^{-1}[\{\sin(90°-\alpha)\}/n]+\alpha \geq \sin^{-1}(1/n)$, is satisfied, where $\alpha$ is an angle of the inner surface of the through-hole with respect to the second surface of the light guide plate and n is a refractive index of the light guide plate.

9. The light-emitting device according to claim 8, wherein a formula, $\alpha \leq 90°-2\times\sin^{-1}[\sin\{(90°-\alpha)/n\}]$, is satisfied, where $\alpha$ is the angle of the inner surface of the through-hole with respect to the second surface of the light guide plate and n is the refractive index of the light guide plate.

10. The light-emitting device according to claim 9, wherein an end portion of the light source on the element mounting substrate side and the second surface of the light guide plate are located at a same height in the thickness direction of the light guide plate.

11. The light-emitting device according to claim 10, wherein a shape of the light source comprises a quadrangular shape in a plan view, and
wherein a shape of the through hole comprises a quadrangular shape having cut corners in a plan view.

12. The light-emitting device according to claim 11, further comprising a mounting substrate provided on the first surface side of the light guide plate to mount the light source.

13. The light-emitting device according to claim 12, wherein the sealing portion comprises a thermal fusion glass.

14. The light-emitting device according to claim 13, wherein a shape of the light source comprises a rectangular parallelepiped shape, and
wherein a total area of the first side surface and the second side surface is double or more of an area of an upper surface.

15. The light-emitting device according to claim 13, wherein the sealing portion comprises a phosphor that converts a wavelength of the light emitted from the LED element.

16. The light-emitting device according to claim 13, further comprising a reflecting plate provided on the second surface side of the light guide plate and blocking the through hole.

17. A method of manufacturing a light source, comprising:
collectively sealing a plurality of light-emitting elements mounted on an element mounting substrate formed of an inorganic material with a glass material, thereby forming an intermediary body;
forming a reflective layer on an upper surface of the glass material of the intermediary body; and
dividing the intermediary body having the reflective layer formed thereon in a thickness direction of the element mounting substrate to expose a side surface of the glass material while an upper surface of the glass material is covered.

18. The method according to claim 17, wherein said sealing comprises softening the glass material by heating in a hot pressing process to bond to the element mounting substrate.

19. The method according to claim 18, wherein the reflective layer comprises an inorganic material, and
wherein the glass material is softened by heating in a hot pressing process to bond to the reflective layer in the forming of the reflective layer.

20. The method according to claim 19, wherein the element mounting substrate comprises a same material as said material comprising the reflective layer.

21. The method according to claim 18, wherein the reflective layer comprises a metal material and is formed by one of vapor deposition and sputtering in the forming.

22. A light source manufactured by the manufacturing method according to claim 17.

23. A light-emitting device, comprising:
a light source according to claim 22; and
a light guide plate comprising a hole portion for housing the light source.

24. A light-emitting device, comprising:
a light source comprising an element mounting substrate, a light-emitting diode (LED) element mounted thereon by flip-chip connection, and a sealing portion for sealing the LED element on the element mounting substrate;
a light guide plate comprising a hole portion for housing the light source and an incident surface which is a lateral side surface of the hole portion, the hole portion extending from a first surface side to a second surface side of the light guide plate and the incident surface is substantially parallel to a thickness direction of the light guide plate; and
a reflecting surface, said reflecting surface configured to optically block the hole portion on the second surface side of the light guide plate and to reflect at least a portion of light emitted from the light source,
wherein a formula, $90°-\sin^{-1}[\{\sin(90°-\alpha)\}/n]+\alpha \geq \sin^{-1}(1/n)$, is satisfied, where $\alpha$ is an angle of an inner surface of the hole portion with respect to the first surface of the light guide plate and n is a refractive index of the light guide plate.

25. The light-emitting device according to claim 24, wherein a formula, $\alpha \leq 90°-2\times\sin^{-1}[\sin\{(90°-\alpha)/n\}]$, is satisfied, where $\alpha$ is the angle of the inner surface of the through-hole with respect to the second surface of the light guide plate and n is the refractive index of the light guide plate.

26. The light-emitting device according to claim 24, further comprising a light guide member arranged on the second surface of the light guide plate,
wherein the reflecting surface is formed on the light guide member.

27. The light-emitting device according to claim 24, wherein the hole portion is formed in the light guide plate from the first surface to a middle portion in a thickness direction thereof.

28. The light-emitting device according to claim 26, wherein the light guide member comprises one of a transparent plate and a transparent sheet.

29. The light-emitting device according to claim 24, wherein the hole portion penetrates the light guide plate in a thickness direction thereof.

* * * * *